(12) United States Patent
Su et al.

(10) Patent No.: US 11,450,751 B2
(45) Date of Patent: Sep. 20, 2022

(54) INTEGRATED CIRCUIT STRUCTURE WITH BACKSIDE VIA RAIL

(71) Applicant: TAIWAN SEMICONDUCTOR MANUFACTURING COMPANY, LTD., Hsinchu (TW)

(72) Inventors: Huan-Chieh Su, Changhua County (TW); Li-Zhen Yu, New Taipei (TW); Chun-Yuan Chen, Hsinchu (TW); Cheng-Chi Chuang, New Taipei (TW); Shang-Wen Chang, Hsinchu County (TW); Yi-Hsun Chiu, Hsinchu County (TW); Pei-Yu Wang, Hsinchu (TW); Ching-Wei Tsai, Hsinchu (TW); Chih-Hao Wang, Hsinchu County (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 17/156,584

(22) Filed: Jan. 24, 2021

(65) Prior Publication Data
US 2021/0399109 A1    Dec. 23, 2021

Related U.S. Application Data

(60) Provisional application No. 63/040,897, filed on Jun. 18, 2020.

(51) Int. Cl.
*H01L 29/45* (2006.01)
*H01L 21/8234* (2006.01)
(Continued)

(52) U.S. Cl.
CPC .... *H01L 29/458* (2013.01); *H01L 21/823418* (2013.01); *H01L 21/823475* (2013.01);
(Continued)

(58) Field of Classification Search
CPC ............... H01L 29/45; H01L 21/28518; H01L 21/823814; H01L 21/823821;
(Continued)

(56) References Cited

U.S. PATENT DOCUMENTS

2019/0067013 A1* 2/2019 Wang ................ H01L 21/76805
2019/0157310 A1* 5/2019 Glass ................ H01L 21/76898

* cited by examiner

*Primary Examiner* — Karen Kusumakar
*Assistant Examiner* — Adam S Bowen
(74) *Attorney, Agent, or Firm* — Maschoff Brennan

(57) ABSTRACT

An IC structure includes a source epitaxial structure, a drain epitaxial structure, a first silicide region, a second silicide region, a source contact, a backside via rail, a drain contact, and a front-side interconnection structure. The first silicide region is on a front-side surface and a first sidewall of the source epitaxial structure. The second silicide region is on a front-side surface of the drain epitaxial structure. The source contact is in contact with the first silicide region and has a protrusion extending past a backside surface of the source epitaxial structure. The backside via rail is in contact with the protrusion of the source contact. The drain contact is in contact with the second silicide region. The front-side interconnection structure is on a front-side surface of the source contact and a front-side surface of the drain contact.

20 Claims, 78 Drawing Sheets

(51) Int. Cl.
*H01L 27/088* (2006.01)
*H01L 29/417* (2006.01)
*H01L 29/423* (2006.01)

(52) U.S. Cl.
CPC ...... *H01L 27/088* (2013.01); *H01L 29/41733* (2013.01); *H01L 29/42392* (2013.01)

(58) Field of Classification Search
CPC ......... H01L 21/823871; H01L 27/0924; H01L 29/0847; H01L 29/41791; H01L 29/66795; H01L 29/7851
See application file for complete search history.

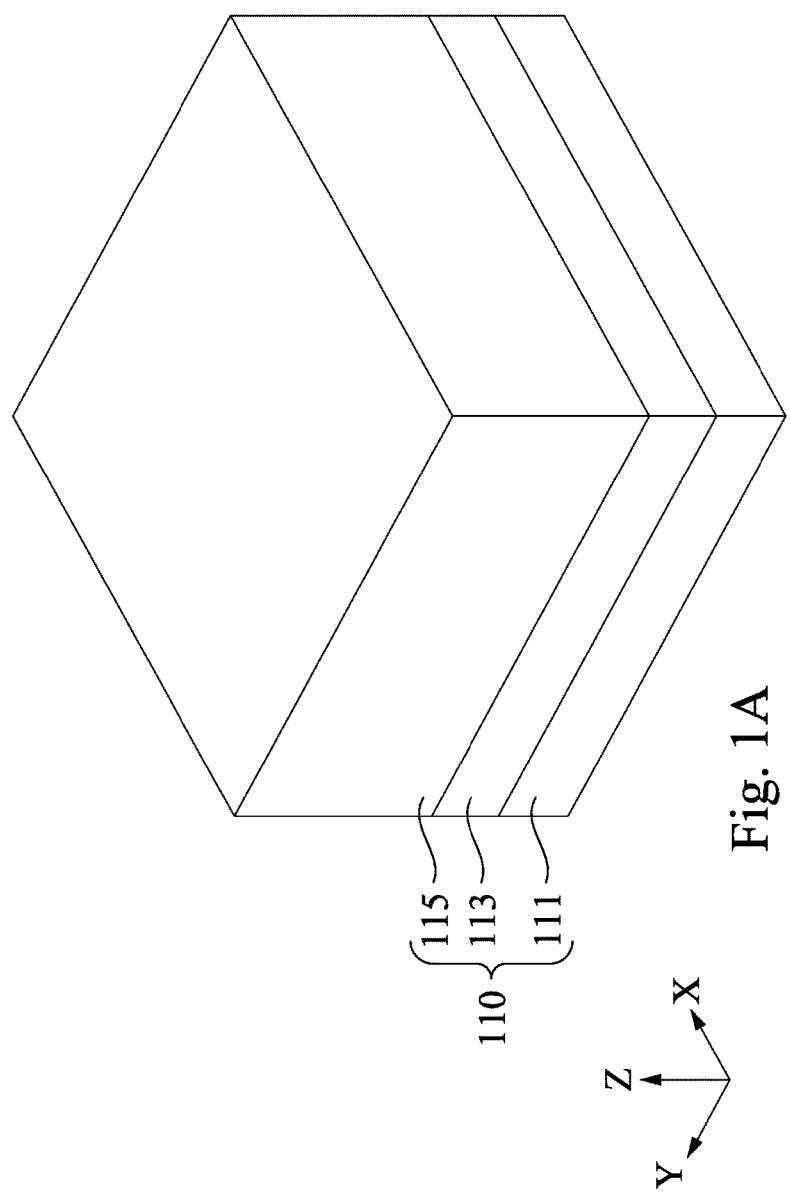

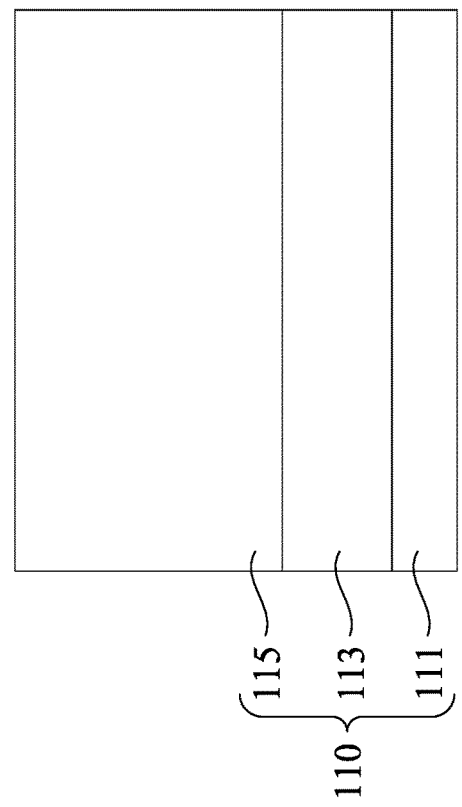

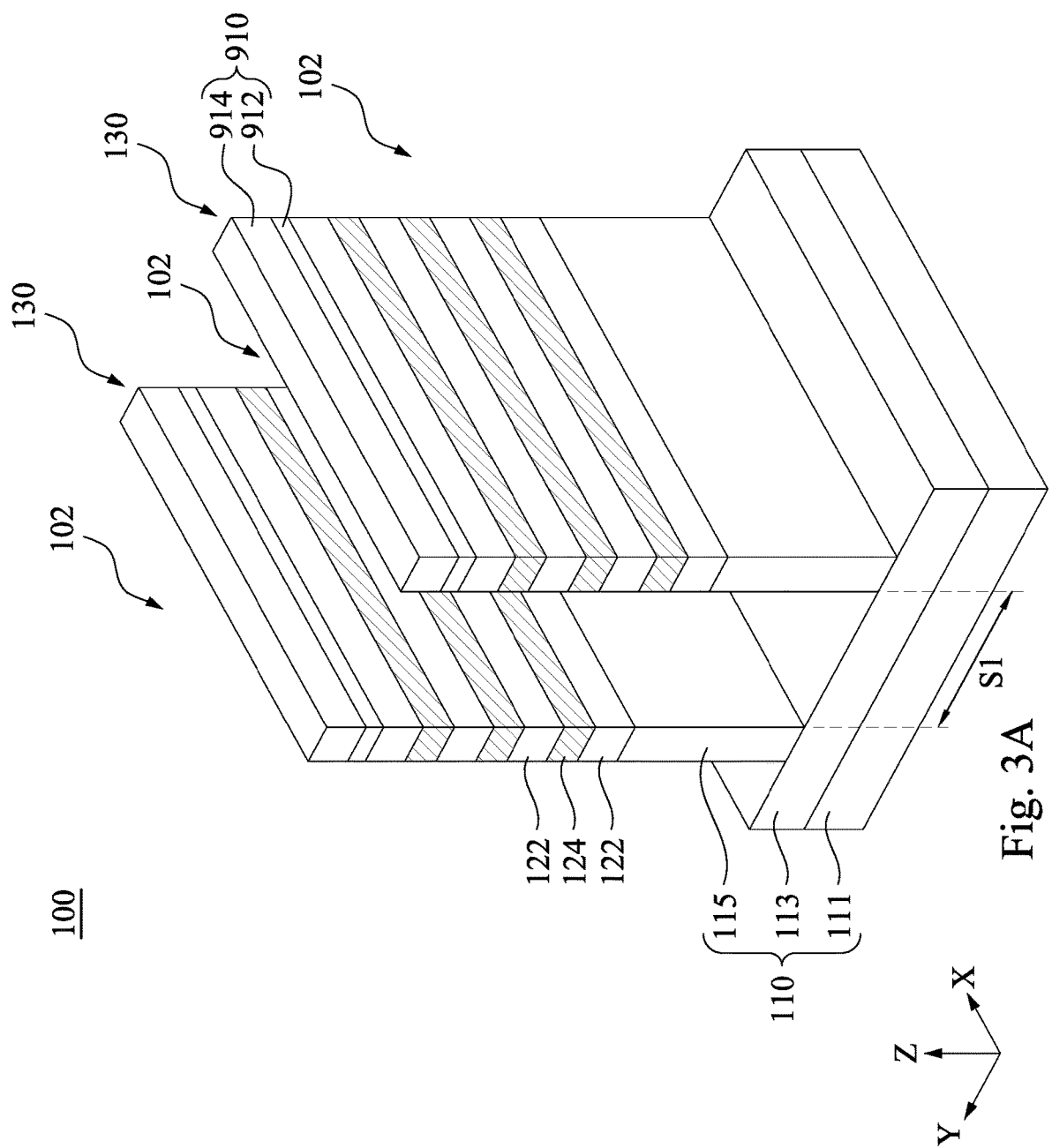

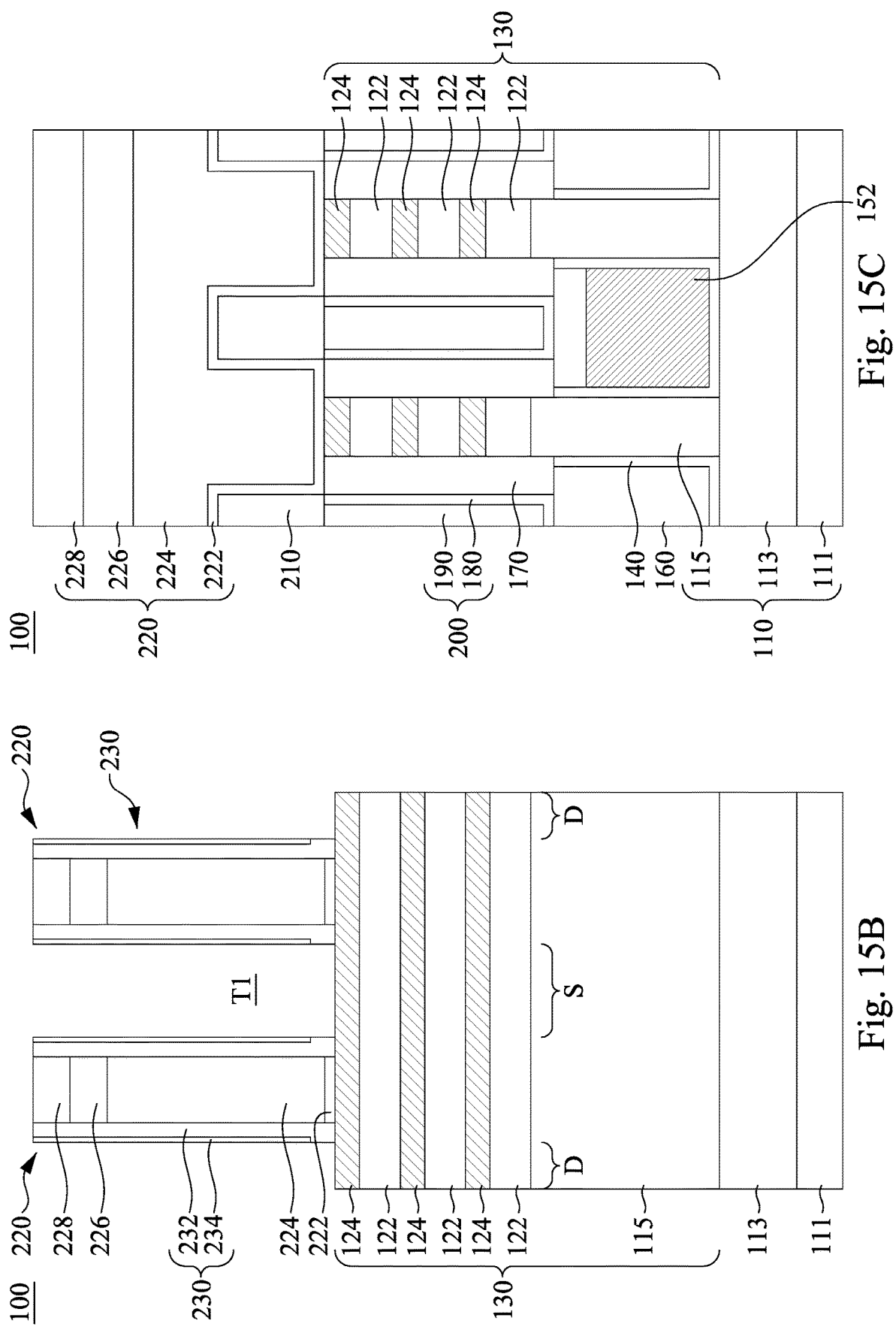

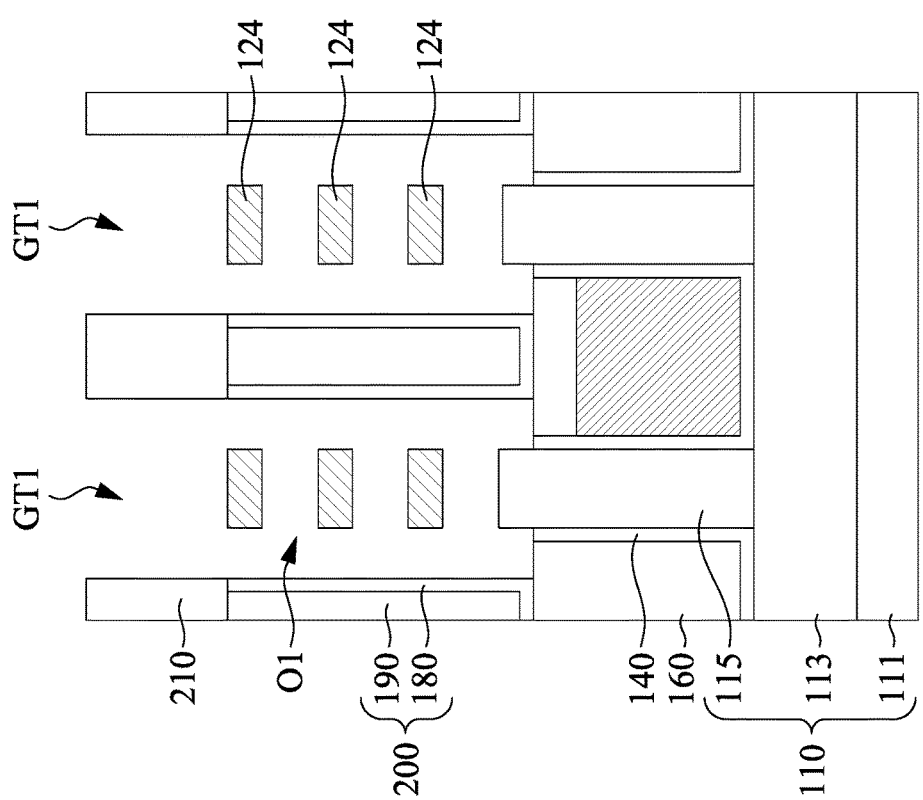

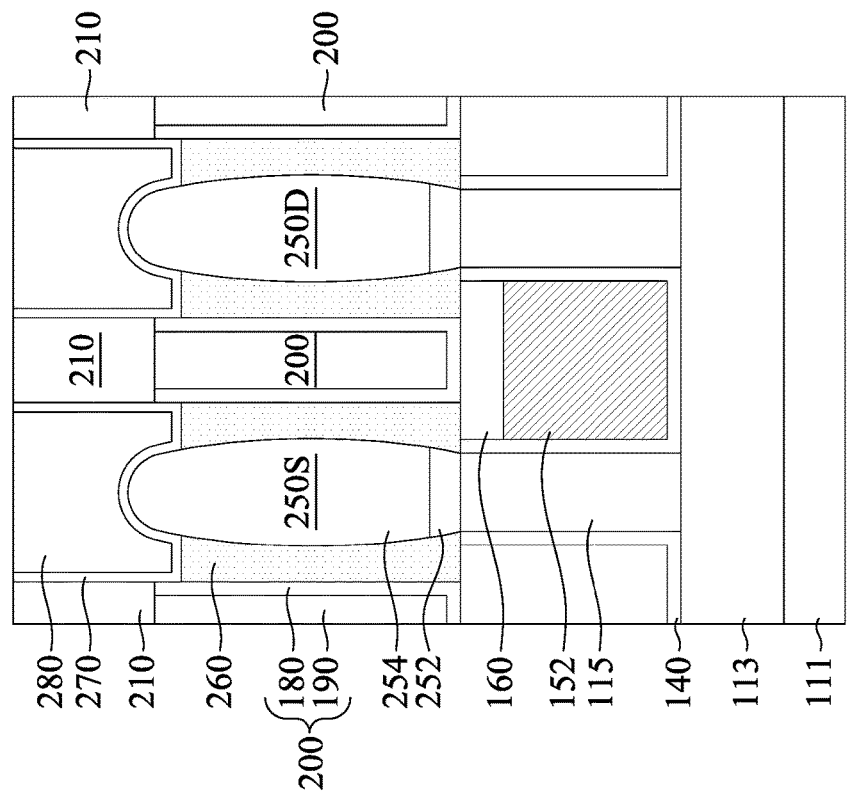
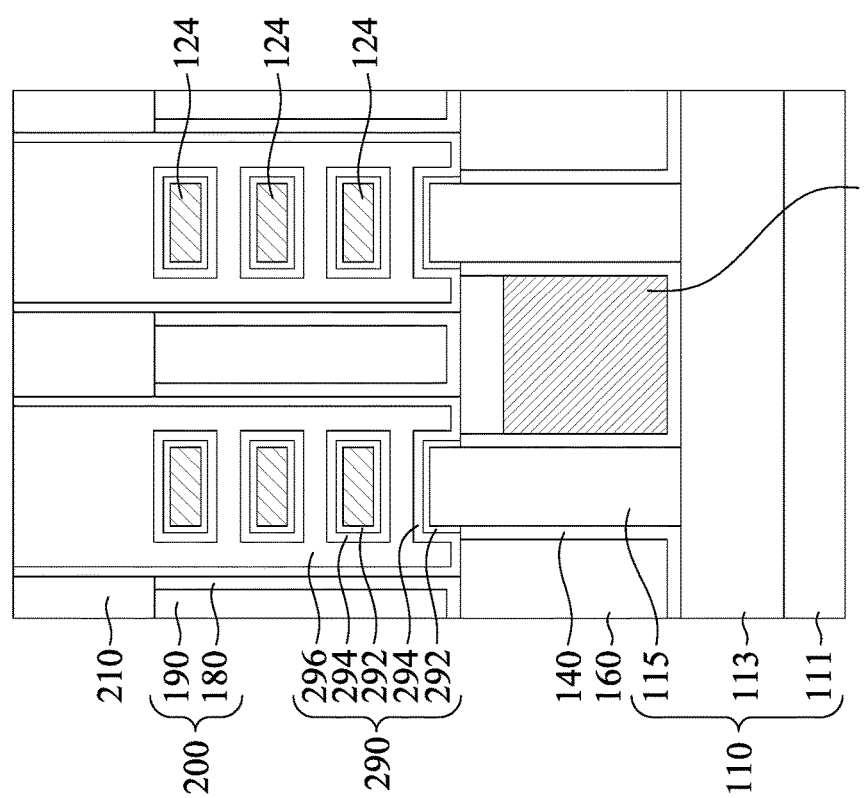
Fig. 21C
Fig. 21B

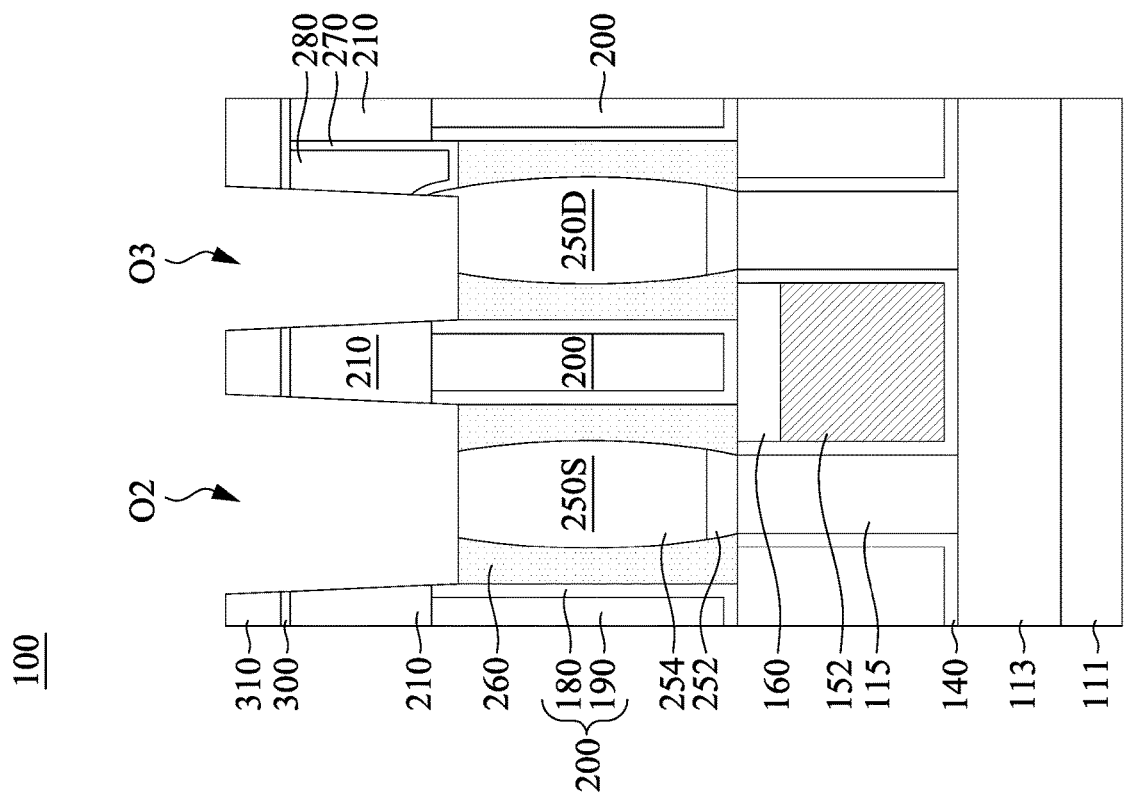
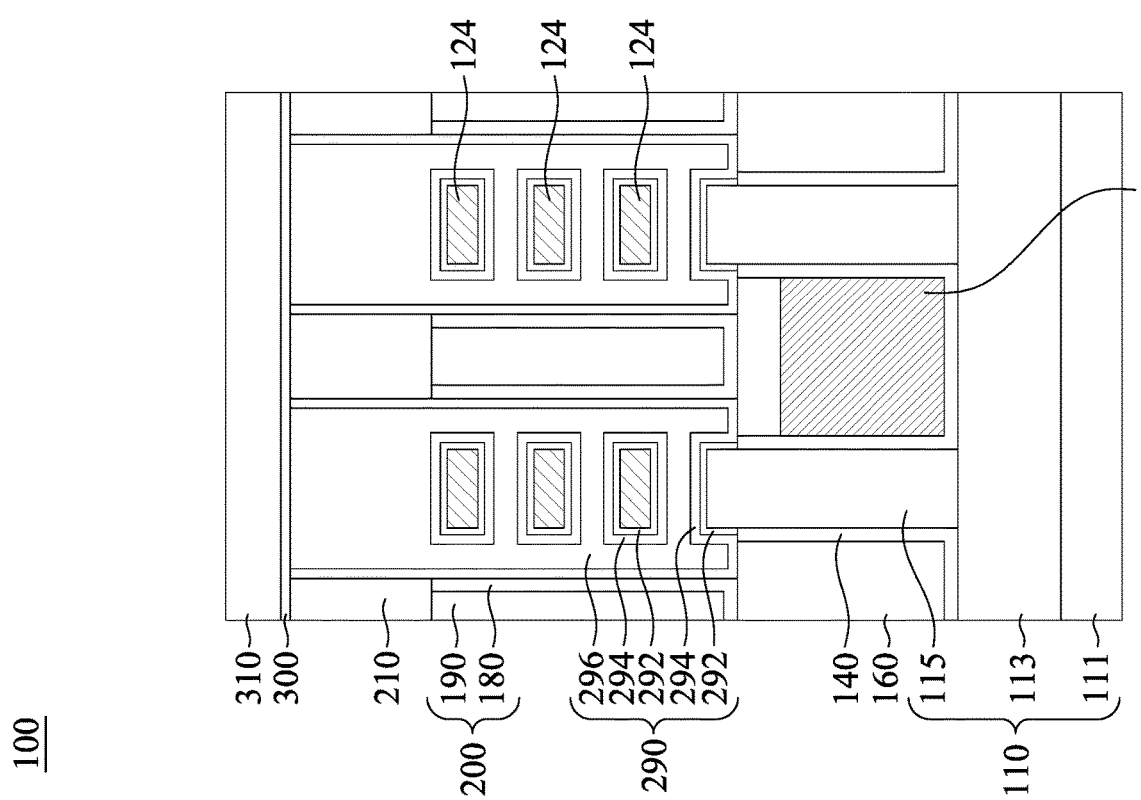
Fig. 22C
Fig. 22B

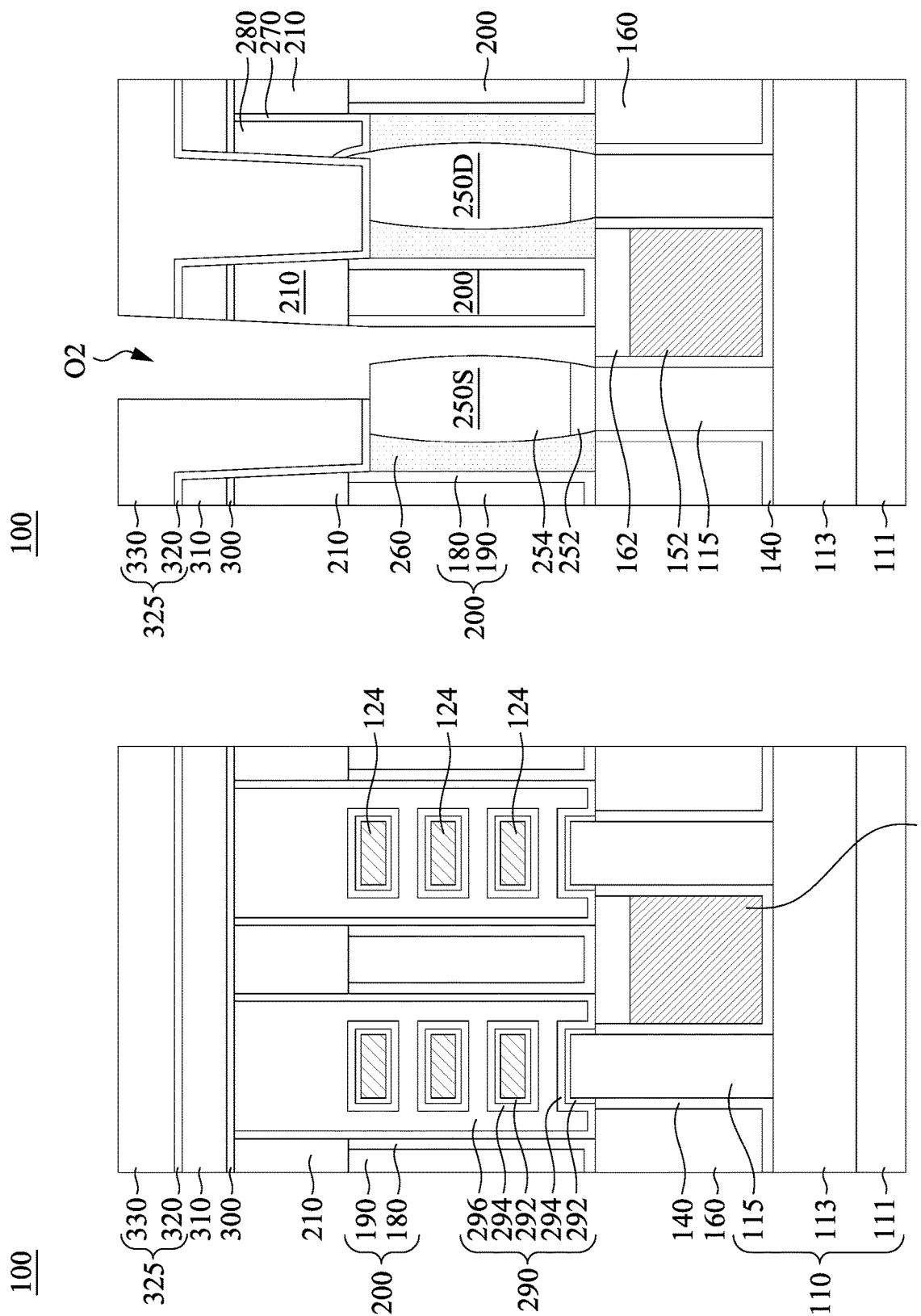

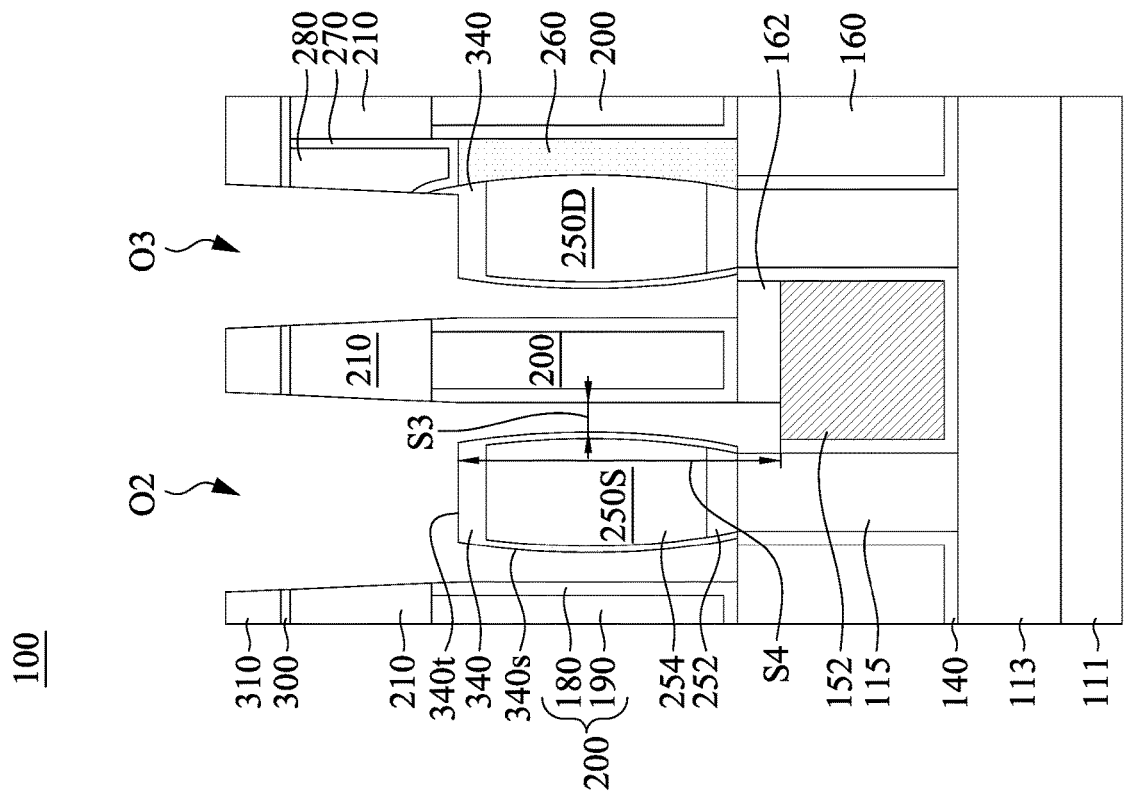
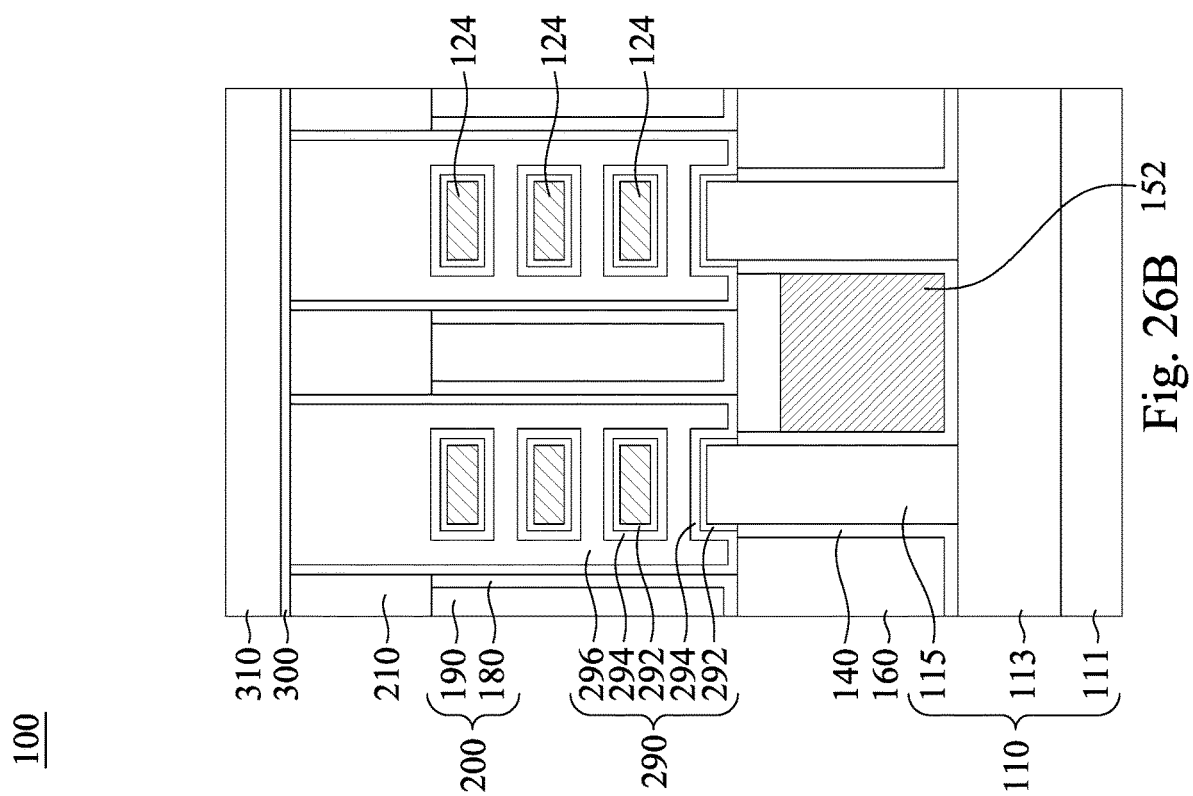

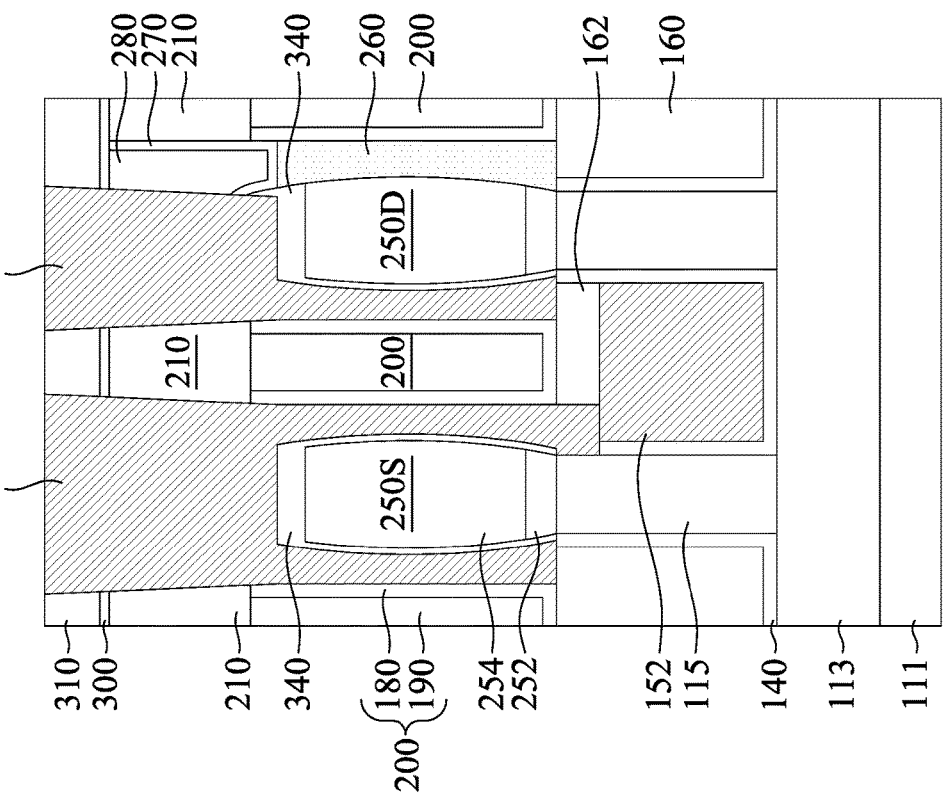
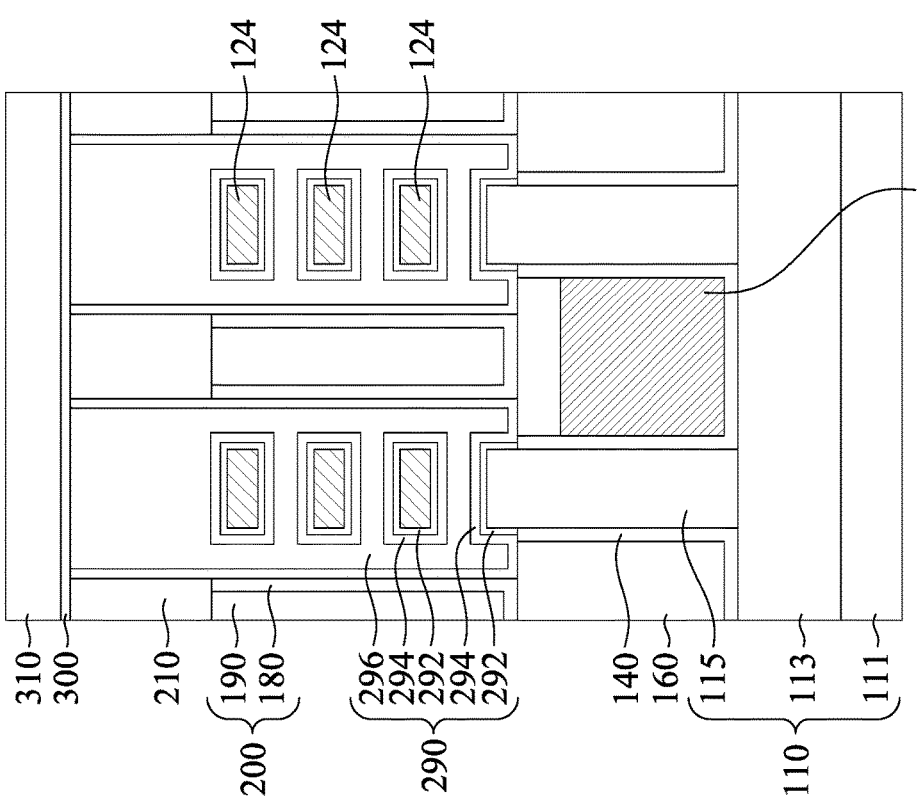
Fig. 27B
Fig. 27C

INTEGRATED CIRCUIT STRUCTURE WITH BACKSIDE VIA RAIL

PRIORITY CLAIM AND CROSS-REFERENCE

This application claims priority to U.S. Provisional Application Ser. No. 63/040,897, filed Jun. 18, 2020, which is herein incorporated by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 2A, 3A, 4A, 5A, 6A, 7A, 8A, 9A, 10A, 11A, 12A, 13A, 14A and 15A are perspective views of intermediate stages in the fabricating an integrated circuit structure in accordance with some embodiments of the present disclosure.

FIGS. 1B, 2B, 3B, 4B, 5B, 6B, 7B, 8B, 9B, 10B, 11B, 12B, 13B, 14B, 15C, 18B, 19B, 20B, 21B, 22B, 23B, 24B, 25B, 26B, 27B, 28B, 29B, 30B, 31B, 32B, 33B, 34B and 35B are cross-sectional views of intermediate stages of fabricating the integrated circuit structure along a first cut, which is in gate regions of neighboring transistors and perpendicular to a lengthwise direction of channels.

FIGS. 15B, 16, 17, 18A, 19A, 20A, 21A, 22A, 23A, 24A, 25A, 26A, 27A, 28A, 29A, 30A, 31A, 32A, 33A, 34A and 35A are cross-sectional views of intermediate stages of fabricating the integrated circuit structure 100 along a second cut, which is along a lengthwise direction of channels and perpendicular to a top surface of the substrate.

FIGS. 18C, 19C, 20C, 21C, 22C, 23C, 24C, 25C, 26C, 27C, 28C, 29C, 30C, 31C, 32C, 33C, 34C, 35C are cross-sectional views of intermediate stages of fabricating the integrated circuit structure along a third cut, which is in source/drain regions of neighboring transistors and perpendicular to the lengthwise direction of channels.

DETAILED DESCRIPTION

Figure 2A:
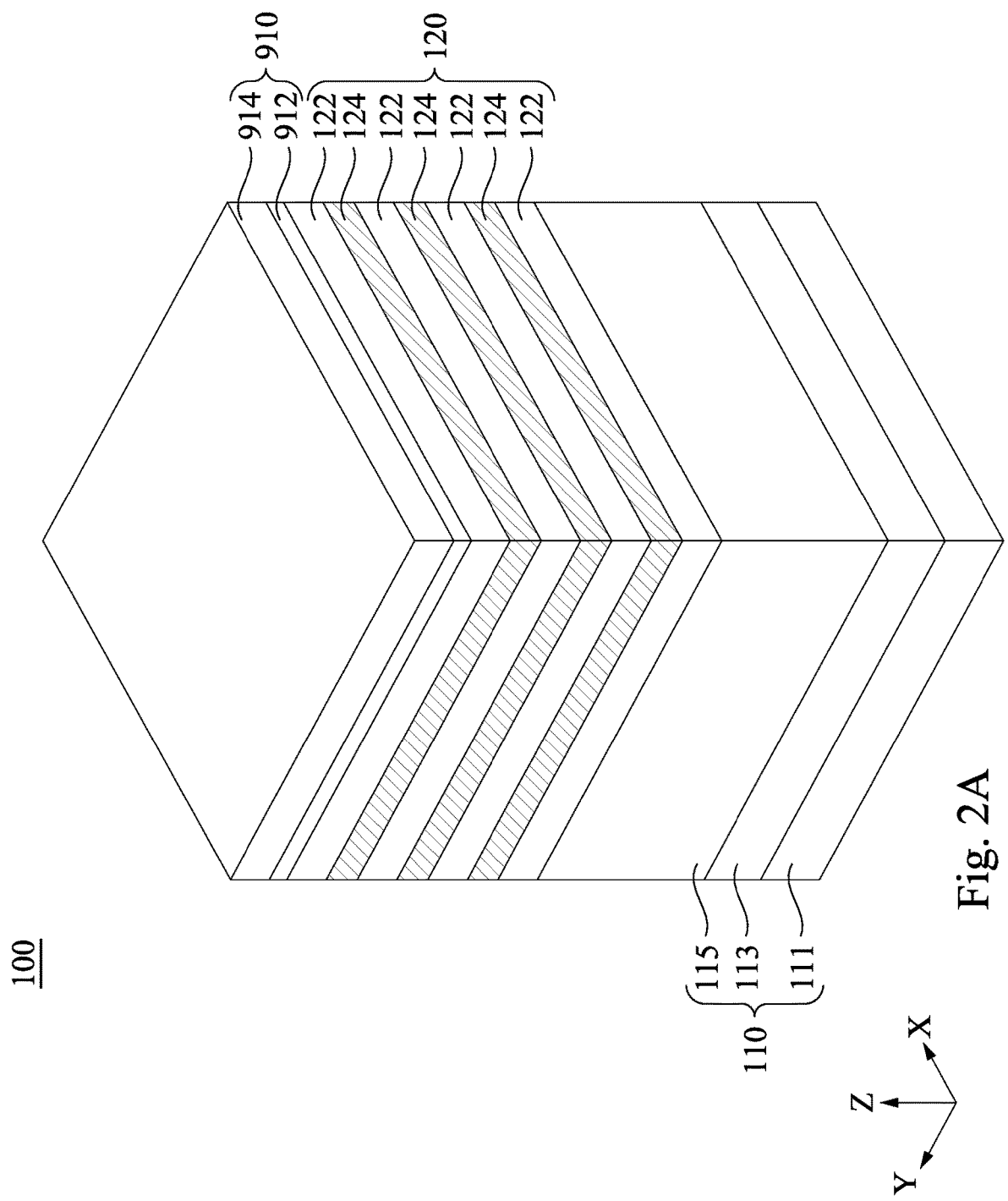

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The present disclosure is generally related to integrated circuit structures and methods of forming the same, and more particularly to fabricating gate-all-around (GAA) transistors with a backside via rail below source regions and/or drain regions of the GAA transistors. It is also noted that the present disclosure presents embodiments in the form of multi-gate transistors. Multi-gate transistors include those transistors whose gate structures are formed on at least two-sides of a channel region. These multi-gate devices may include a p-type metal-oxide-semiconductor device or an n-type metal-oxide-semiconductor device. Specific examples may be presented and referred to herein as FINFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), and/or other suitable channel configuration. Presented herein are embodiments of devices that may have one or more channel regions (e.g., nanosheets) associated with a single, contiguous gate structure. However, one of ordinary skill would recognize that the teaching can apply to a single channel (e.g., single nanosheet) or any number of channels. One of ordinary skill may recognize other examples of semiconductor devices that may benefit from aspects of the present disclosure.

As scales of the fin width in fin field effect transistors (FinFET) decreases, channel width variations might cause mobility loss. GAA transistors, such as nanosheet transistors are being studied as an alternative to fin field effect transistors. In a nanosheet transistor, the gate of the transistor is made all around the channel (e.g., a nanosheet channel or a nanowire channel) such that the channel is surrounded or encapsulated by the gate. Such a transistor has the advantage of improving the electrostatic control of the channel by the gate, which also mitigates leakage currents.

In order to create more routing space for an integrated circuit (IC) structure having a large number of GAA transistors, backside power rails connected to backside silicide regions in source regions of GAA transistors using backside metal vias are being studied as an alternative to front-side power rails formed on front-side of source regions of transistors. However, the GAA transistors may suffer from unsatisfactory source contact resistance, because the backside silicide regions are formed at a low temperature to prevent damages on front-end-of-line (FEOL) devices (e.g., GAA transistors). Therefore, the present disclosure provides a backside via rail electrically coupled to a silicide region in the source epitaxial structure, wherein the silicide region is formed in FEOL processing by using a front-side source contact. Because the front-side silicide region can be formed at a higher temperature in the FEOL processing than the backside silicide region, the contact resistance between the backside via rail and the front-side silicide region can be reduced.

FIGS. 1A-35C illustrate perspective views and cross-sectional views of intermediate stages in formation of an integrated circuit having multi-gate devices, in accordance with some embodiments of the present disclosure. The steps shown in FIGS. 1-34C are also reflected schematically in the process flow shown in FIGS. 36A and 36B. As used herein, the term "multi-gate device" is used to describe a device (e.g., a semiconductor transistor) that has at least some gate material disposed on multiple sides of at least one channel of the device. In some examples, the multi-gate device may be referred to as a GAA device or a nanosheet device having gate material disposed on at least four sides of at least one channel of the device. The channel region may be referred to as a "nanowire," which as used herein includes channel regions of various geometries (e.g., cylindrical, bar-shaped) and various dimensions.

FIGS. 1A, 2A, 3A, 4A, 5A, 6A, 7A, 8A, 9A, 10A, 11A, 12A, 13A, 14A and 15A are perspective views of intermediate stages in the fabricating an integrated circuit structure 100 in accordance with some embodiments of the present disclosure. FIGS. 1B, 2B, 3B, 4B, 5B, 6B, 7B, 8B, 9B, 10B, 11B, 12B, 13B, 14B, 15C, 18B, 19B, 20B, 21B, 22B, 23B, 24B, 25B, 26B, 27B, 28B, 29B, 30B, 31B, 32B, 33B, 34B and 35B are cross-sectional views of intermediate stages of fabricating the integrated circuit structure 100 along a first cut (e.g., cut Y1-Y1 in FIG. 15A), which is in gate regions of neighboring transistors and perpendicular to a lengthwise direction of channels. FIGS. 15B, 16, 17, 18A, 19A, 20A, 21A, 22A, 23A, 24A, 25A, 26A, 27A, 28A, 29A, 30A, 31A, 32A, 33A, 34A and 35A are cross-sectional views of intermediate stages of fabricating the integrated circuit structure 100 along a second cut (e.g., cut X-X in FIG. 15A), which is along a lengthwise direction of channels and perpendicular to a top surface of the substrate. FIGS. 18C, 19C, 20C, 21C, 22C, 23C, 24C, 25C, 26C, 27C, 28C, 29C, 30C, 31C, 32C, 33C, 34C, 35C are cross-sectional views of intermediate stages of fabricating the integrated circuit structure 100 along a third cut (e.g., cut Y2-Y2 in FIG. 8A), which is in source/drain regions of neighboring transistors and perpendicular to the lengthwise direction of channels.

As with the other method embodiments and exemplary devices discussed herein, it is understood that parts of the integrated circuit structure 100 may be fabricated by a CMOS technology process flow, and thus some processes are only briefly described herein. Further, the exemplary integrated circuit structure may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the concepts of the present disclosure. In some embodiments, the exemplary integrated circuit structure includes a plurality of semiconductor devices (e.g., transistors), including PFETs, NFETs, etc., which may be interconnected. Moreover, it is noted that the process steps of fabricating the integrated circuit structure 100, including any descriptions given with reference to FIGS. 1A-35C, as with the remainder of the method and exemplary figures provided in this disclosure, are merely exemplary and are not intended to be limiting beyond what is specifically recited in the claims that follow.

FIGS. 1A and 1B illustrates a perspective view and a cross-sectional view of an initial structure. The initial structure includes a substrate 110. In some embodiments, the substrate 110 is a semiconductor-on-insulator (SOI) substrate that is comprised of a base substrate 111, a buried insulator layer 113 and a semiconductor layer 115. The base substrate 111 may comprise silicon, gallium arsenide, gallium nitride, strained silicon, silicon germanium, silicon carbide, carbide, diamond, an epitaxy layer, and/or other materials. The buried insulator layer 113 may comprise silicon oxide, silicon nitride, silicon oxynitride, and/or other dielectric materials. The semiconductor layer 115 may comprise silicon, gallium arsenide, gallium nitride, strained silicon, silicon germanium, silicon carbide, carbide, diamond, and/or other materials. The buried insulator layer 113 and the semiconductor layer 115 may be formed using various SOI technologies. For example, the buried insulator layer 113 may be formed on a semiconductor wafer by a process referred to as separation by implanted oxygen (SIMOX). The SIMOX technology is based on ion-implanting a high-dose of oxygen ions into a silicon wafer, such that the peak concentration lies beneath the silicon surface. After implantation the wafer is subjected to a high-temperature anneal to form a continuous stoichiometric subsurface-layer of silicon dioxide. Thus formed dielectric layer 113, also referred to as buried oxide (BOX), electrically separates the semiconductor layer 115 and the base substrate 111.

Figure 2B:
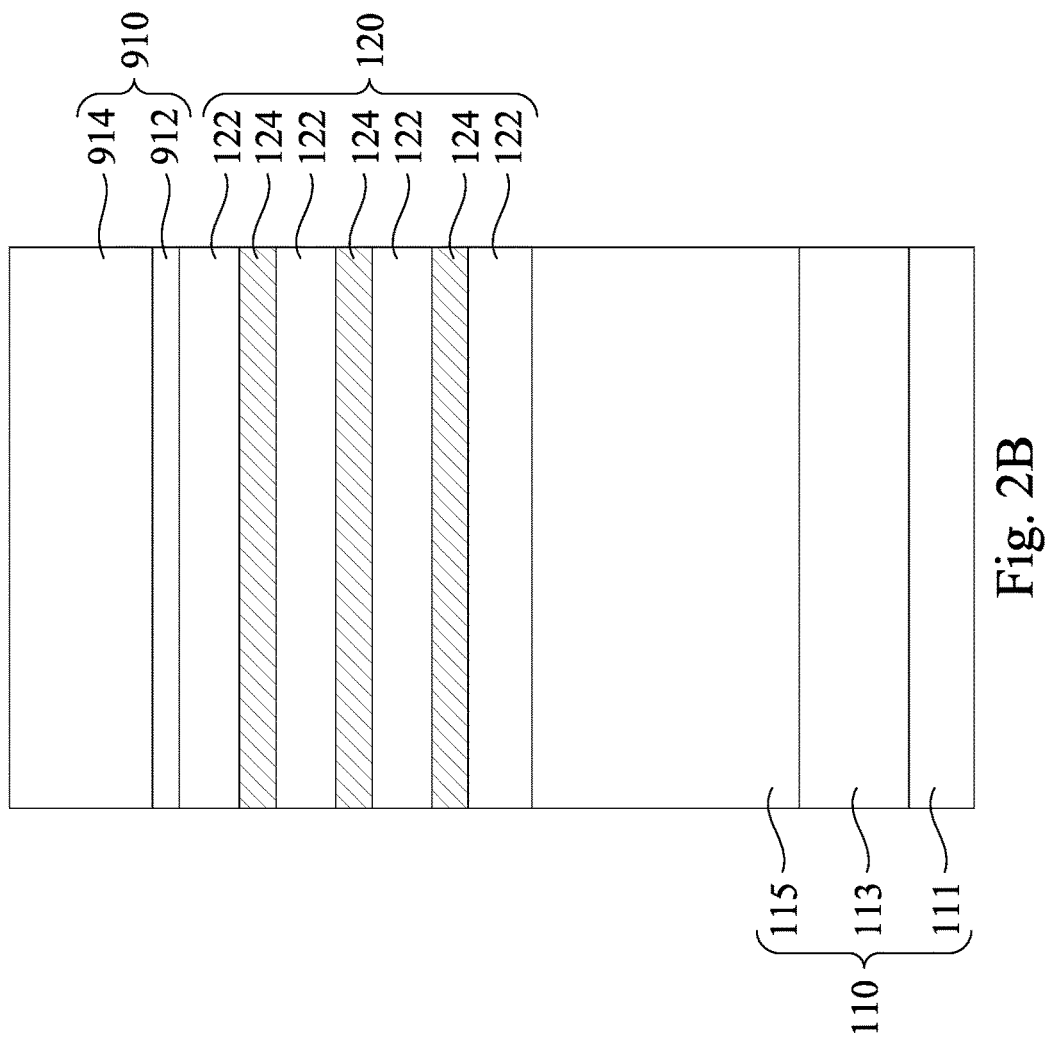

FIGS. 2A and 2B illustrate a perspective view and a cross-sectional view of an epitaxial stack 120 formed over the substrate 110. The epitaxial stack 120 includes epitaxial layers 122 of a first composition interposed by epitaxial layers 124 of a second composition. The first and second compositions can be different. In some embodiments, the epitaxial layers 122 are SiGe and the epitaxial layers 124 are silicon (Si). However, other embodiments are possible including those that provide for a first composition and a second composition having different oxidation rates and/or etch selectivity. In some embodiments, the epitaxial layers 122 include SiGe and where the epitaxial layers 124 include Si, the Si oxidation rate of the epitaxial layers 124 is less than the SiGe oxidation rate of the epitaxial layers 122.

The epitaxial layers 124 or portions thereof may form nanosheet channel(s) of the multi-gate transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The use of the epitaxial layers 124 to define a channel or channels of a device is further discussed below.

It is noted that four layers of the epitaxial layers 122 and three layers of the epitaxial layers 124 are alternately arranged as illustrated in FIGS. 2A and 2B, which is for illustrative purposes only and not intended to be limiting beyond what is specifically recited in the claims. It can be appreciated that any number of epitaxial layers can be formed in the epitaxial stack 120; the number of layers depending on the desired number of channels regions for the transistor. In some embodiments, the number of epitaxial layers 124 is between 2 and 10.

In some embodiments, each epitaxial layer 122 has a thickness ranging from about 1 nanometers (nm) to about 10 nm, but other ranges are within the scope of various embodiments of the present disclosure. The epitaxial layers 122 may be substantially uniform in thickness. In some embodiments, each epitaxial layer 124 has a thickness ranging from about 1 nm to about 10 nm, but other ranges are within the scope of various embodiments of the present disclosure. In some embodiments, the epitaxial layers 124 of the stack are substantially uniform in thickness. As described in more detail below, the epitaxial layers 124 may serve as channel region(s) for a subsequently-formed multi-gate device and the thickness is chosen based on device performance considerations. The epitaxial layers 122 in channel regions(s) may eventually be removed and serve to define a vertical distance between adjacent channel region(s) for a subsequently-formed multi-gate device and the thickness is chosen based on device performance considerations. Accordingly, the epitaxial layers 122 may also be referred to as sacrificial layers, and epitaxial layers 124 may also be referred to as channel layers.

By way of example, epitaxial growth of the layers of the stack 120 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 124 include the same material as the substrate 110. In some embodiments, the epitaxially grown layers 122 and 124 include a different material than the substrate 110. As stated above, in at least some examples, the epitaxial layers 122 include an epitaxially grown silicon germanium (SiGe) layer and the epitaxial layers 124 include an epitaxially grown silicon (Si) layer. Alternatively, in some embodiments, either of the epitaxial layers 122 and 124 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 122 and 124 may be chosen based on providing differing oxidation and/or etching selectivity properties. In some embodiments, the epitaxial layers 122 and 124 are substantially dopant-free (i.e., having an extrinsic dopant concentration from about 0 $cm^{-3}$ to about $1\times10^{18}$ $cm^{-3}$), where for example, no intentional doping is performed during the epitaxial growth process.

Figure 3B:
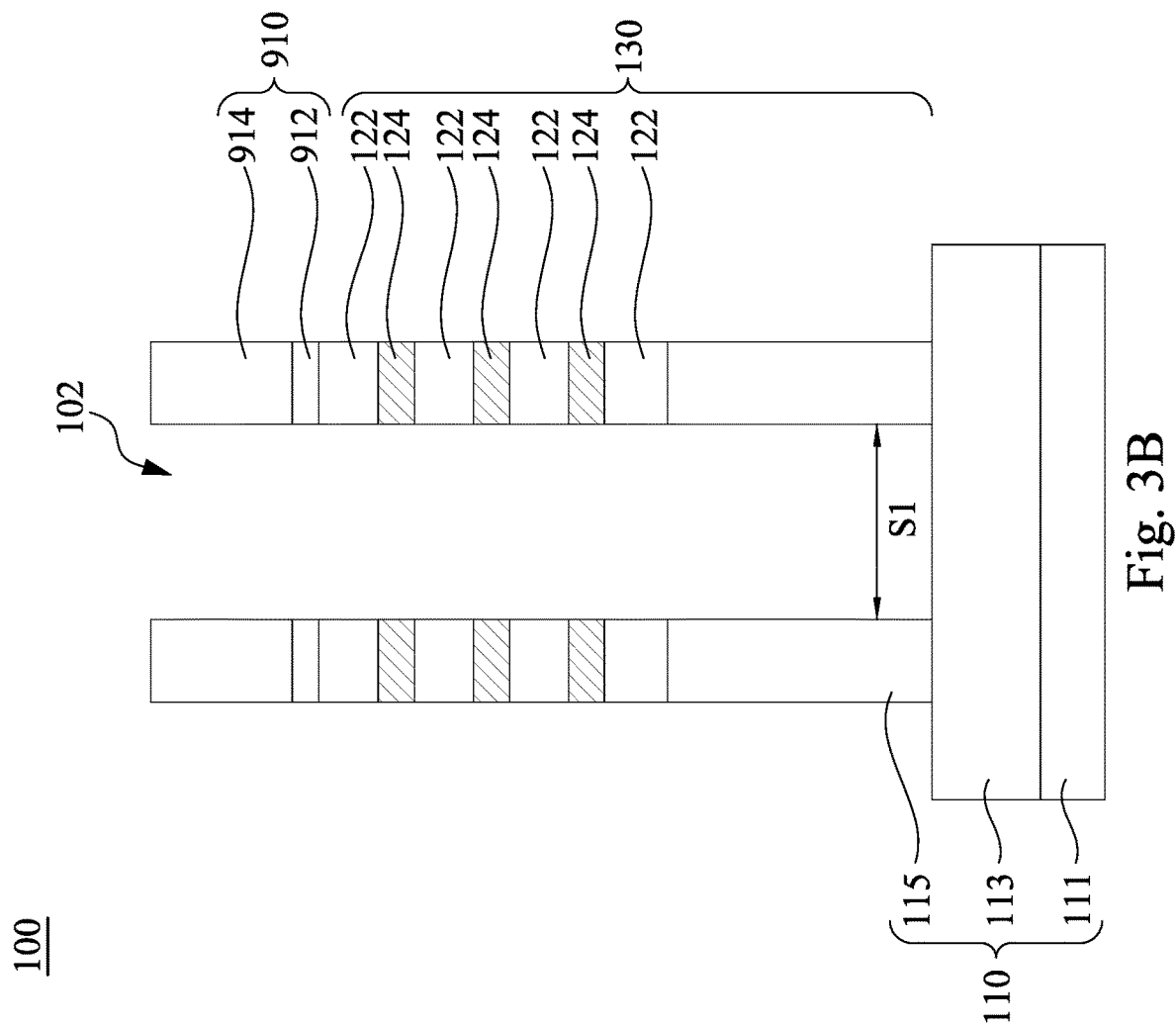

FIGS. 3A and 3B illustrate a perspective view and a cross-sectional view of formation of a plurality of semiconductor fins 130 extending from the buried insulator layer 113 of the substrate 110. In various embodiments, each of the fins 130 includes a portion of the semiconductor layer 115 protruding from the buried insulator layer 113 and portions of each of the epitaxial layers of the epitaxial stack including epitaxial layers 122 and 124. The fins 130 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 130 by etching initial epitaxial stack 120 (illustrated in FIGS. 2A and 2B). The etching process can include dry etching, wet etching, reactive ion etching (RIE), and/or other suitable processes.

The neighboring fins 130 are separated by a fin-to-fin spacing S1. In some embodiments, the fin-to-fin spacing S1 may be in a range from about 22 nm to about 46 nm. Excessively small fin-to-fin spacing S1 may lead to increased challenge on subsequent deposition processing for forming backside via rail in the fin-to-fin spacing. Excessively large fin-to-fin spacing S1 may lead to unsatisfactory cell height of standard cells formed in the integrated circuit structure 100.

In the embodiment as illustrated in FIGS. 2A, 2B and 3A, 3B, a hard mask (HM) layer 910 is formed over the epitaxial stack 120 prior to patterning the fins 130. In some embodiments, the HM layer includes an oxide layer 912 (e.g., a pad oxide layer that may include $SiO_2$) and a nitride layer 914 (e.g., a pad nitride layer that may include $Si_3N_4$) formed over the oxide layer. The oxide layer 912 may act as an adhesion layer between the epitaxial stack 120 and the nitride layer 914 and may act as an etch stop layer for etching the nitride layer 914. In some examples, the HM oxide layer 912 includes thermally grown oxide, chemical vapor deposition (CVD)-deposited oxide, and/or atomic layer deposition (ALD)-deposited oxide. In some embodiments, the HM nitride layer 914 is deposited on the HM oxide layer 912 by CVD and/or other suitable techniques.

The fins 130 may subsequently be fabricated using suitable processes including photolithography and etch processes. The photolithography process may include forming a photoresist layer (not shown) over the HM layer 910, exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process using light in EUV region, having a wavelength of, for example, about 1-100 nm. The patterned mask may then be used to protect regions of the substrate 110, and layers formed thereupon, while an etch process forms trenches 102 in unprotected regions through the HM layer 910, through the epitaxial stack 120, and into the substrate 110, thereby leaving the plurality of extending fins 130. The trenches 102 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 120 in the form of the fins 130.

Figure 4A:
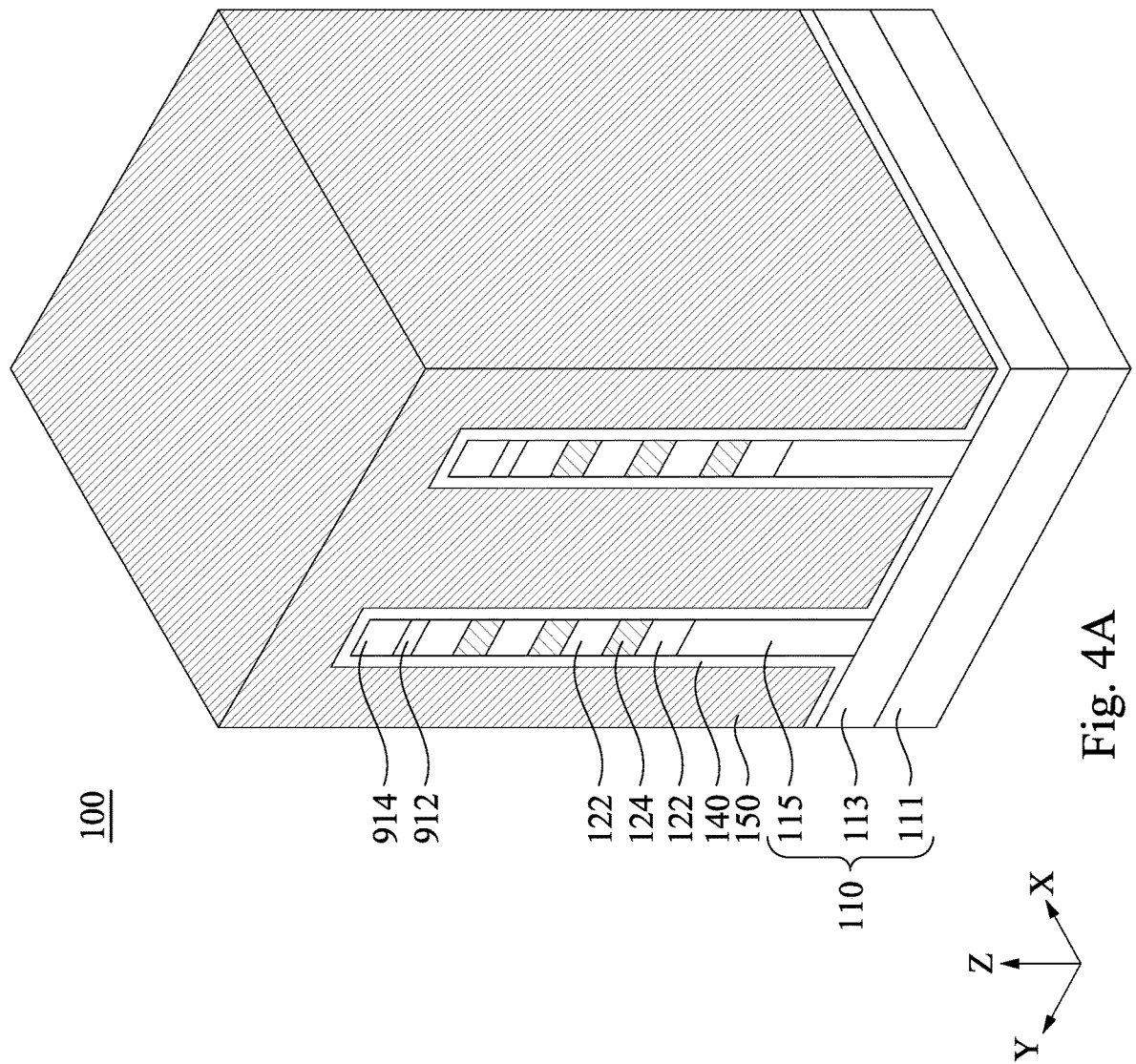
Figure 4B:
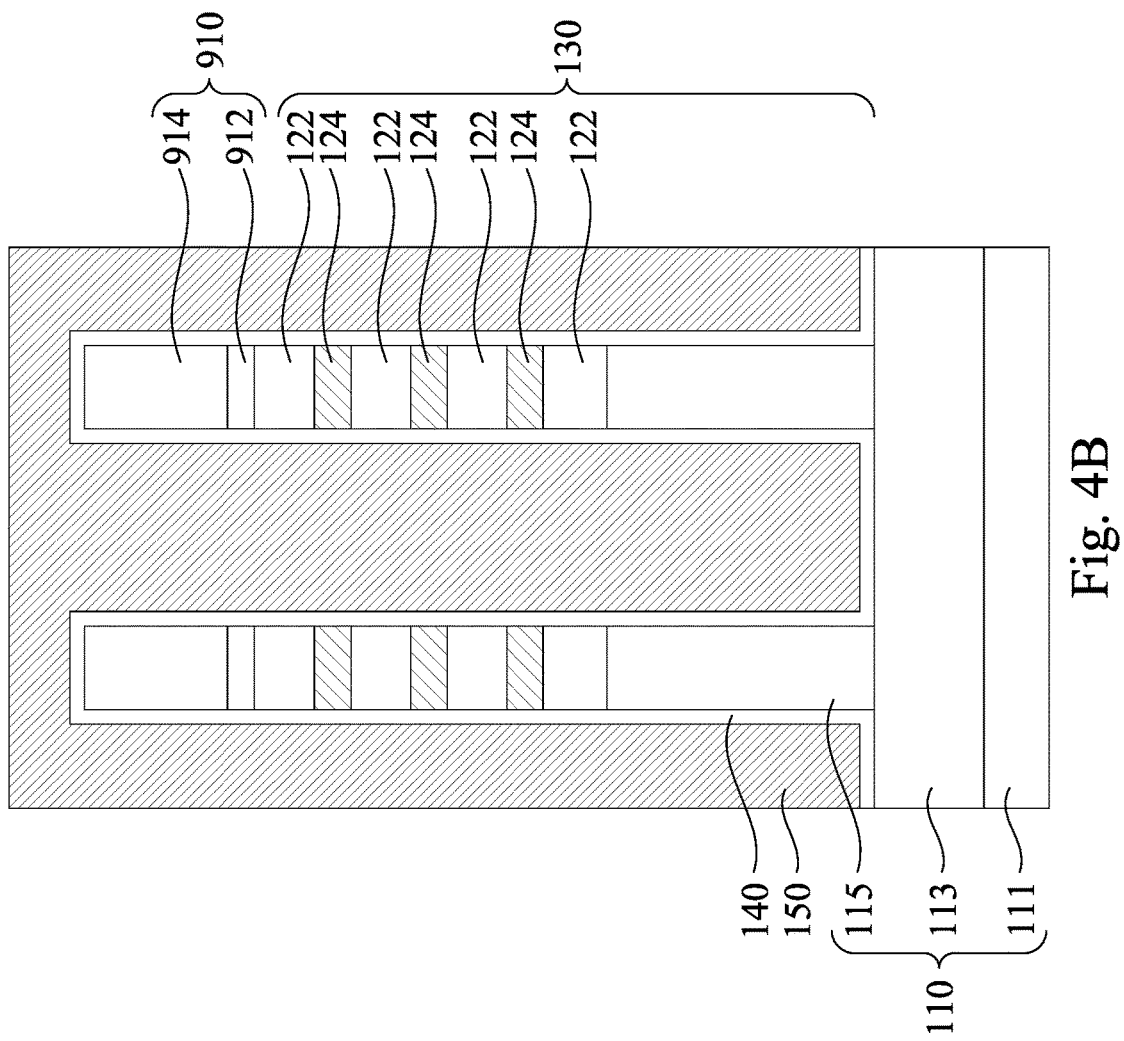

FIGS. 4A and 4B illustrates formation of a liner layer 140 and a metal layer 150. The liner layer 140 is deposited conformally over the fins 130 and the buried insulator layer 113. The liner layer 140 serves to separate the subsequently formed nanosheets from the subsequently formed backside via rail. The liner layer 140 may include, for example, a low-k dielectric material (with dielectric constant lower than about 7) such as $SiO_2$, SiN, SiCN, SiOC, SiOCN, the like, or combinations thereof. In some embodiments, the liner layer 140 is an oxide ($SiO_2$) liner. By way of example, the liner layer 140 may be formed by depositing a dielectric material conformally over the fins 130 using processes such as, CVD process, a subatmospheric CVD (SACVD) process, an ALD process, a PVD process, or other suitable process. In some embodiments, the liner layer 140 has a thickness in a range from about 1 nm to about 10 nm. If the thickness of the liner layer 140 is excessively thin, the fins 130 may be damaged in subsequent etching processing performed on the metal layer 150. If the thickness of the liner layer 140 is excessively thick, the metal layer 150 subsequently deposited in the fin-to-fin spacing between the fins 130 may have unfilled voids.

After the liner layer 140 is formed, the metal layer 150 is then deposited over the liner layer 140. In some embodiments, the metal layer 150 includes, for example, tungsten (W), ruthenium (Ru), cobalt (Co), copper (Cu), titanium (Ti), titanium nitride (TiN), tantalum (Ta), tantalum nitride (TaN), molybdenum (Mo), nickel (Ni), other suitable metals, or combinations thereof. The metal layer 150 is deposited to overfill the trenches 102 between the fins 130 by using suitable deposition techniques, such as CVD, PVD, ALC, the like or combinations thereof.

Figure 5A:
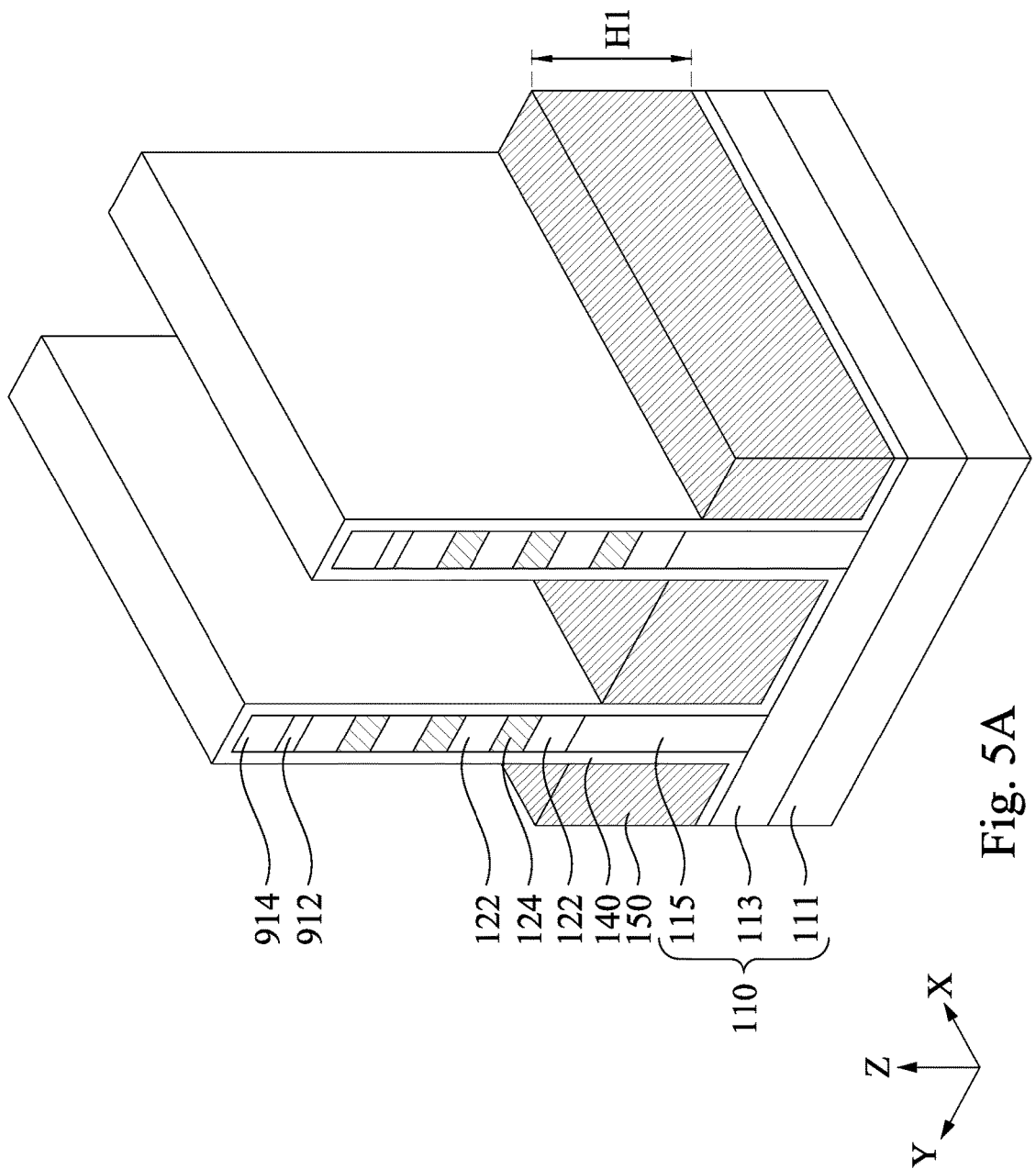
Figure 5B:
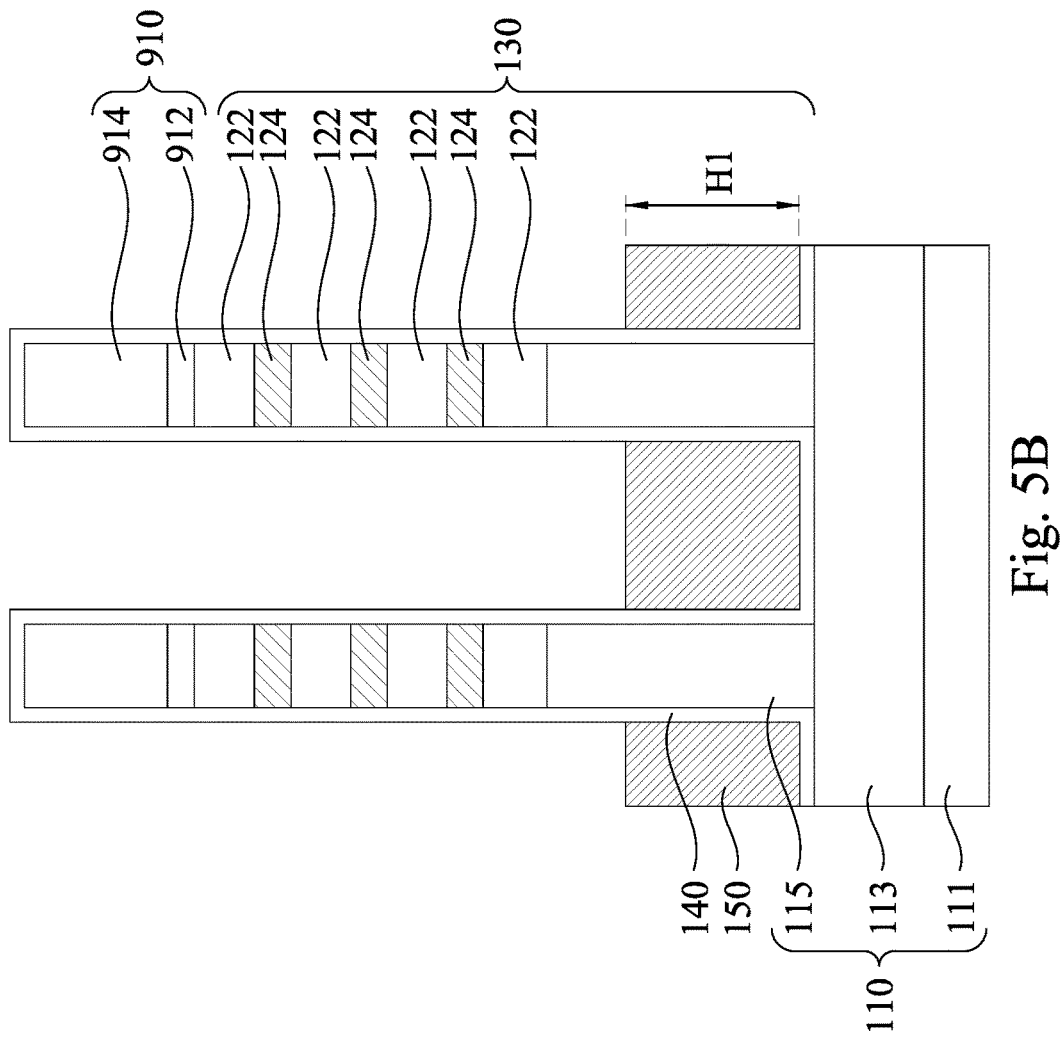

Next, the metal layer 150 is etched back to below the top surfaces of the fins 130, such that the fins 130 protrude above the etched-back metal layer 150. The resulting structure is illustrated in FIGS. 5A and 5B. The etch back process may include a wet etch, a dry etch, or a combination thereof. The etch back process is chosen to selectively etch the metal layer 150 without substantially etching the liner layer 140. Therefore, the liner layer 140 can serve as a protective liner to protect the fins 130 against the etchant used to etch back the metal layer 150. In some embodiments where the selective etch back process is wet etching, the etchant used to selectively etch back the metal layer 150 includes, for example, ozonated DI water (DI-$O_3$), standard clean-1 (SC1) solution, standard clean-2 (SC2) solution, sulfuric peroxide mixture (SPM), the like or combinations thereof, where the SC1 is a mixture of DI water, ammonium hydroxide ($NH_4OH$), and hydrogen peroxide ($H_2O_2$) at a mixture ratio of about 5:1:1 of DI:$NH_4OH$:$H_2O_2$, the SC2 is a mixture of deionized (DI) water and hydrochloric (HCl) acid, and the SPM is a mixture of sulfuric acid ($H_2SO_4$) and hydrogen peroxide ($H_2O_2$). In some embodiments where the selective etch back process is dry etching, the etchant used to selectively etch back the metal layer 150 includes, for example, $SiCl_4$, $Cl_4$, $NF_3$, the like, or combinations thereof. The etch back depth is controlled (e.g., by controlling an etching time) so as to result in a target height of the protruding portions of the fins 130. In the illustrated embodiment, the target height is selected such that the top surface of the etched-back metal layer 150 is below all of the epitaxial layers 122 and 124 in the fins 130. In some embodiments, the top surface of the etch-back metal layer 150 is further below the top surface of the semiconductor layer 115. For example, the etch back depth is controlled such that the resulting height H1 of the metal layer 150 is in a range from about 20 nm to about 60 nm. If the height H1 of the metal layer 150 is out of the selected range, source/drain epitaxy structures subsequently formed above the metal layer 150 and backside power rail subsequently formed below the metal layer 150 may have unsatisfactory time dependent dielectric breakdown (TDDB) performance.

Figure 6A:
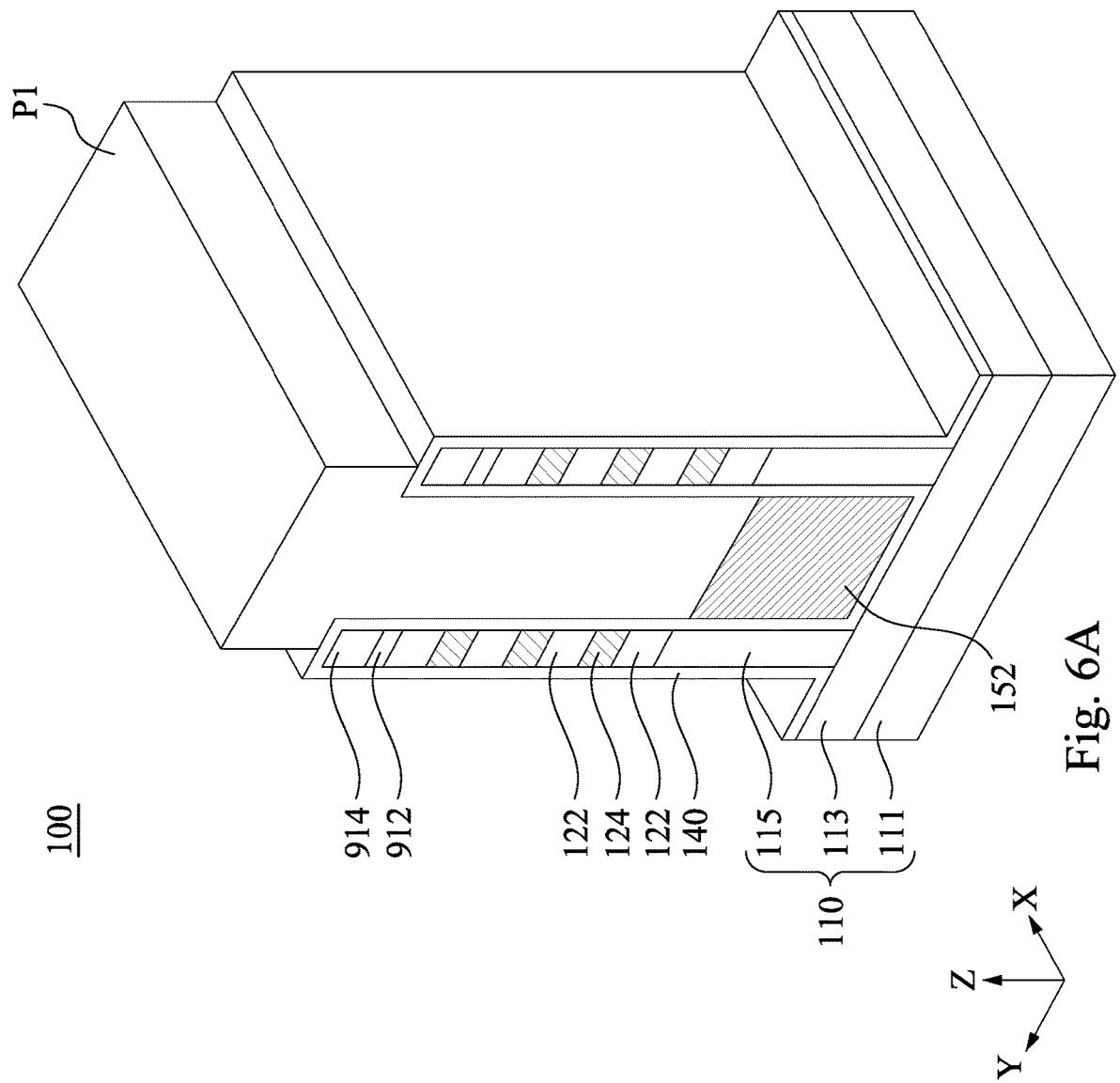
Figure 6B:
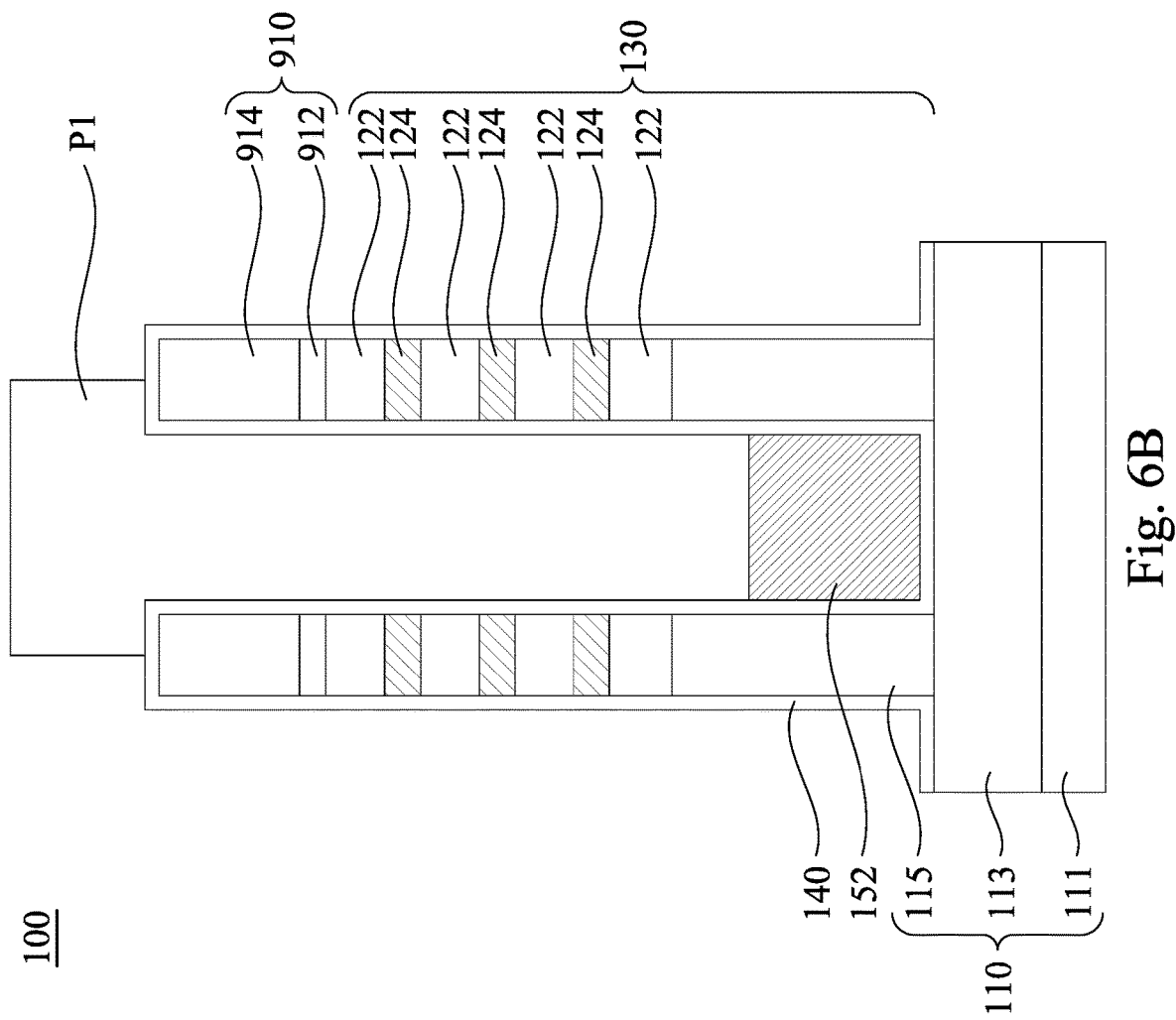

FIGS. 6A and 6B illustrate a perspective view and a cross-sectional view of a backside via rail 152 formed by patterning the metal layer 150 as illustrated in FIGS. 5A and 5B. In some embodiments of this patterning step, a patterned mask P1 is first formed to cover a portion of the metal layer 150 between the fins 130, and then the exposed portions of the metal layer 150 are removed by using suitable etch process. In some embodiments, the patterned mask P1 may be a photoresist mask formed by suitable photolithography processes. For example, the photolithography process may include spin-on coating a photoresist layer over the structure as illustrated in FIGS. 5A and 5B, performing post-exposure bake processes, and developing the photoresist layer to form the patterned mask P1. In some embodiments, patterning the resist to form the patterned mask element may be performed using an electron beam (e-beam) lithography process or an extreme ultraviolet (EUV) lithography process.

Once the patterned mask P1 has been formed, an etching process is then performed to remove exposed portions of the metal layer 150, while leaving a portion under the patterned mask P1 to serve as the backside via rail 152 that extends in parallel with the fins 130 along the X-direction. The backside via rail 152 serves to vertically interconnect the subsequently formed source epitaxial structure and backside power rail. The etching process is chosen to selectively etch the metal layer 150 without substantially etching the liner layer 140. Therefore, the liner layer 140 can serve as a protective liner to protect the fins 130 against the etchant used to etch the metal layer 150. In some embodiments, patterning the metal layer 150 may use the same etchant as that used in etching back the metal layer 150 as discussed previously with respect to FIGS. 5A and 5B. In this case, the etching time/duration of the patterning step may be shorter than the etching time/duration of the previous step of etching back the metal layer 150. Once the patterning process is completed, the patterned mask P1 is removed by, for example, ashing.

Figure 7A:
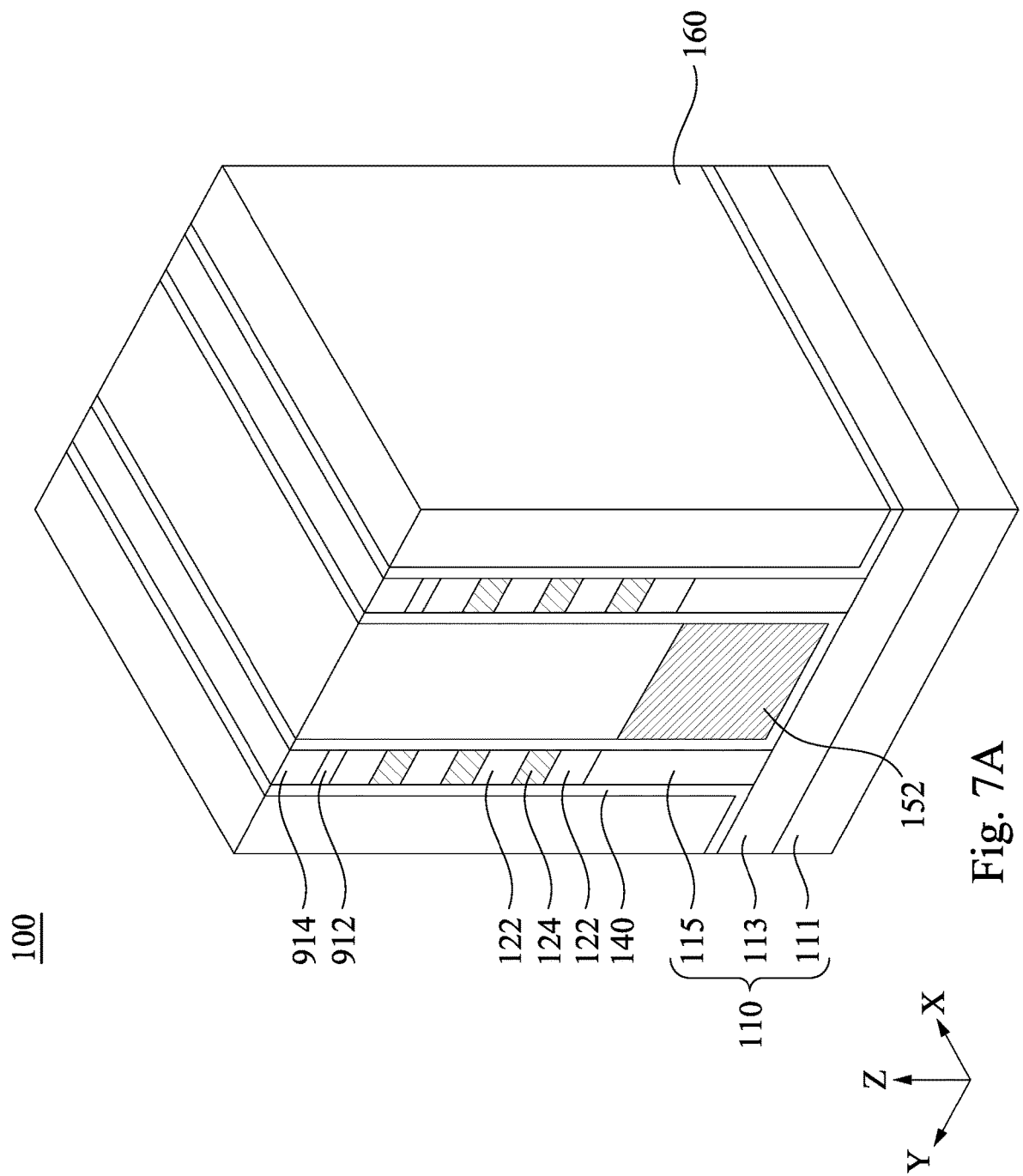
Figure 7B:
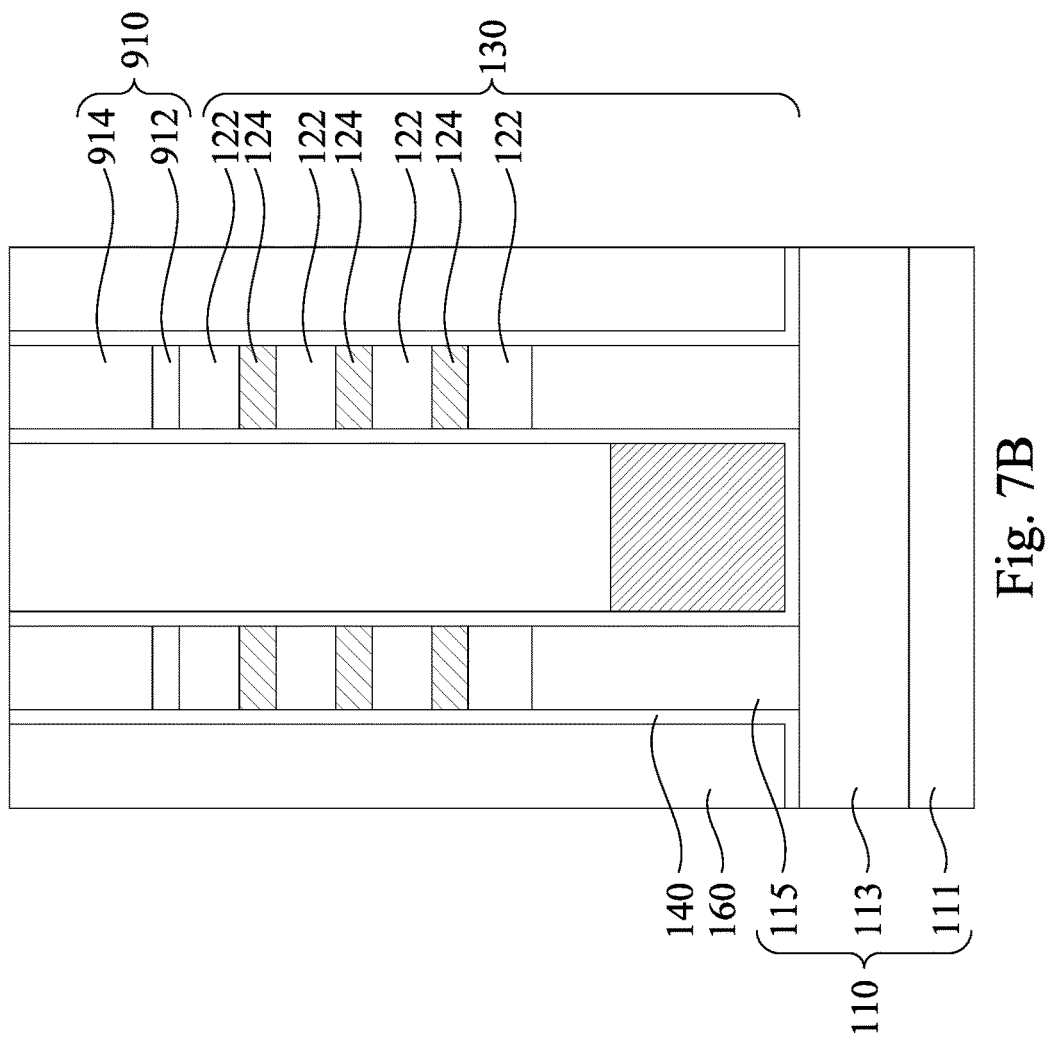

FIGS. 7A and 7B illustrate a perspective view and a cross-sectional view of formation of a shallow trench isolation (STI) structure 160 in the trenches 102 between the fins 130. By way of example and not limitation, a dielectric layer is first deposited over the substrate 110, filling the trenches 102 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable processes. In some embodiments, after deposition of the dielectric layer, the integrated circuit structure 100 may be annealed, for example, to improve the quality of the dielectric layer. In some embodiments, the dielectric layer (and subsequently formed STI structure 140) may include a multi-layer structure, for example, having one or more liner layers.

In some embodiments of forming the isolation (STI) features, after deposition of the dielectric layer, the deposited dielectric material is thinned and planarized, for example by a chemical mechanical polishing (CMP) process. In some embodiments, the HM layer 910 functions as a CMP stop layer, so that the top surface of the STI structure 160 may be substantially coplanar with the top surface of the HM layer 910 after the CMP process is completed.

Figure 8A:
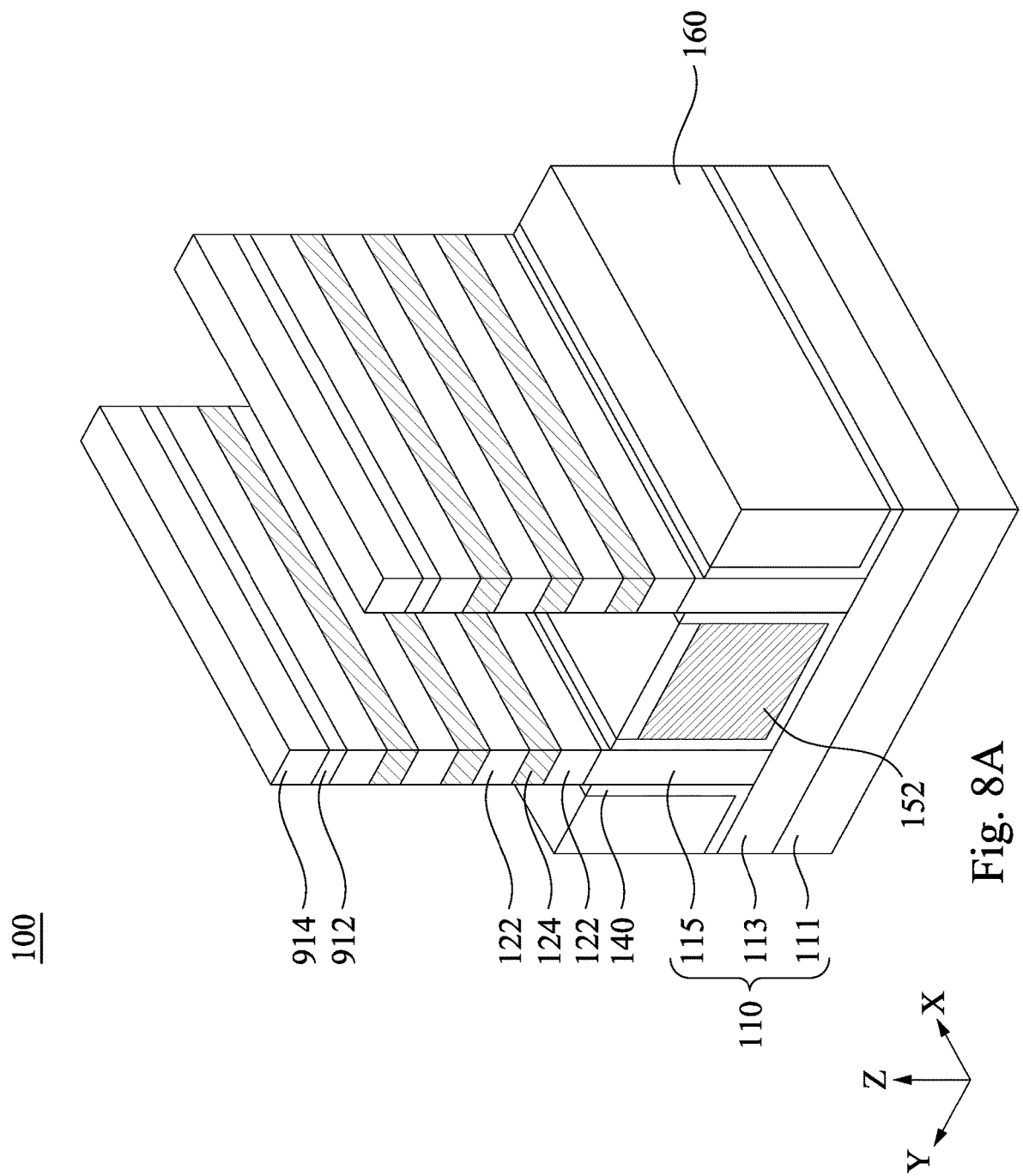
Figure 8B:
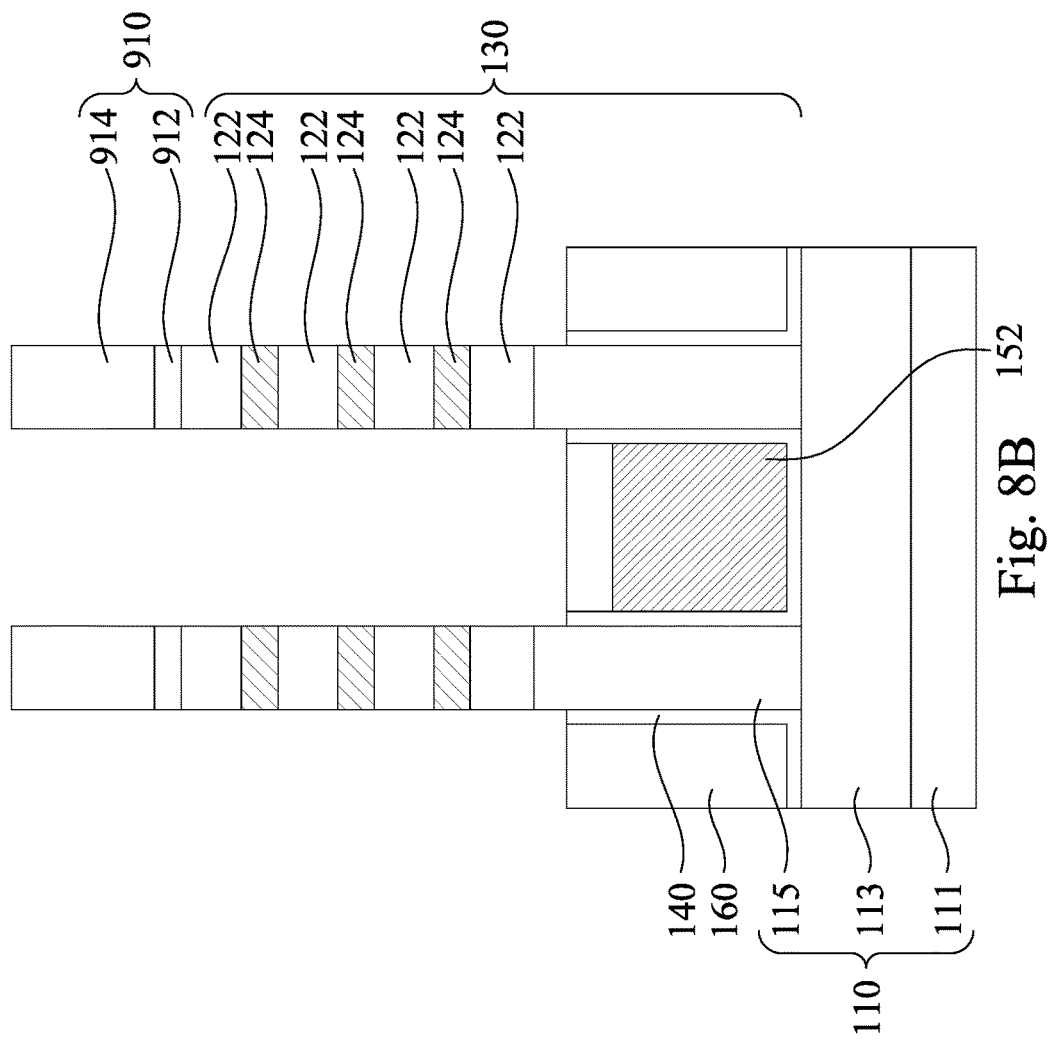

Next, the liner layer 140 and the STI structure 160 are both recessed in an etch back process. Referring to the embodiment as illustrated in FIGS. 8A and 8B, the liner layer 140 and the STI structure 160 are recessed, providing the fins 130 having exposed sidewall extending above the etched back liner layer 140 and STI structure 160. In some embodiments, the recessing process may include a dry etching process, a wet etching process, and/or a combination thereof. The HM layer 910 remains covering top surfaces of the fins 130 during and after the recessing of the liner layer 140 and the STI structure 160. In some embodiments, a recessing depth is controlled (e.g., by controlling an etching time) so as to result in a target height of the exposed upper portion of the fins 130. In the illustrated embodiment, the target height exposes each of the epitaxial layers 122 and 124 of the epitaxial stack 120 in the fins 130, but does not expose the backside via rail 152. As a result, after the recessing process is completed, the backside via rail 152 remains covered by a portion of the STI structure 160.

Figure 9A:
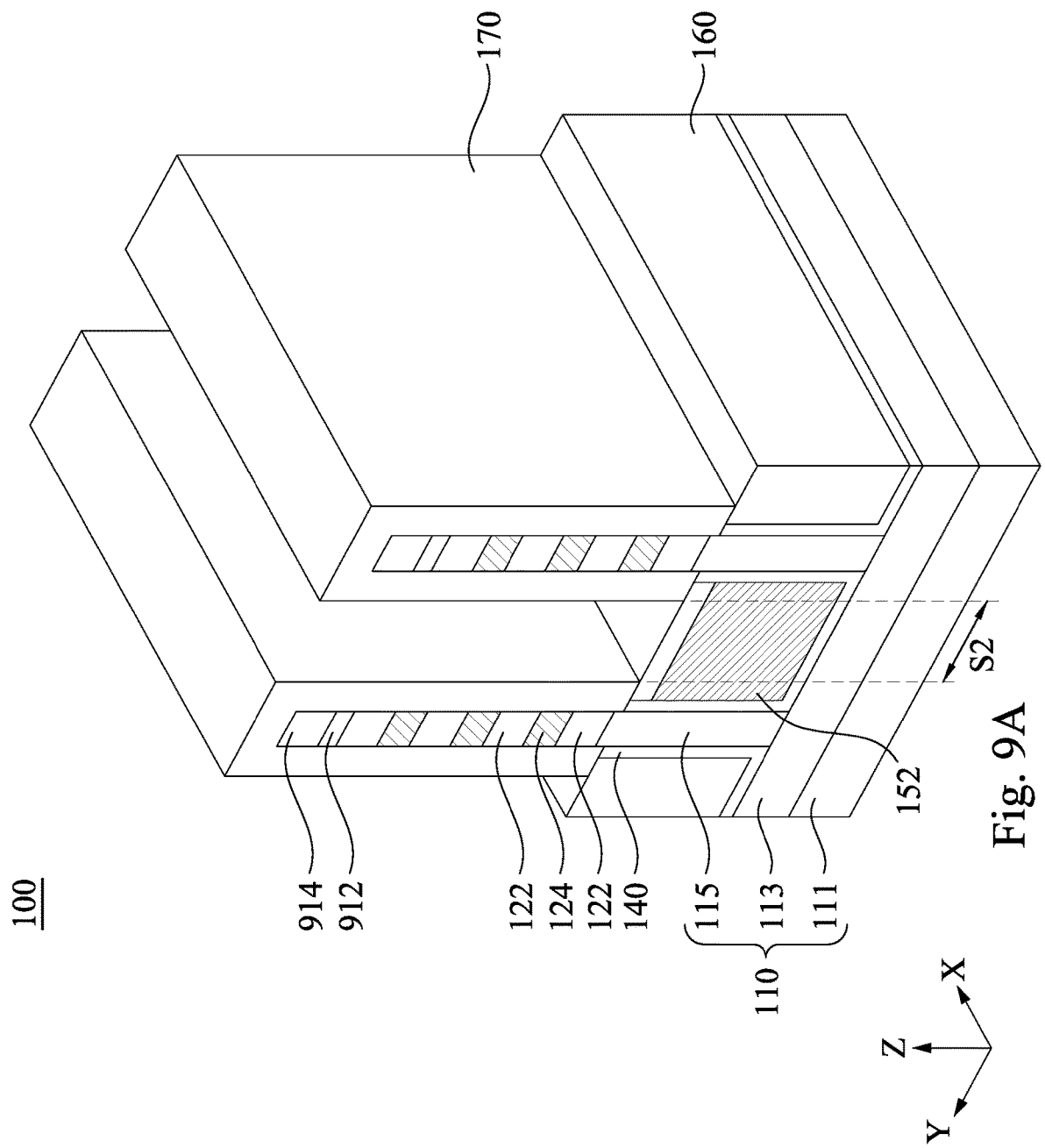
Figure 9B:
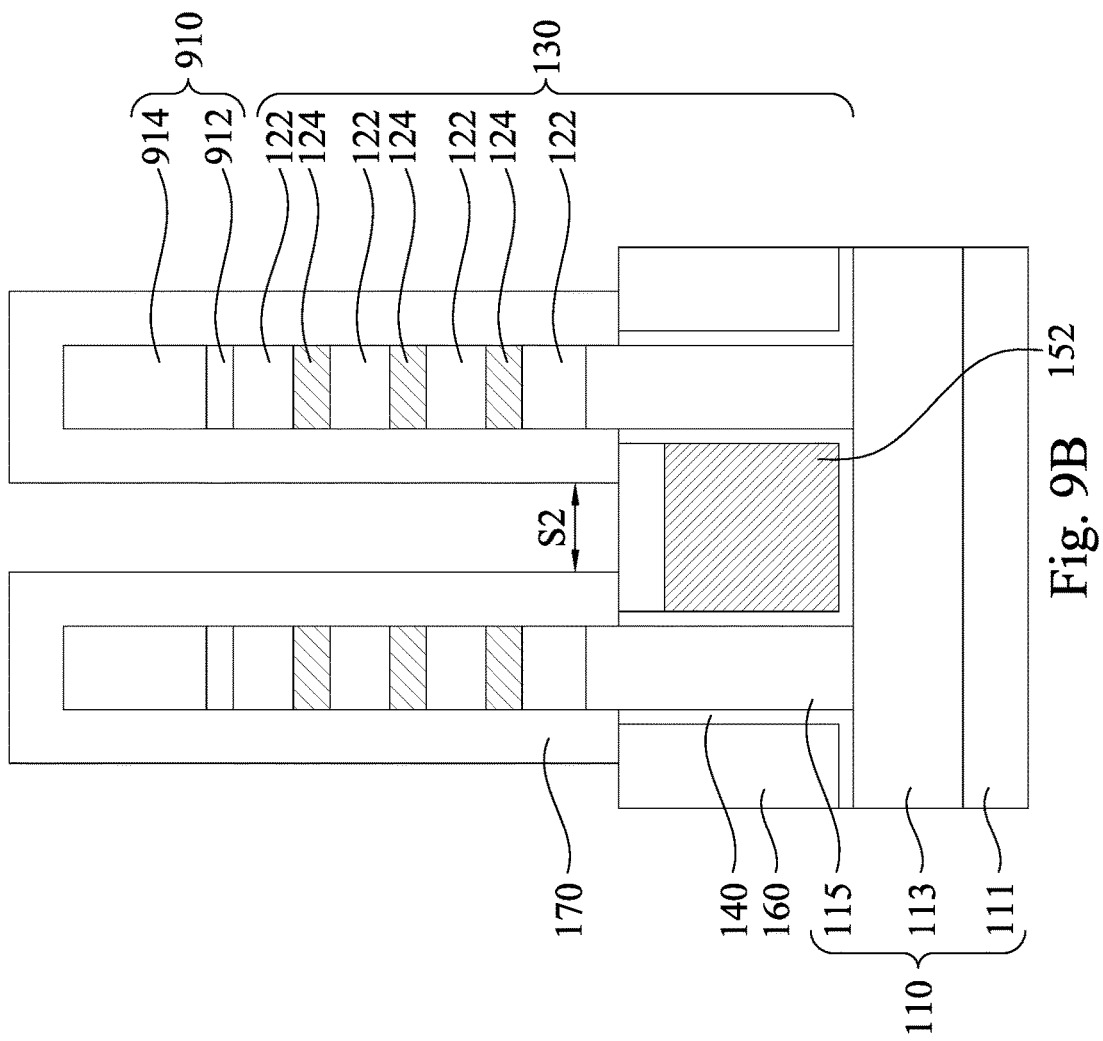

FIGS. 9A and 9B illustrate a perspective view and a cross-sectional view of formation of sacrificial epitaxial structures 170 over the respective fins 130. In some embodiments, the sacrificial epitaxial structures 170 are of the same composition as the epitaxial layers 122 in the fins 130 and thus different composition than the epitaxial layers 124 in the fins 130. Therefore, the sacrificial epitaxial structures 170 and the epitaxial layers 122 can be removed together in a following channel release step. By way of example and not limitation, the sacrificial epitaxial structures 170 are SiGe.

In some embodiments, the sacrificial epitaxial structures 170 may be cladding epitaxial structures formed using one or more epitaxy or epitaxial (epi) processes, such that SiGe features and/or other suitable features can be formed in a crystalline state on the fins 130. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the exposed epitaxial layers 122, 124 (e.g., Si and/or SiGe) in the fins 130. In some embodiments, the sacrificial epitaxial structures 170 can be grown by an epitaxial deposition/partial etch process, which repeats the epitaxial deposition/partial etch processes at least once. Such repeated deposition/partial etch process is also called a cyclic deposition-etch (CDE) process. In the CDE epitaxy process, an etching gas can be added to achieve a target profile of resulting epitaxial structures 170. For example, epitaxy conditions can be controlled (e.g., by tuning temperature, pressure, and/or flow rate ratio among precursor gas, carrier gas and/or etching gas) in such a way that the sacrificial epitaxial structures 170 each have a substantially vertical sidewall profile. In this way, the neighboring sacrificial epitaxial structures 170 define an epi-to-epi spacing S2 with a substantially uniform width that will help in forming a hybrid fin in the epi-to-epi spacing S2 in subsequent processing.

Figure 10A:
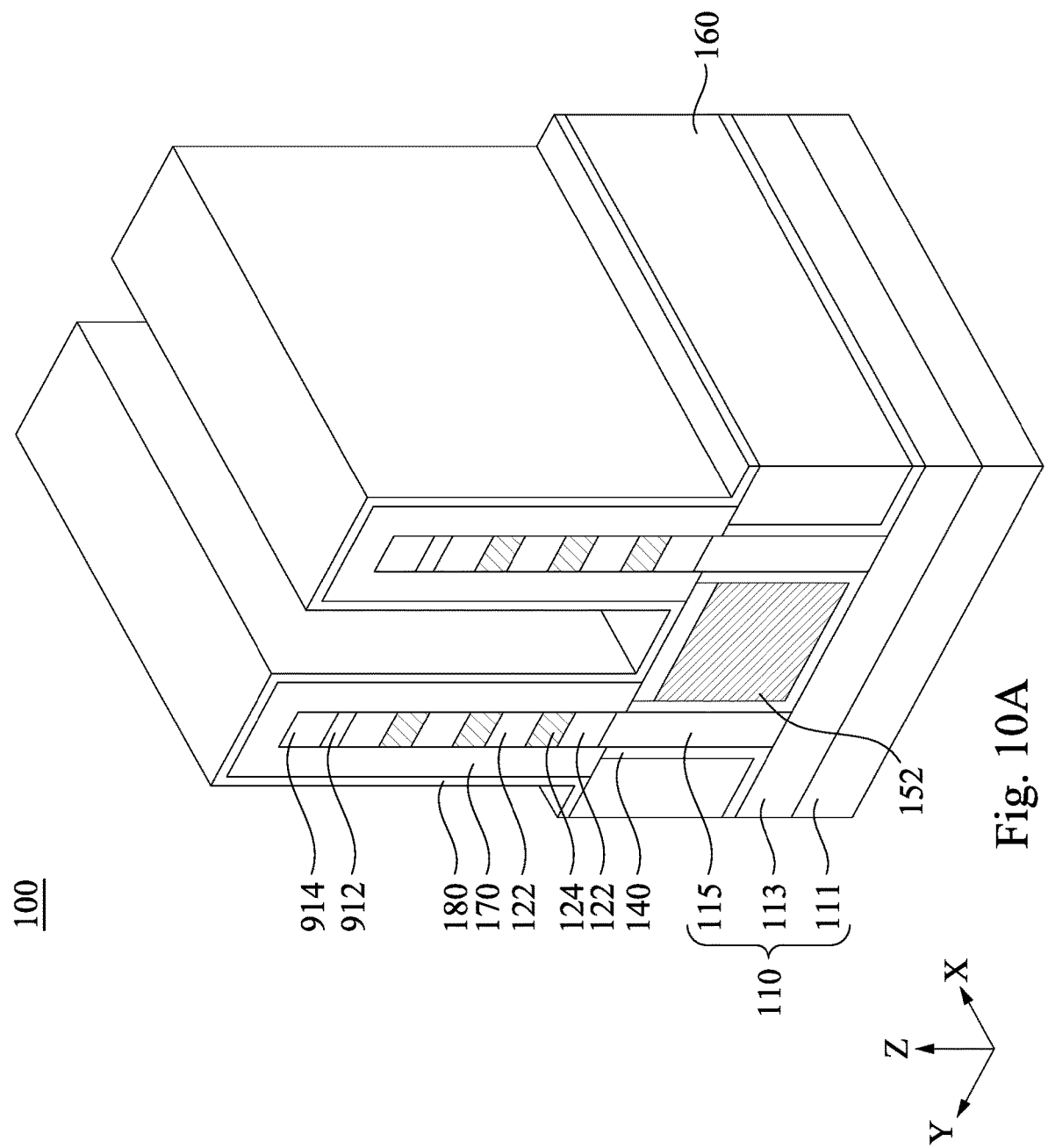
Figure 10B:
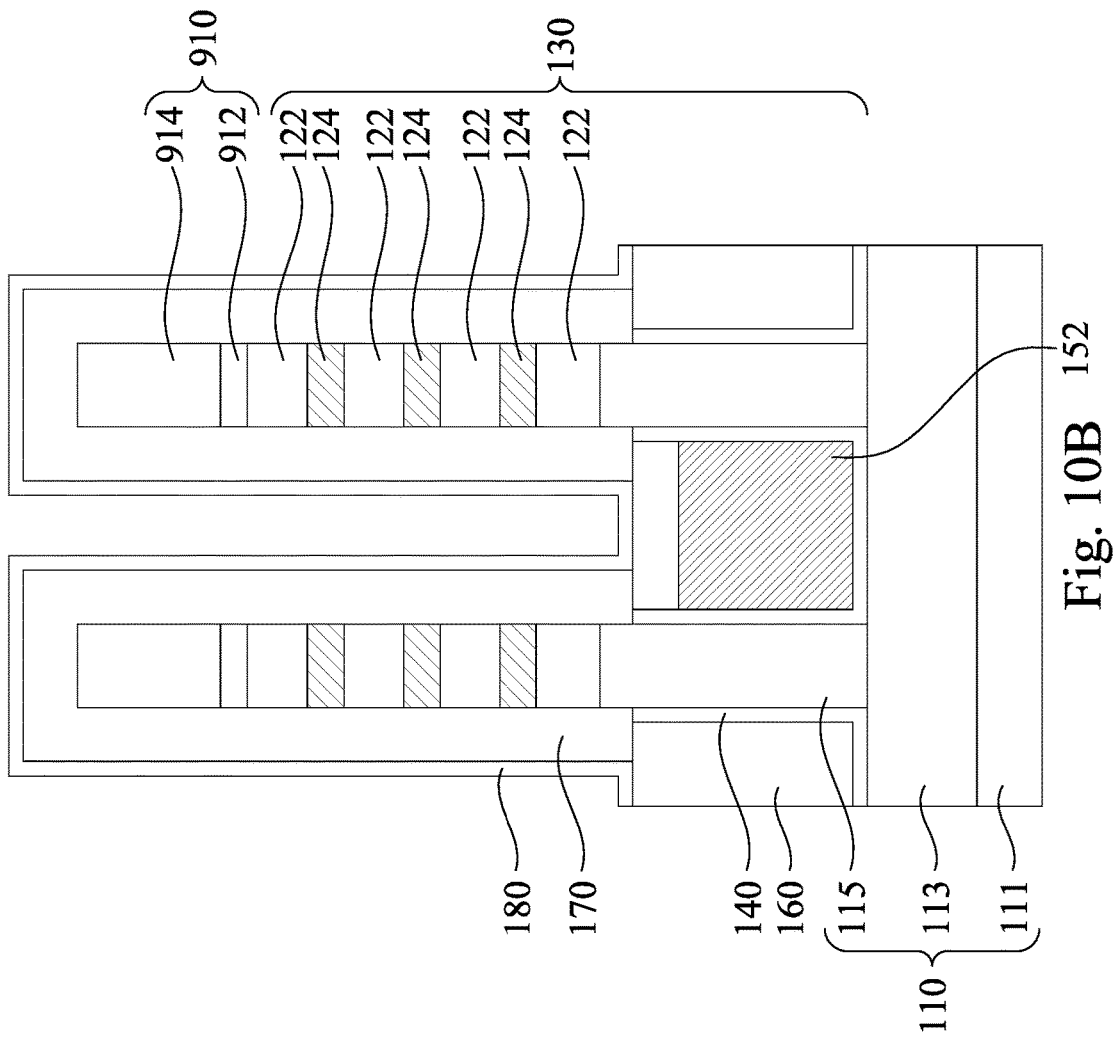

FIGS. 10A and 10B illustrate a perspective view and a cross-sectional view of formation of a liner layer 180 over the sacrificial epitaxial structures 170. The liner layer 180 is deposited conformally over the sacrificial epitaxial structures 170 and the STI structure 160. The liner layer 180 may serve to prevent subsequently formed source/drain epitaxial structures and metal gate structures from oxidation. In some embodiments, the liner layer 180 may include, for example, a low-k dielectric material (with dielectric constant lower than about 7) such as $SiO_2$, SiN, SiCN, SiOC, SiOCN, the like, or combinations thereof. In some embodiments, the liner layer 180 includes a high-k dielectric material (with dielectric constant higher than about 7) such as $HfO_2$, $ZrO_2$, $HfAlO_x$, $HfSiO_x$ and $Al_2O_3$, the like or combinations thereof. In some embodiments, the liner layer 180 is a bilayer dielectric film including a low-k dielectric sub-layer over the sacrificial epitaxial structures 170 and a high-k dielectric sub-layer over the low-k dielectric sub-layer. The liner layer 180 may be formed by depositing one or more dielectric materials conformally over the sacrificial epitaxial structures 170 using processes such as, CVD process, a subatmospheric CVD (SACVD) process, an ALD process, a PVD process, or other suitable process.

Figure 11A:
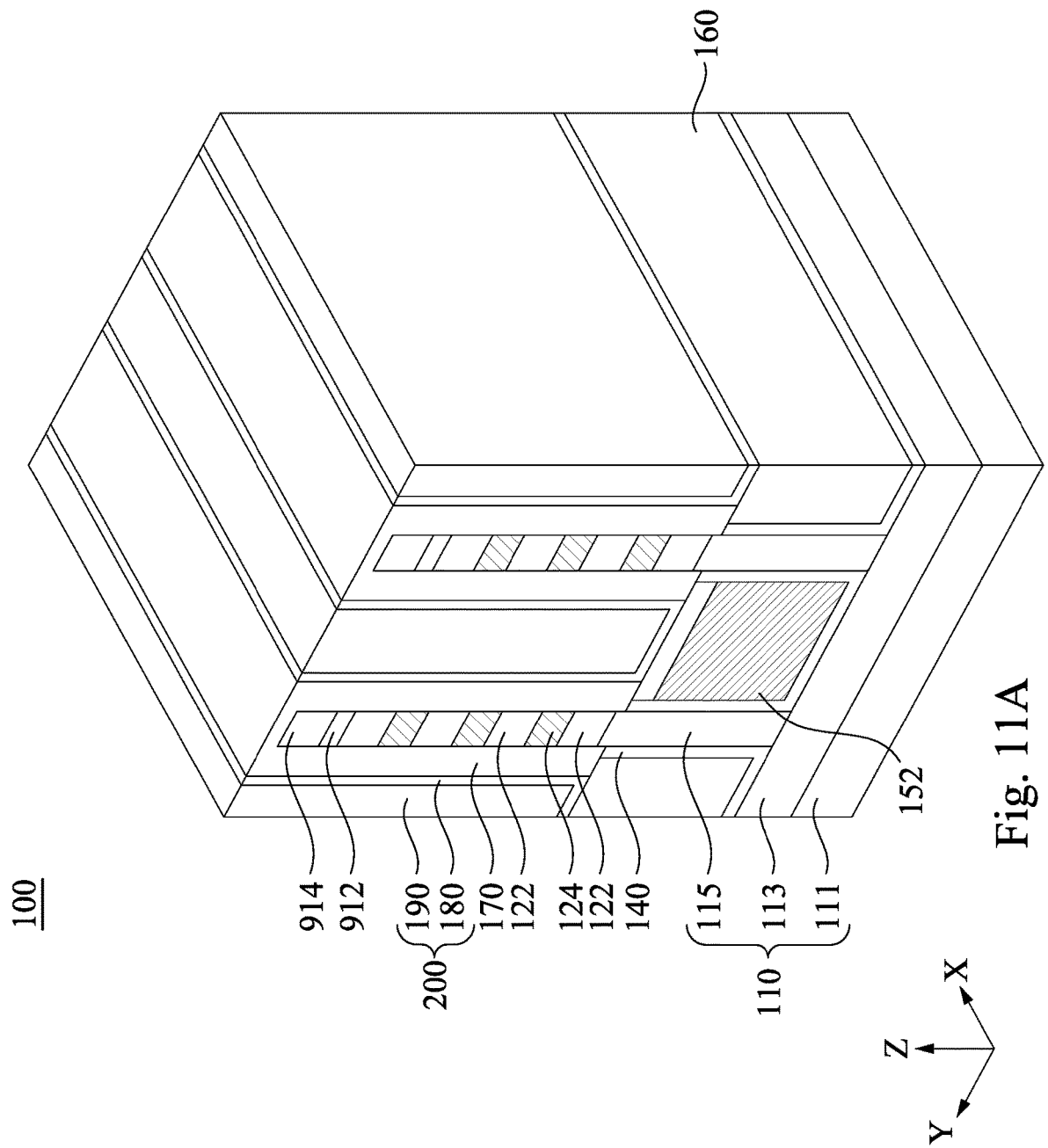
Figure 11B:
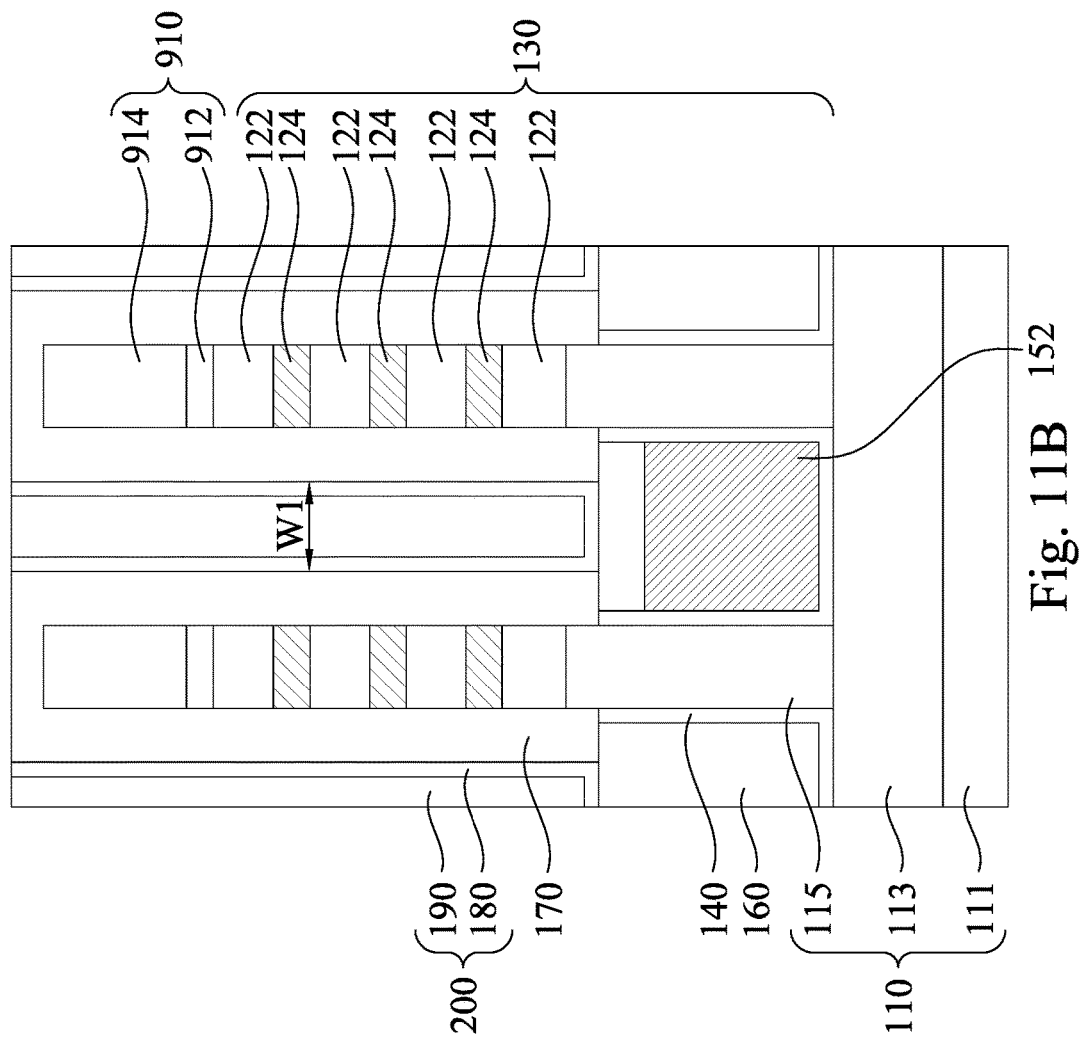

FIGS. 11A and 11B illustrate a perspective view and a cross-sectional view of formation of hybrid fins 200 alternately arranged with the fins 130. In some embodiments of formation of hybrid fins 200, a fill dielectric (e.g., $SiO_2$) 190 is first deposited over the liner layer 180 until trenches in the liner layer 180 are overfilled. A CMP process is then performed on the fill dielectric 190 until top surfaces of the sacrificial epitaxial structures 170 are exposed. Remaining portions of the liner layer 180 and the fill dielectric 190 serve as hybrid fins 200 interposing the fins 130. In some embodiments, the hybrid fins 200 each have a width W1 in a range from about 6 nm to about 30 nm. Excessively small width W1 of the hybrid fins 200 may lead to increased challenge of depositing the fill dielectric 190. Excessively large width W1 of the hybrid fins 200 may lead to unsatisfactory cell height of standard cells formed in the integrated circuit structure 100.

Figure 12A:
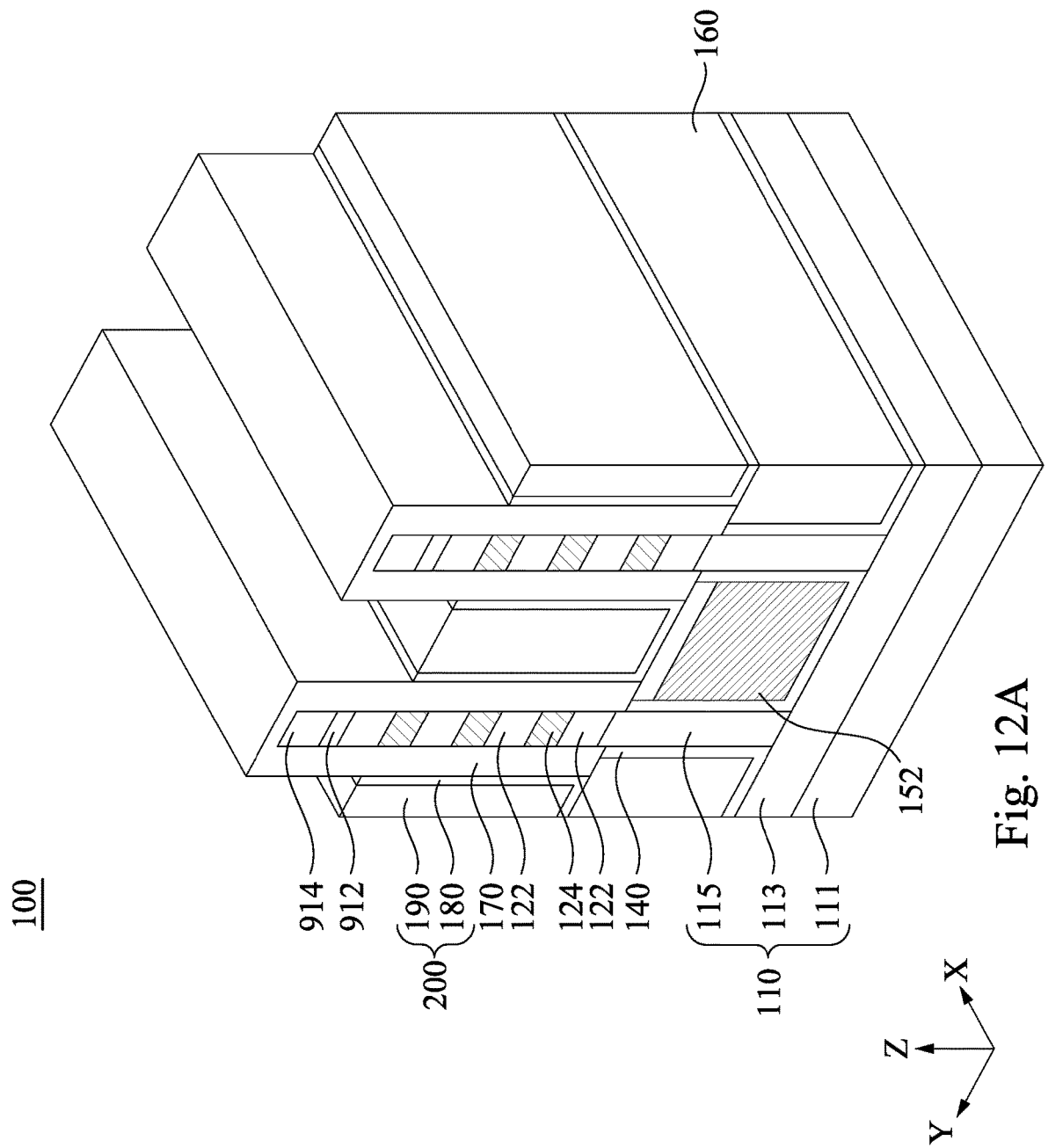
Figure 12B:
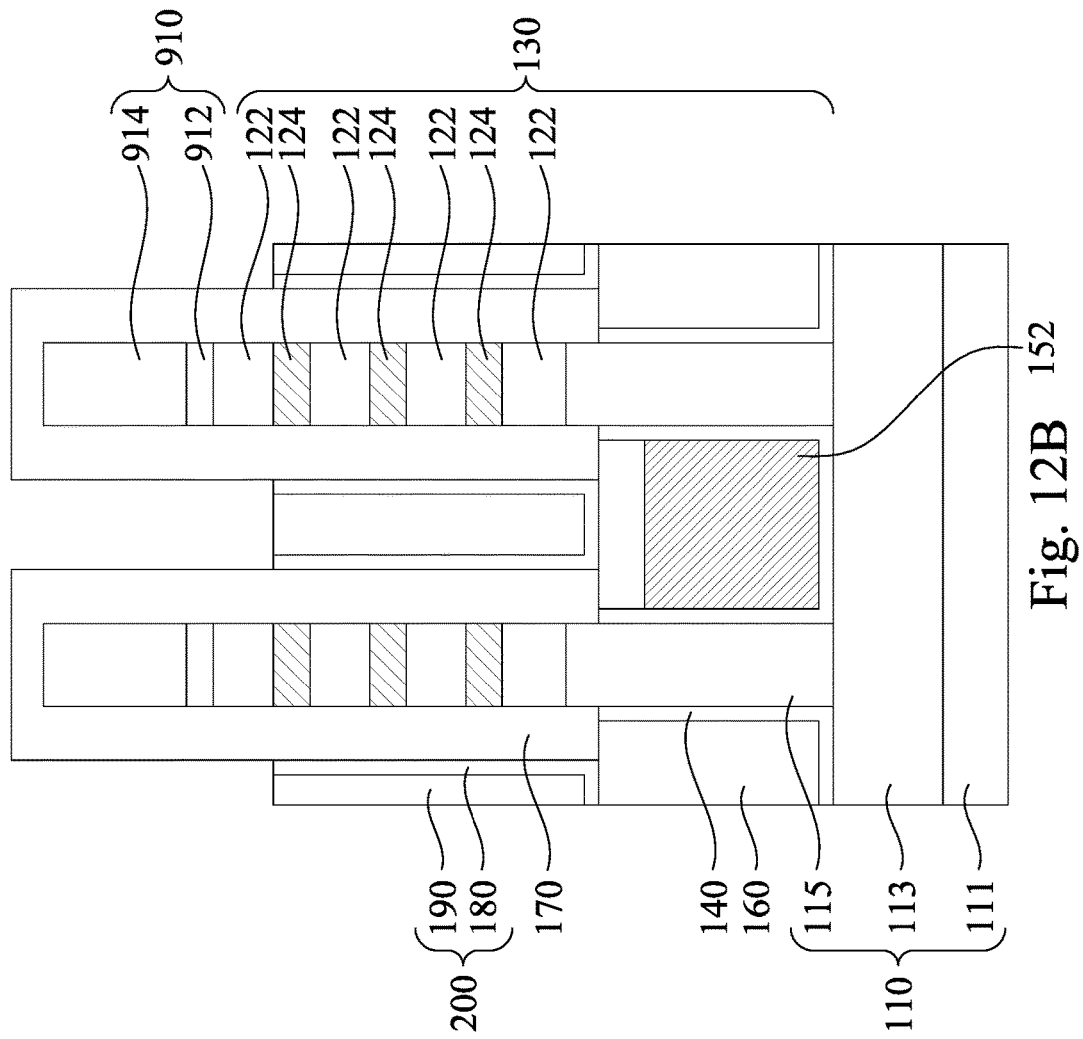

Next, the hybrid fins 200 are etched back to below the top surfaces of the sacrificial epitaxial structures 170, such that the sacrificial epitaxial structures 170 protrude above the etched-back hybrid fins 200. The resulting structure is illustrated in FIGS. 12A and 12B. The etch back process may include a wet etch, a dry etch, or a combination thereof. Etchant used in the etch back process is chosen to selectively etch the hybrid fins 200 (e.g., nitride and/or oxide) without substantially etching sacrificial epitaxial structures 170 (e.g., SiGe structures). In some embodiments where the selective etch back process is wet etching, the etchant used to selectively each back the hybrid fins 200 includes, for example, dilute HF. In some embodiments where the selective etch back process is dry etching, the etchant used to selectively etch back the hybrid fins 200 includes, for example, $NF_3$, $NH_3$, the like, or combinations thereof. The etch back depth is controlled (e.g., by controlling an etching time) so as to result in a target height of the protruding portions of the fins 130. In the illustrated embodiment, the target height is selected such that the top surfaces of the etched-back hybrid fins 200 are below a topmost one of the epitaxial layers 122 (i.e., sacrificial layers to be removed in following processing) in the fins 130. More particularly, the top surfaces of the etched-back hybrid fins 200 are substantially level with a top surface of a topmost one of the epitaxial layers 124 (i.e., channel layers serving as channels of GAA transistors). However, in some other embodiments, the top surfaces of the etched-back hybrid fins 200 may be higher than or lower than the top surface of the topmost one of the channel layers 124.

Figure 13A:
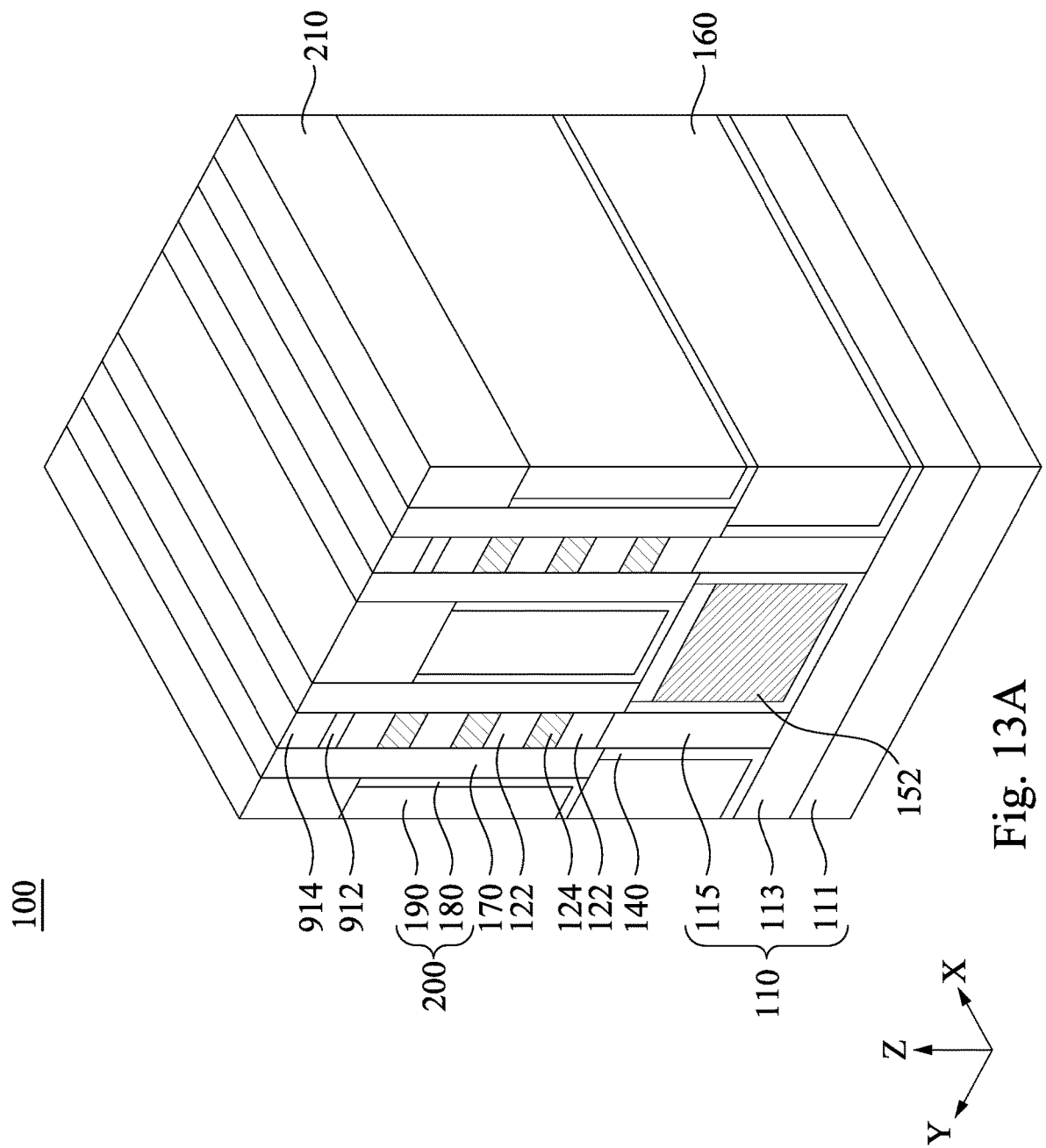
Figure 13B:
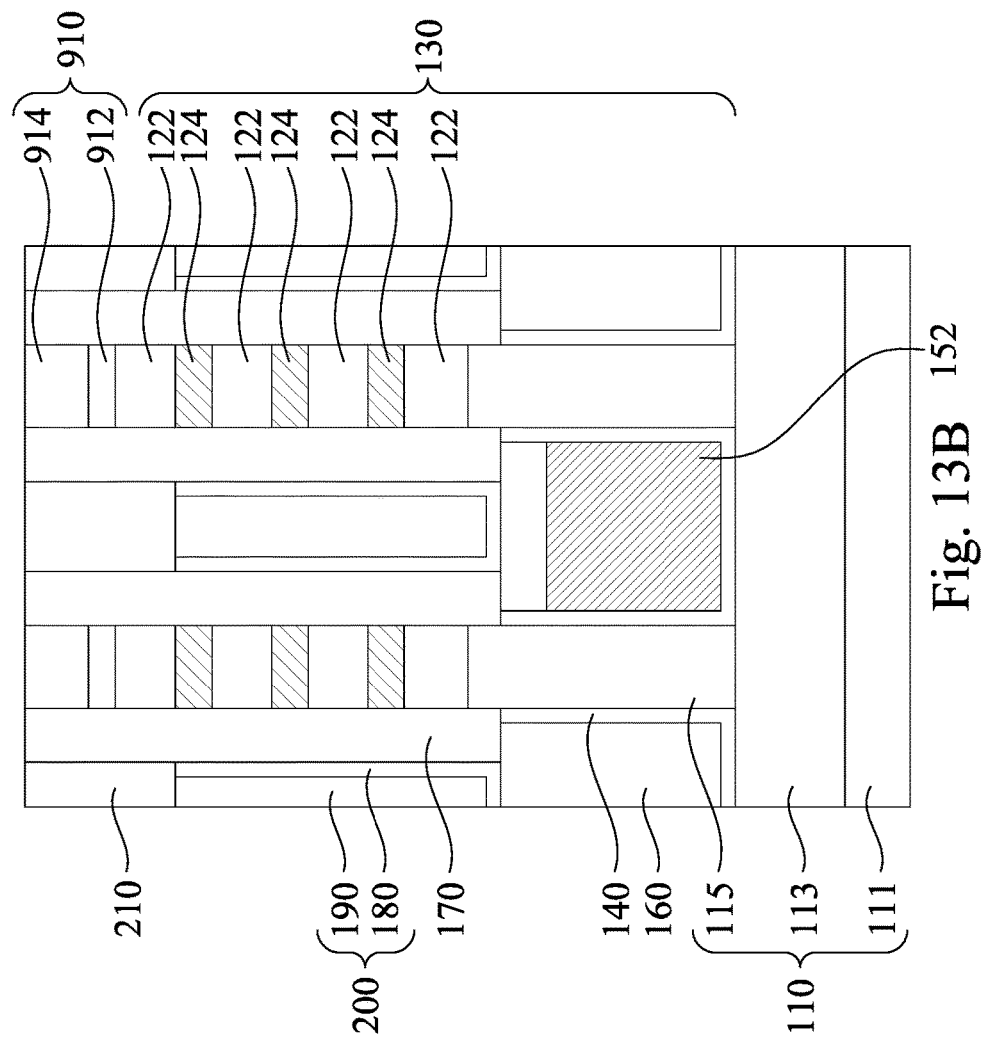

FIGS. 13A and 13B illustrate a perspective view and a cross-sectional view of formation of dielectric caps 210 over the hybrid fins 200. In some embodiments of the step of forming dielectric caps 210, one or more dielectric layers is first deposited over the hybrid fins 200, the sacrificial epitaxial structures 170 and the HM layer 910, followed by performing a CMP process on the deposited one or more dielectric layers until the HM layer 910 is exposed. In some embodiments, the dielectric caps 210 include a high-k dielectric material (with dielectric constant higher than about 7) such as $HfO_2$, $ZrO_2$, $HfAlO_x$, $HfSiO_x$ and $Al_2O_3$, the like or combinations thereof.

Figure 14A:
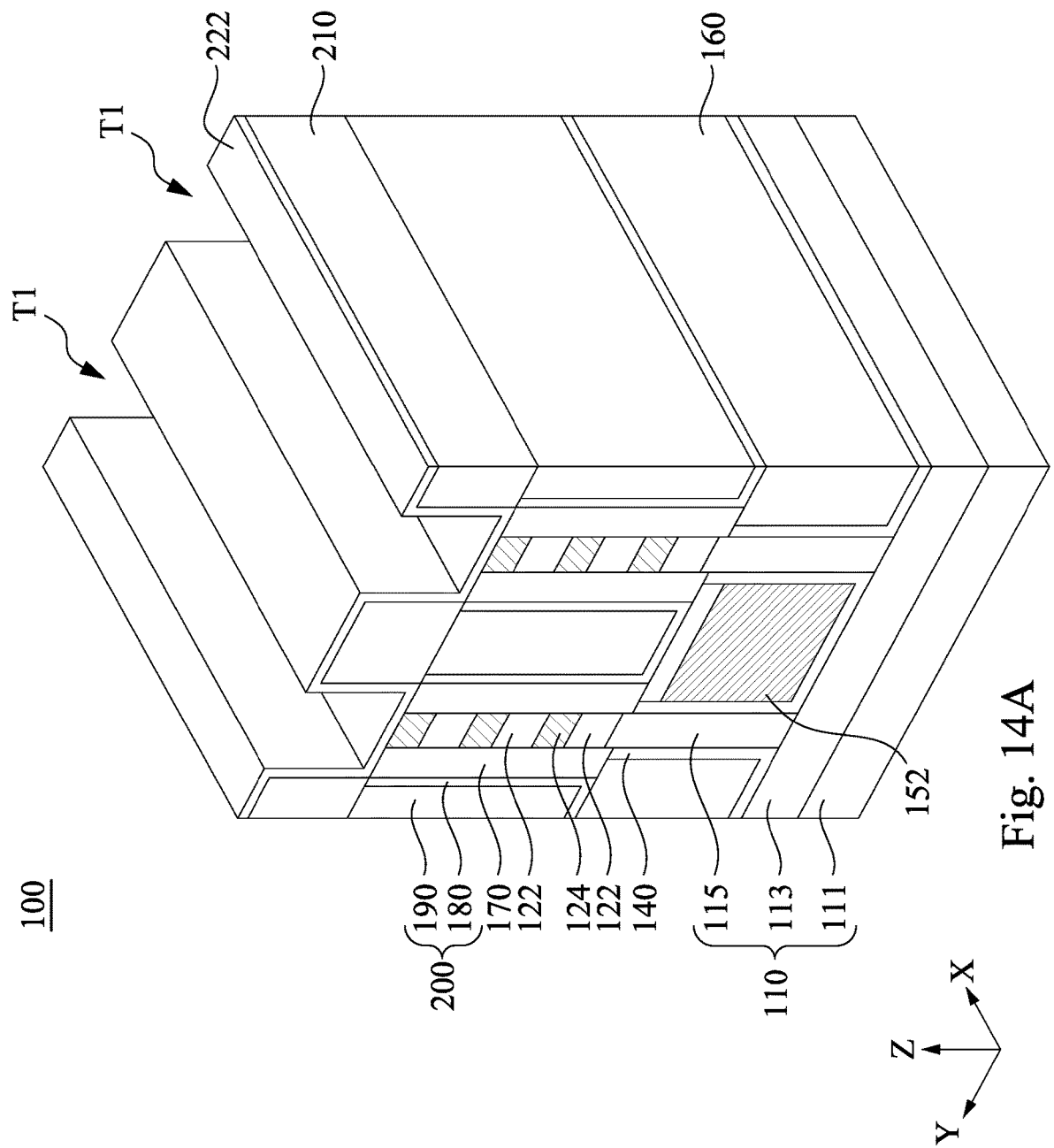
Figure 14B:
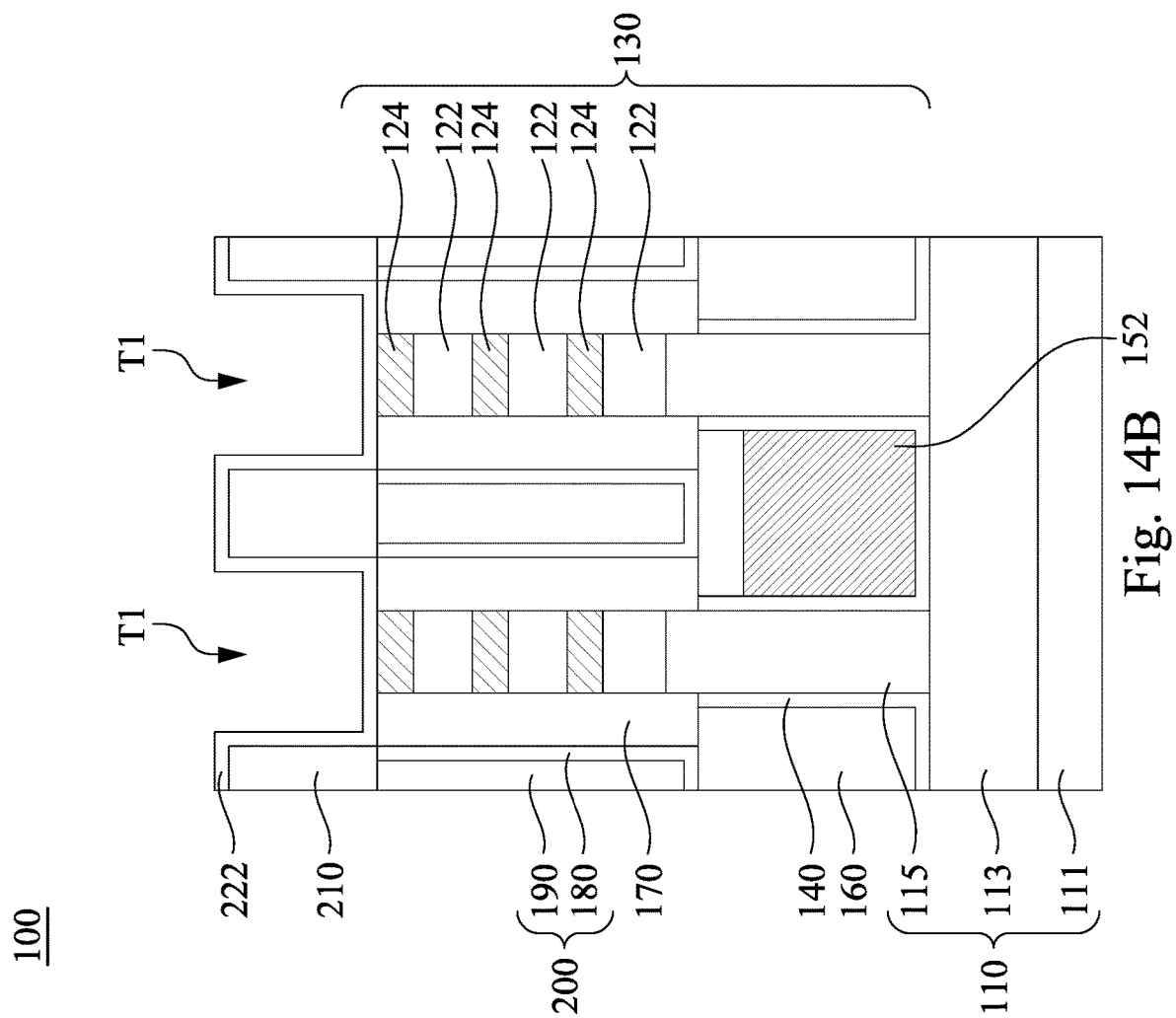

Next, the HM layer 910, the topmost sacrificial layer 122, and upper portions of the sacrificial epitaxial structures 170 are removed by using one or more etching processes, resulting in trenches T1 between corresponding dielectric caps 210. The resultant structure is illustrated in FIGS. 14A and 14B. In some embodiments, the nitride layer 914 of the HM layer 910 may be removed, for example, by a wet etching process using $H_3PO_4$ or other suitable etchants that selectively etches nitride at a faster etch rate than etching other materials. After the nitride layer 914 is removed, the oxide layer 912 can be removed by a wet etching process using diluted hydrofluoric acid (HF) or other suitable etchants that selectively etches oxide at a faster etch rate than etching other materials. After the oxide layer 912 is removed, the sacrificial epitaxial structures 170 and the topmost sacrificial layer 122 are then etched. In some embodiments where the sacrificial epitaxial structures 170 and topmost sacrificial layer 122 are formed of SiGe, they can be etched using a selective wet etching includes an APM etch (e.g., ammonia hydroxide-hydrogen peroxide-water mixture) that etches SiGe at a faster etch rate than it etches Si. In this way, the Si channel layers 124 can remain substantially intact after the sacrificial epitaxial structures 170 and topmost sacrificial layer 122 are removed.

After the sacrificial epitaxial structures 170 and the topmost sacrificial layer 122 are removed, a dummy gate dielectric layer 222 is then conformally deposited in the trenches T1 and over the dielectric caps 210. In some embodiments, the dummy gate dielectric layer 222 may include $SiO_2$, silicon nitride, a high-k dielectric material and/or other suitable material. In various examples, the dummy gate dielectric layer 222 may be deposited by a CVD process, a subatmospheric CVD (SACVD) process, a flowable CVD process, an ALD process, a PVD process, or other suitable process. By way of example, the dummy gate dielectric layer 222 may be used to prevent damages to the fins 130 by subsequent processes (e.g., subsequent formation of the dummy gate structures).

Figure 15A:
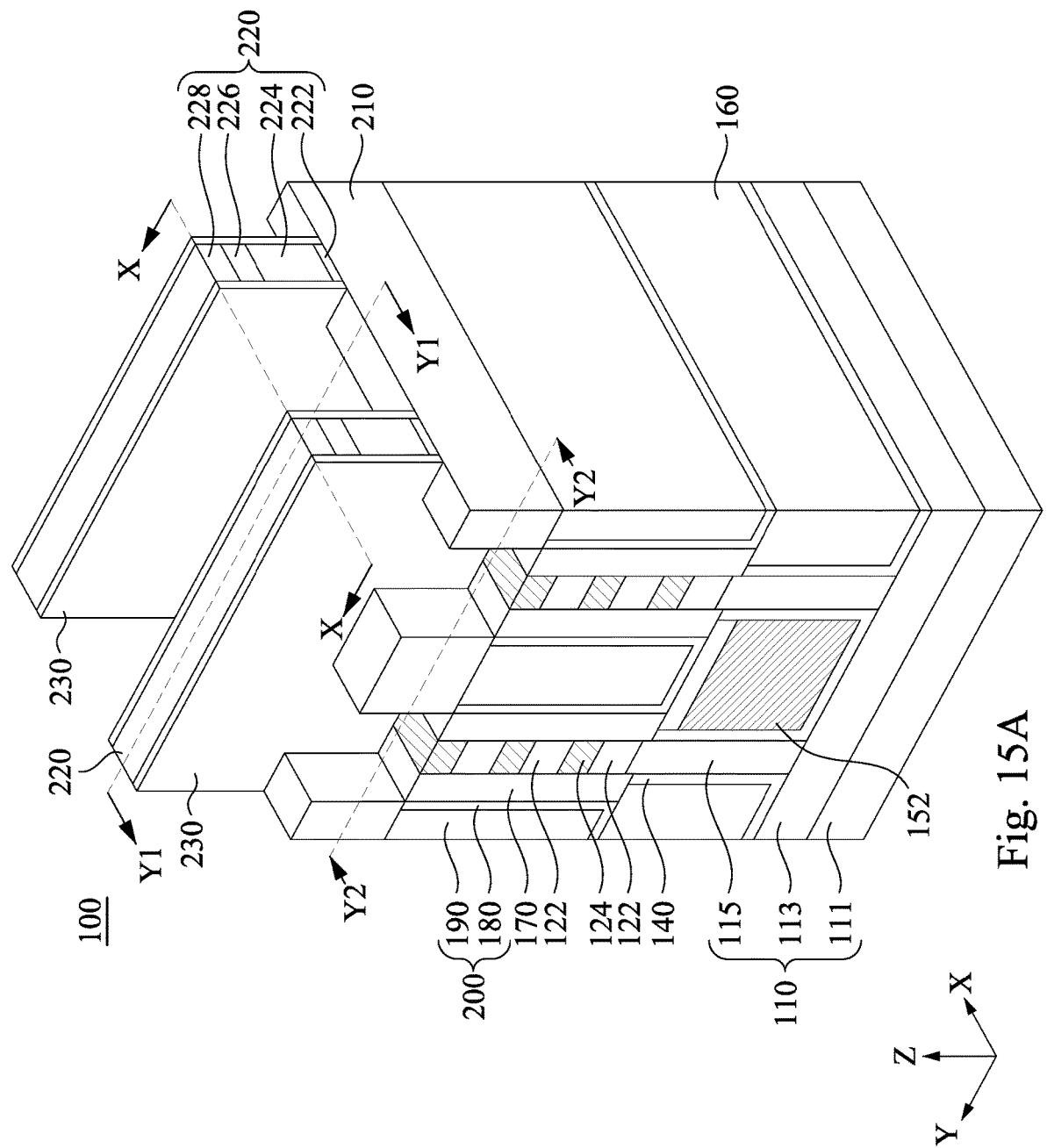

FIGS. 15A-15C illustrate a perspective view and two cross-sectional views of formation of dummy gate structures 220 in accordance with some embodiments of the present disclosure. In some embodiments, the dummy gate structures 220 each include a dummy gate electrode layer 224 and a hard mask that may include multiple layers 226 and 228 (e.g., an oxide layer 226 and a nitride layer 228). In some embodiments, the dummy gate structures 220 are formed by various process steps such as layer deposition, patterning, etching, as well as other suitable processing steps. Exemplary layer deposition processes include CVD (including both low-pressure CVD and plasma-enhanced CVD), PVD, ALD, thermal oxidation, e-beam evaporation, or other suitable deposition techniques, or combinations thereof. In forming the gate structures for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy gate electrode layer 224 may include polycrystalline silicon (polysilicon). In some embodiments, the hard mask includes an oxide layer 226 such as a pad oxide layer that may include $SiO_2$, and a nitride layer 228 such as a pad nitride layer that may include $Si_3N_4$ and/or silicon oxynitride. In some embodiments, after patterning the dummy gate electrode layer 224, exposed portions of the dummy gate dielectric layer 222 not covered under the patterned dummy gate electrode layer 224 are removed from source/drain regions of the fins 130. The etch process may include a wet etch, a dry etch, and/or a combination thereof. The etch process is chosen to selectively etch the dummy gate dielectric layer 222 without substantially etching the fins 130, the dummy gate electrode layer 224, the oxide layer 226 and the nitride layer 228.

FIGS. 15A-15C also illustrate formation of gate spacers 230 on sidewalls of the dummy gate structures 220. In some embodiments of formation of the gate spacers 230, a spacer material layer is first deposited over the substrate 110. The spacer material layer may be a conformal layer that is subsequently etched to form gate sidewall spacers 230 on sidewalls of the dummy gate structures 220. In the illustrated embodiment, a spacer material layer is disposed conformally on top and sidewalls of the dummy gate structures 220. The spacer material layer may include a dielectric material such as silicon oxide, silicon nitride, silicon oxynitride, SiCN films, silicon oxycarbide, SiOCN films, and/or combinations thereof. In some embodiments, the spacer material layer 230 includes multiple layers, such as a first spacer layer 232 and a second spacer layer 234 (illustrated in FIG. 15B) formed over the first spacer layer 232. By way of example, the spacer material layer may be formed by depositing a dielectric material over the gate structures 220 using processes such as, CVD process, a subatmospheric CVD (SACVD) process, a flowable CVD process, an ALD process, a PVD process, or other suitable process. An anisotropic etching process is then performed on the deposited spacer material layer to expose portions of the fins 130 not covered by the dummy gate structures 220 (e.g., in source/drain regions of the fins 130 denoted as "S" and "D"). Portions of the spacer material layer directly above the dummy gate structures 220 may be completely removed by this anisotropic etching process. Portions of the spacer material layer on sidewalls of the dummy gate structures 220 may remain, forming gate sidewall spacers, which are denoted as the gate spacers 230, for the sake of simplicity. It is noted that although the gate spacers 230 are multi-layer structures in the cross-sectional view of FIG. 15B, they are illustrated as single-layer structures in the perspective view of FIG. 15A for the sake of simplicity.

Figure 16:
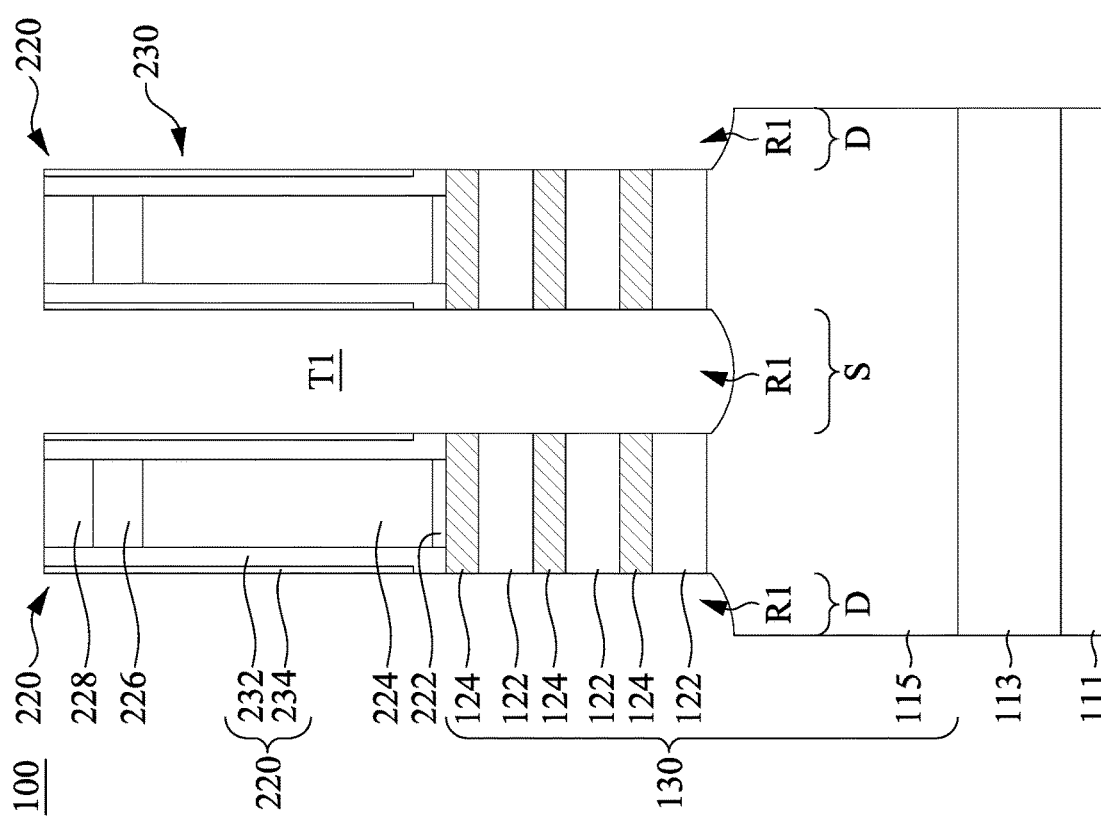

With reference to FIG. 16, exposed portions of the semiconductor fins 130 that extend laterally beyond the gate spacers 230 (e.g., in source/drain regions S/D of the fins 130) are etched by using, for example, an anisotropic etching process that uses the dummy gate structures 220 and the gate spacers 230 as an etch mask, resulting in recesses R1 into the semiconductor fins 130 and between corresponding dummy gate structures 220. After the anisotropic etching, end surfaces of the sacrificial layers 122 and channel layers 124 are substantially aligned with respective outermost sidewalls of the gate spacers 230, due to the anisotropic etching. In some embodiments, the anisotropic etching may be performed by a dry chemical etch with a plasma source and a reaction gas. The plasma source may be an inductively coupled plasma (ICR) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Figure 17:
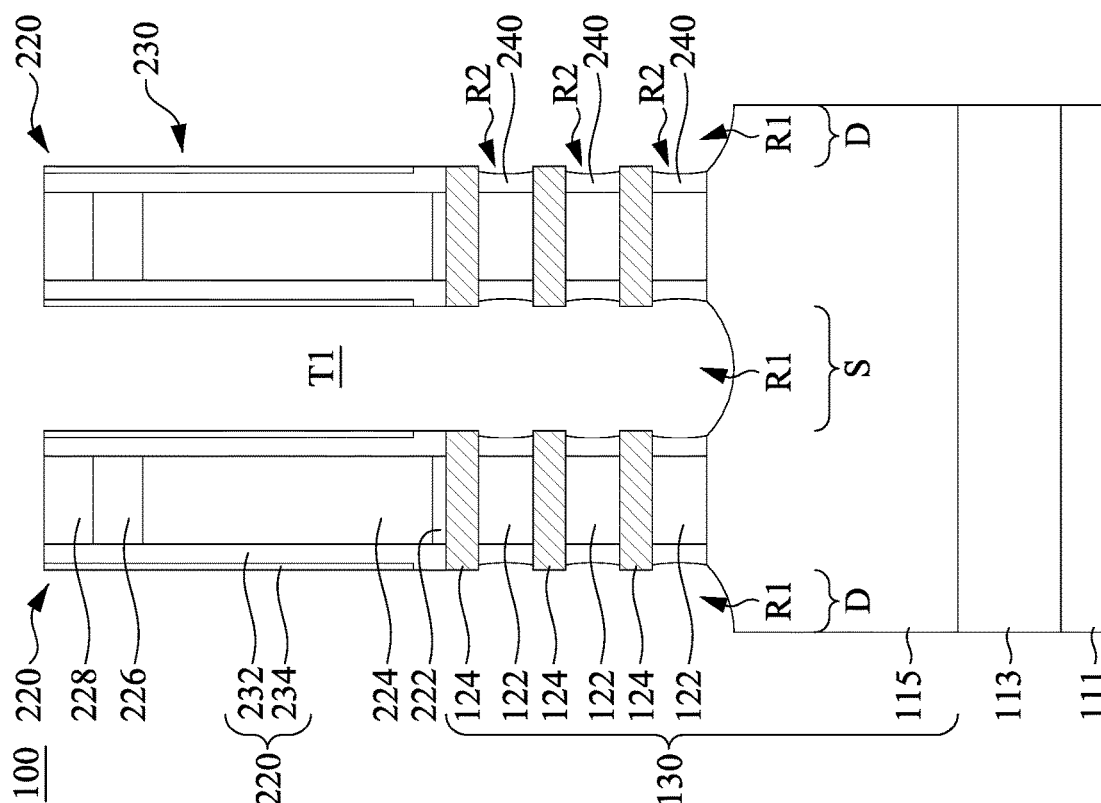

Next, referring to FIG. 17, the sacrificial layers 122 are laterally or horizontally recessed by using suitable etch techniques, resulting in lateral recesses each vertically between corresponding channel layers 124. This step may be performed by using a selective etching process. By way of example and not limitation, the sacrificial layers 122 are SiGe and the channel layers 124 are silicon allowing for the selective etching of the sacrificial layers 122. In some embodiments, the selective wet etching includes an APM etch (e.g., ammonia hydroxide-hydrogen peroxide-water mixture) that etches SiGe at a faster etch rate than it etches Si. In some embodiments, the selective etching includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 124 remain substantially intact during laterally recessing the sacrificial layers 122. As a result, the channel layers 124 laterally extend past opposite end surfaces of the sacrificial layers 122.

After the sacrificial layers 122 have been laterally recessed, an inner spacer material layer 240 is formed to fill the recesses R2 left by the lateral etching of the sacrificial layers 122. The inner spacer material layer 240 may be a low-k dielectric material (with dielectric constant lower than about 7), such as $SiO_2$, SiN, SiCN, or SiOCN, and may be formed by a suitable deposition method, such as ALD. After the deposition of the inner spacer material layer 240, an anisotropic etching process may be performed to trim the deposited inner spacer material 240, such that only portions of the deposited inner spacer material 240 that fill the recesses R2 left by the lateral etching of the sacrificial layers 122 are left. After the trimming process, the remaining portions of the deposited inner spacer material are denoted as inner spacers 240, for the sake of simplicity. The inner spacers 240 serve to isolate metal gates from source/drain epitaxial structures formed in subsequent processing. In the example of FIG. 17, sidewalls of the inner spacers 240 are laterally set back from sidewalls of the channel layers 124. In some other embodiments, sidewalls of the inner spacers 240 may be vertically aligned with sidewalls of the channel layers 124.

Figure 18A:
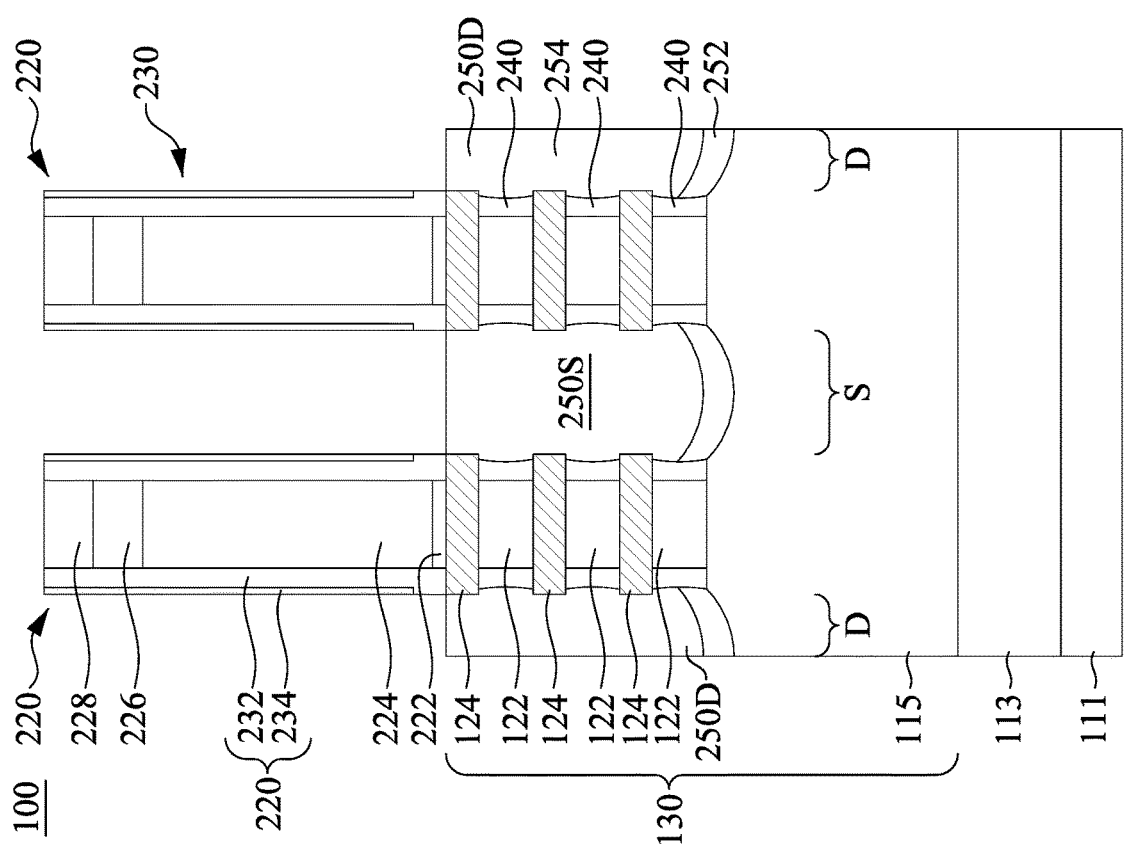
Figure 18C:
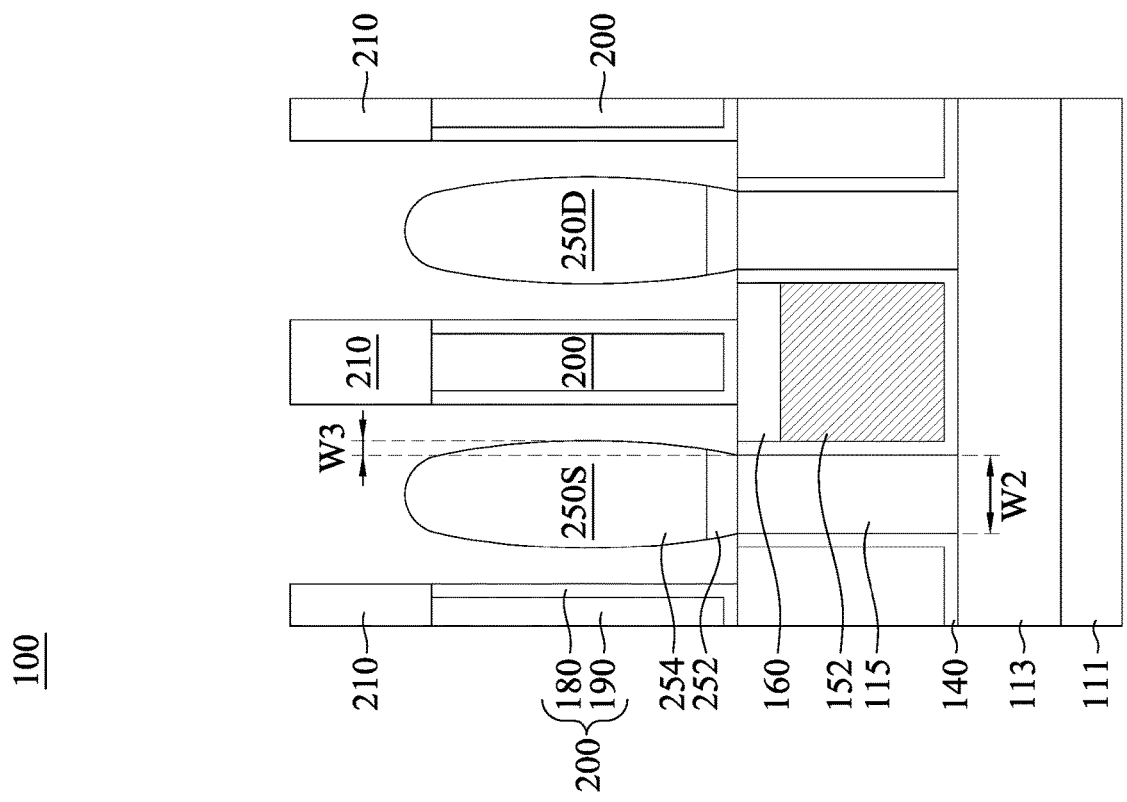
Figure 18B:
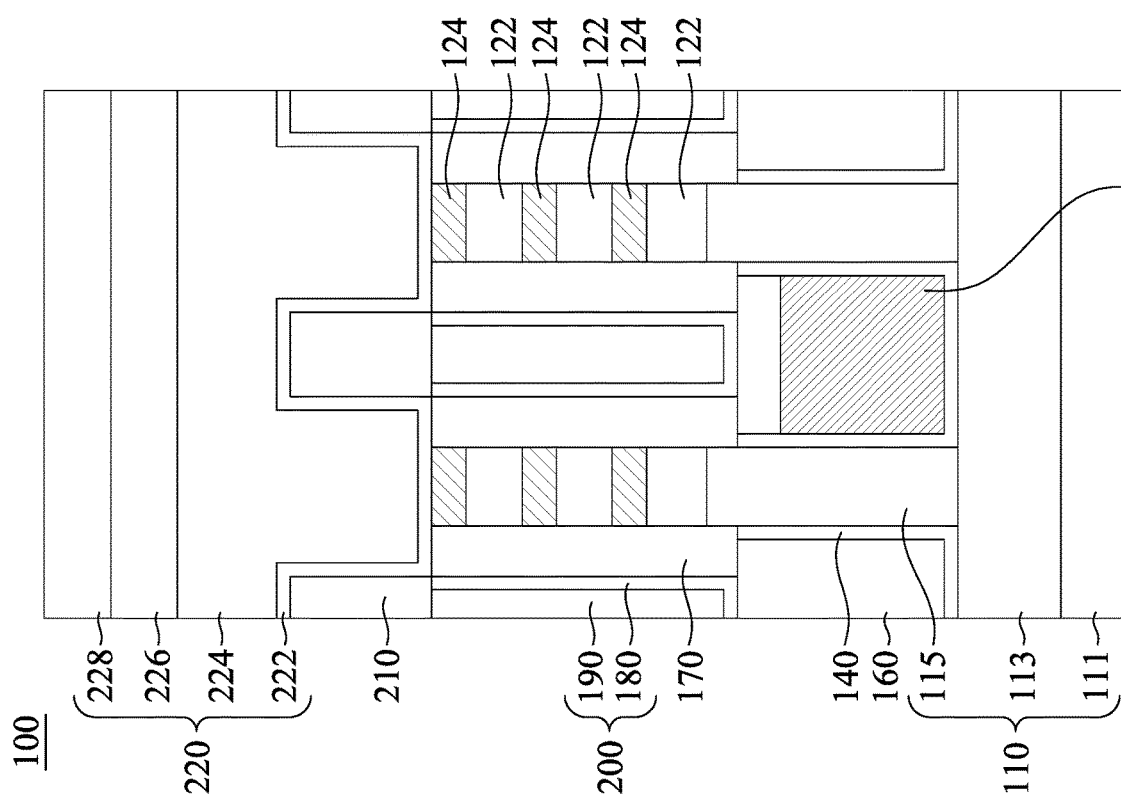

FIGS. 18A-18C illustrate cross-sectional views of formation of source/drain epitaxial structures 250S/250D in the recesses R1 in the fins 130. In greater detail, the source epitaxial structure 250S is formed in the recessed source region S of the fin 130, and drain epitaxial structure 250D is formed over the drain region D of the fin 130. The source/drain epitaxial structures 250S/250D may be formed by performing an epitaxial growth process that provides an epitaxial material on the fins 130. During the epitaxial growth process, the dummy gate structures 220 and gate sidewall spacers 230 limit the source/drain epitaxial structures 250S/250D to the source/drain regions S/D. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor materials of the fins 130 and the channel layers 124.

In some embodiments, the source/drain epitaxial structures 250S/250D may include Ge, Si, GaAs, AlGaAs, SiGe, GaAsP, SiP, or other suitable material. The source/drain epitaxial structures 250S/250D may be in-situ doped during the epitaxial process by introducing doping species including: p-type dopants, such as boron; n-type dopants, such as phosphorus or arsenic; and/or other suitable dopants including combinations thereof. If the source/drain epitaxial structures 250S/250D are not in-situ doped, an implantation process (i.e., a junction implant process) is performed to dope the source/drain epitaxial structures 250S/250D. In some exemplary embodiments, the source/drain epitaxial structures 250S/250D in an NFET device include SiP, while those in a PFET device include GeSnB and/or SiGeSnB.

In some embodiments, the source/drain epitaxial structures 250S/250D each include a first epitaxial layer 252 and a second epitaxial layer 254 over the first epitaxial layer 252. The first and second epitaxial layers 252 and 254 may be different at least in germanium atomic percentage (Ge %) or phosphorus concentration (P %). In some embodiments, the first epitaxial layer 252 may be not only grown from top surfaces of the fins 130, but also grown from end surfaces of the channel layers 124.

In some where the source/drain epitaxial structures 250S/250D include GeSnB and/or SiGeSnB for forming PFETs, the first and second epitaxial layers 252 and 254 are different at least in germanium atomic percentage (Ge %). In certain embodiments, the first SiGe layer 252 has a lower germanium atomic percentage than the second SiGe layer 194. Low germanium atomic percentage in the first SiGe layer 192 may help in reducing Schottky barrier with the un-doped Si in the fins 130. High germanium atomic percentage in the second SiGe layer 194 may help in reducing source/drain contact resistance. By way of example and not limitation, the germanium atomic percentage in the first SiGe layer 252 is in a range from about 10% to about 20%, and the germanium atomic percentage in the second SiGe layer 254 is in a range from about 20% to about 60%, but other ranges are within the scope of various embodiments of the present disclosure. In some embodiments, the second SiGe layer 254 may have a gradient germanium atomic percentage. For example, the germanium atomic percentage in the second SiGe layer 254 increases as a distance from the first SiGe layer 252 increases.

In some embodiments where the source/drain epitaxial structures 250S/250D include SiP for forming NFETs, the first and second SiP layers 252 and 254 are different at least in phosphorous concentration (P %). In certain embodiments, the first SiP layer 252 has a lower phosphorous concentration than the second SiP layer 254. Low phosphorous concentration in the first SiP layer 252 may help in reducing Schottky barrier with the un-doped Si in the fins 130. High phosphorous concentration in the second SiP layer 254 may help in reducing source/drain contact resistance. By way of example and not limitation, the phosphorous concentration in the first SiP layer 252 is in a range from about 5 E19 $cm^{-3}$ to about 1 E21 $cm^{-3}$, and the phosphorous concentration in the second SiP layer 254 is in a range from about 1 E21 cm$^{-3}$ to about 3 E21 cm$^{-3}$. In some embodiments, the second SiP layer 254 may have a gradient phosphorous concentration. For example, the phosphorous concentration in the second SiP layer 254 increases as a distance from the first SiP layer 252 increases.

Epitaxy conditions are controlled such that the source/drain epitaxial structures 250S/250D have a bar-shaped profile as illustrated in the cross-sectional view of FIG. 18C. Because of the bar-shaped profile, the source/drain epitaxial structures 250S/250D are spaced apart from the hybrid fins 200. In this way, subsequently formed source/drain contacts can be formed on not only top surfaces of the source/drain epitaxial structures 250S/250D but also sidewalls of the source/drain epitaxial structures 250S/250D, resulting in increased contact surface and hence reduced contact resistance. Moreover, the subsequently formed source contact can further extends along the sidewall of the source epitaxial structure 250S to the backside via rail 152 below a bottom surface of the source epitaxial structure 250S.

In some embodiments, the bar-shaped source/drain epitaxial structures 250S/250D (e.g., bar-shaped boron-doped SiGe) can be grown at a temperature in a range from about 400° C. to about 700° C., at a pressure in a range from about 5 torr to about 100 torr, using SiH$_4$, dichloro silane (DCS), SiH$_4$, and B$_2$H$_6$ as precursor gases, and HCl as an etching gas. If the epitaxial growth temperature and pressure are out of the selected ranges above, the source/drain epitaxial structures 250S/250D may have undesired profile (e.g., diamond shape with slant facets), which in turn may result in the source epitaxial structure 250S in contact with the hybrid fins 200, thus leading to increased challenge on forming a source contact from above the source epitaxial structure 250S to the backside via rail 152 below the source epitaxial structure 250S in subsequent processing.

In some embodiments, the bar-shaped source/drain epitaxial structures 250S/250D each have a bottom width W2 at it bottommost position, and the bottom width W2 of the bar-shaped source/drain epitaxial structures 250S/250D is in a range from about 6 nm to 40 nm. The bottom width W2 of the bar-shaped source/drain epitaxial structures 250S/250D is substantially the same as the width of the channel layers 124. If the width of the channel layers 124 is out of the range from about 6 nm to 40 nm, the GAA transistor may have unsatisfactorily large or small effective current. In some embodiments, the bar-shaped source/drain epitaxial structures 250S/250D each have a lateral growth width W3 in a range from about 2 nm to about 20 nm. If the lateral growth width W3 is excessively large, the source/drain epitaxial structures 250S/255D may touch the hybrid fins 200, leading to increased challenge on forming a source contact from above the source epitaxial structure 250S to the backside via rail 152 below the source epitaxial structure 250S in subsequent processing. As illustrated in FIG. 18C, the source/drain epitaxial structures 250S/205D have convex sidewalls and a convex top surface. However, the illustrated profile of the source/drain epitaxial structures 250S/250D is merely an example and not intended to be limiting. The source/drain epitaxial structures 250S/250D have other profiles in some other embodiments, as long as the source/drain epitaxial structures 250S/250D are spaced from the hybrid fins 200.

Figure 19A:
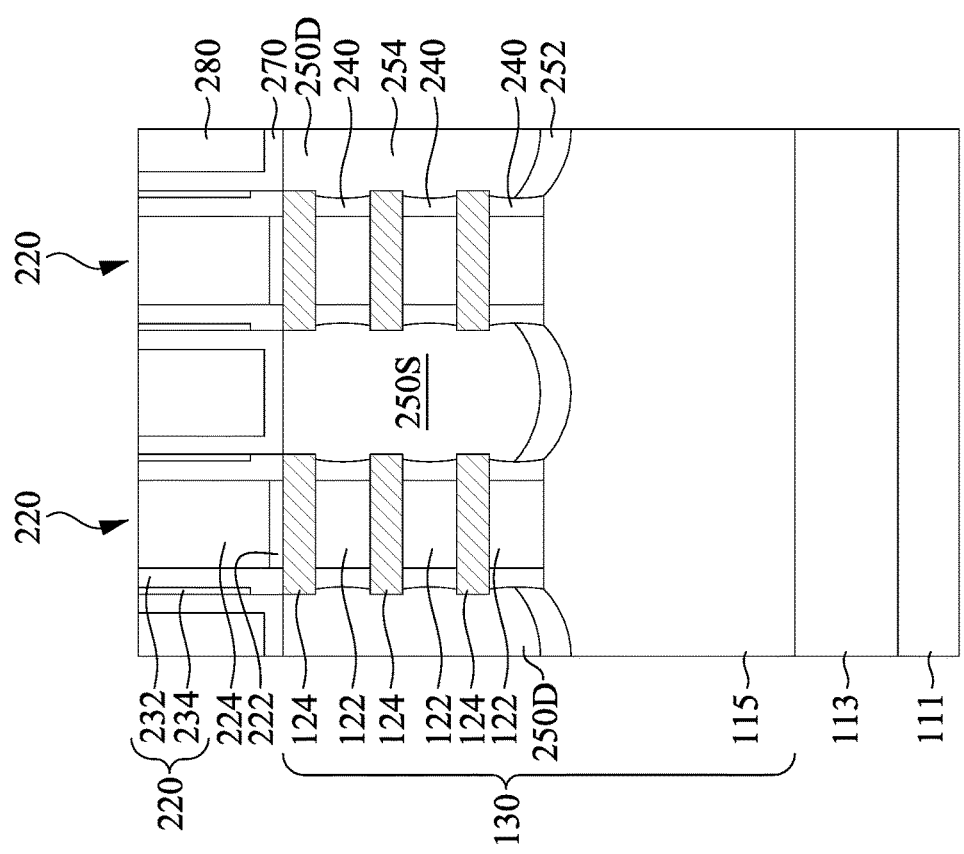
Figure 19C:
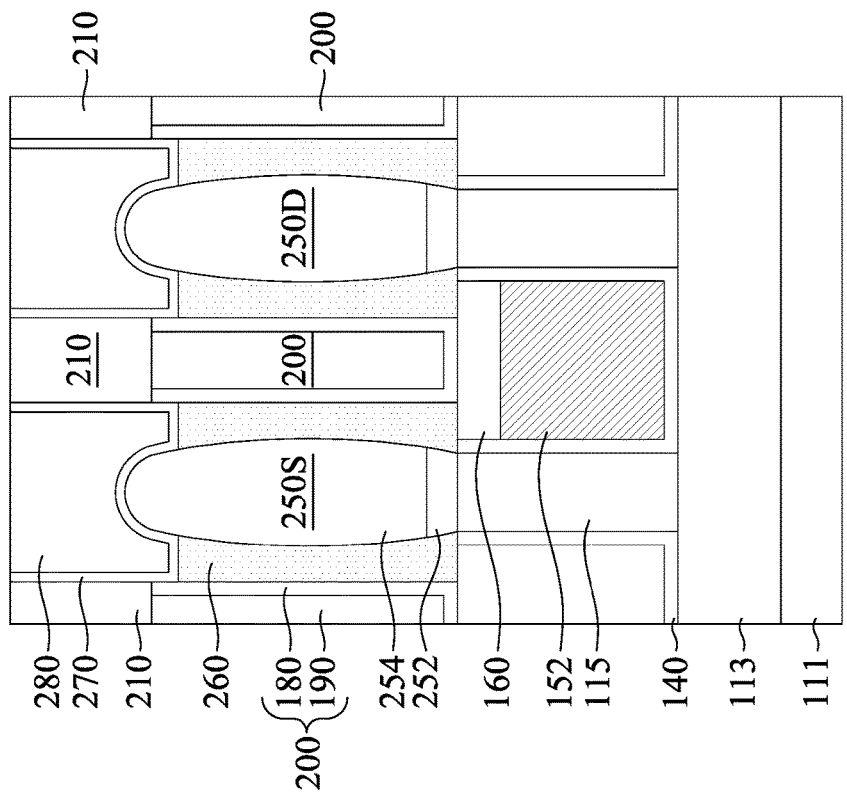
Figure 19B:
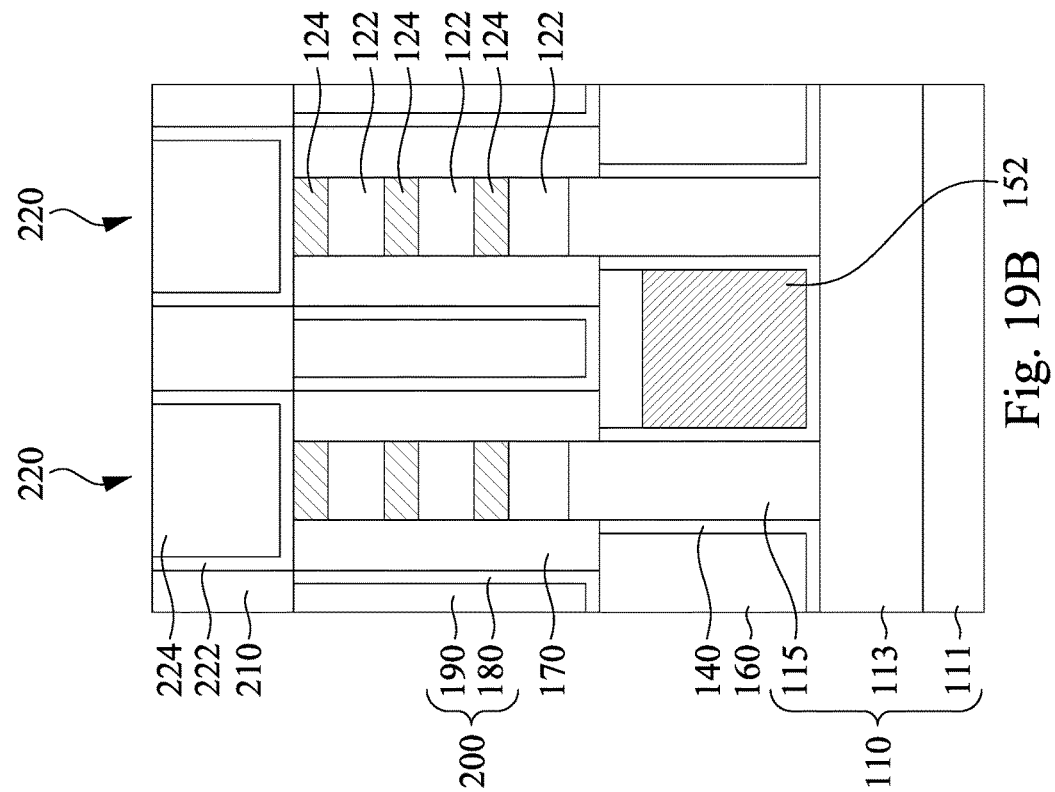

FIGS. 19A-19C illustrate cross-sectional views of a dielectric material 260, a contact etch stop layer (CESL) 270 and a front-side interlayer dielectric (ILD) layer 280 formed in sequence over the substrate 110. In some embodiments, the dielectric material 260 (illustrated in FIG. 19C) is first deposited over the substrate 110, filling the spaces between the source/drain epitaxial structures 250 and the hybrid fins 200 with the dielectric material 260. In some embodiments, the dielectric material 260 may include, for example, a low-k dielectric material (with dielectric constant lower than about 7) such as SiO$_2$, SiN, SiCN, SiOC, SiOCN, the like, or combinations thereof. In some embodiments, the dielectric material 260 includes a high-k dielectric material (with dielectric constant higher than about 7) such as HfO$_2$, ZrO$_2$, HfAlO$_x$, HfSiO$_x$ and AlO$_x$, the like or combinations thereof. The dielectric material 260 is recessed in an etch back process, providing the source/drain epitaxial structures 250S/250D having upper portions extending above the etched-back dielectric material 260. In some embodiments, the etch back process may include a dry etching process, a wet etching process, and/or a combination thereof. Etchant used in the etch back process is chosen to selectively etch the dielectric material 260 without substantially etching the source/drain epitaxial structures 250S/250D. The etch back depth is controlled (e.g., by controlling an etching time) so as to result in a target height of the protruding portions of the source/drain epitaxial structures 250S/250D. In the illustrated embodiment, the target height is selected such that the top surface of the dielectric material 260 is below top ends of the second epitaxial layers 254 in the source/drain epitaxial structures 250S/250D and above bottom ends of the second epitaxial layers 254. In some embodiments, the dielectric material 260 can be interchangeably referred to as a dummy material.

After the dielectric material 260 has been etched back, the CESL 270 is deposited over the substrate 110. In some examples, the CESL 270 includes a silicon nitride layer, silicon oxide layer, a silicon oxynitride layer, and/or other suitable materials having a different etch selectivity than the front-side ILD layer 280. The CESL 270 may be formed by plasma-enhanced chemical vapor deposition (PECVD) process and/or other suitable deposition or oxidation processes. The ILD layer 280 is then deposited over the CESL 270. The ILD layer 280 is referred to a "front-side" ILD layer in this context because it is formed on a front-side of the multi-gate transistors (i.e., a side of the multi-gate transistors where gates protrude from source/drain regions 250S/250D). In some embodiments, the front-side ILD layer 280 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 270. The front-side ILD layer 280 may be deposited by a PECVD process or other suitable deposition technique. In some embodiments, after formation of the front-side ILD layer 280, the integrated circuit structure 100 may be subject to a high thermal budget process to anneal the front-side ILD layer 280.

After depositing the front-side ILD layer 280, a planarization process may be performed to remove excessive materials of the front-side ILD layer 280. For example, a planarization process includes a chemical mechanical planarization (CMP) process which removes portions of the front-side ILD layer 280 and the CESL layer 270 overlying the dummy gate structures 220 and planarizes a top surface of the integrated circuit structure 100. In some embodiments, the CMP process also removes hard mask layers 226, 228 in the dummy gate structures 220 (as shown in FIGS. 18A and 18B) and exposes the dummy gate electrode layer 224. Moreover, as illustrated in FIGS. 18B and 19B, the CMP process is performed until the top surfaces of the dielectric caps 210 are exposed, thus breaking a single continuous dummy gate structure 220 into multiple dummy gate structures 220 separated by the dielectric caps 210. As a result, an additional gate cut process can be skipped.

Figure 20A:
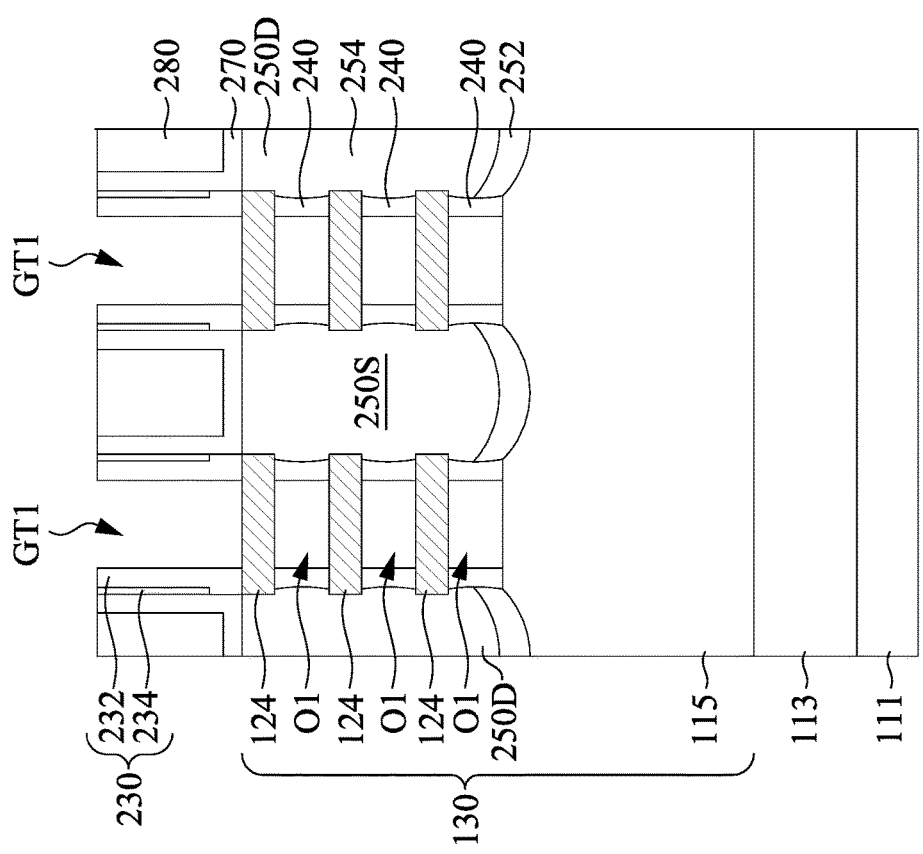

Next, the dummy gate structures 220 are removed, followed by removing the sacrificial layers 122. The resulting structure is illustrated in FIGS. 20A-20C. In the illustrated embodiments, the dummy gate structures 220 are removed by using a selective etching process (e.g., selective dry etching, selective wet etching, or a combination thereof) that etches the materials in dummy gate structures 220 at a faster etch rate than it etches other materials (e.g., gate sidewall spacers 230, CESL 270 and/or front-side ILD layer 280), thus resulting in gate trenches GT1 between corresponding gate sidewall spacers 230, with the sacrificial layers 122 and the sacrificial structures 170 exposed in the gate trenches GT1. Subsequently, the sacrificial layers 122 and the sacrificial structures 170 in the gate trenches GT1 are etched by using another selective etching process that etches the sacrificial layers 122 and the sacrificial structures 170 at a faster etch rate than it etches the channel layers 124, thus forming openings O1 between neighboring channel layers 124. In this way, the channel layers 124 become nanosheets suspended over the substrate 110 and between the source/drain epitaxial structures 250S/250D. This step is also called a channel release process. At this interim processing step, the openings O1 between nanosheets 124 may be filled with ambient environment conditions (e.g., air, nitrogen, etc). In some embodiments, the nanosheets 124 can be interchangeably referred to as nanowires, nanoslabs and nanorings, depending on their geometry. For example, in some other embodiments the channel layers 124 may be trimmed to have a substantial rounded shape (i.e., cylindrical) due to the selective etching process for completely removing the sacrificial layers 122. In that case, the resultant channel layers 124 can be called nanowires.

In some embodiments, the sacrificial layers 122 and the sacrificial structures 170 are removed by using a selective wet etching process. In some embodiments, the sacrificial layers 122 and the sacrificial structures 170 are SiGe and the channel layers 124 are silicon allowing for the selective removal of the sacrificial layers 122 and the sacrificial structures 170. In some embodiments, the selective wet etching includes an APM etch (e.g., ammonia hydroxide-hydrogen peroxide-water mixture). In some embodiments, the selective removal includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 124 may remain substantially intact during the channel release process. In some embodiments, both the channel release step and the previous step of laterally recessing sacrificial layers (i.e., the step as illustrated in FIG. 17) use a selective etching process that etches SiGe at a faster etch rate than etching Si, and therefore these two steps may use the same etchant chemistry in some embodiments. In this case, the etching time/duration of channel release step is longer than the etching time/duration of the previous step of laterally recessing sacrificial layers, so as to completely remove the sacrificial SiGe layers.

Figure 21A:
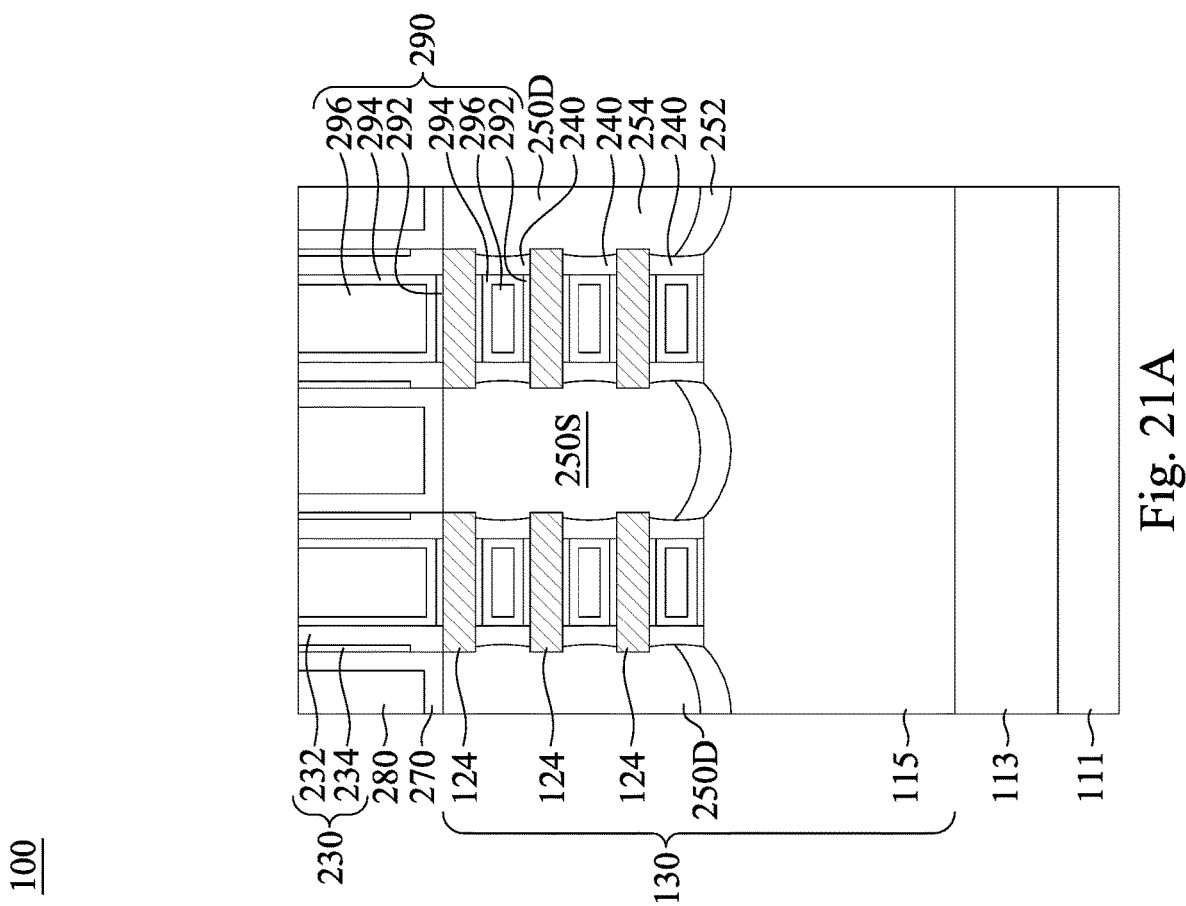

FIGS. 21A-21C illustrate cross-sectional views of formation of replacement gate structures 290. The replacement gate structures 290 are respectively formed in the gate trenches GT1 to surround each of the nanosheets 124 suspended in the gate trenches GT1. The gate structures 290 may be final gates of GAA FETs. The final gate structure may be a high-k/metal gate stack, however other compositions are possible. In some embodiments, each of the gate structures 290 forms the gate associated with the multi-channels provided by the plurality of nanosheets 124. For example, high-k/metal gate structures 290 are formed within the openings O1 (as illustrated in FIGS. 20A-20B) provided by the release of nanosheets 124. In various embodiments, the high-k/metal gate structure 290 includes a interfacial layer 292 formed around the nanosheets 124, a high-k gate dielectric layer 294 formed around the interfacial layer 292, and a gate metal layer 296 formed around the high-k gate dielectric layer 294 and filling a remainder of gate trenches GT1. Formation of the high-k/metal gate structures 290 may include one or more deposition processes to form various gate materials, followed by a CMP processes to remove excessive gate materials, resulting in the high-k/metal gate structures 290 having top surfaces level with a top surface of the front-side ILD layer 280. As illustrated in the cross-sectional view of FIG. 21B, the high-k/metal gate structure 290 surrounds each of the nanosheets 124, and thus is referred to as a gate of a GAA FET.

In some embodiments, the interfacial layer 292 is silicon oxide formed on exposed surfaces of semiconductor materials in the gate trenches GT1 by using, for example, thermal oxidation, chemical oxidation, wet oxidation or the like. As a result, surface portions of the nanosheets 124 and the semiconductor layer 115 exposed in the gate trenches GT1 are oxidized into silicon oxide to form interfacial layer 292.

In some embodiments, the high-k gate dielectric layer 294 includes dielectric materials such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), the like, or combinations thereof.

In some embodiments, the gate metal layer 296 includes one or more metal layers. For example, the gate metal layer 296 may include one or more work function metal layers stacked one over another and a fill metal filling up a remainder of gate trenches GT1. The one or more work function metal layers in the gate metal layer 296 provide a suitable work function for the high-k/metal gate structures 290. For an n-type GAA FET, the gate metal layer 296 may include one or more n-type work function metal (N-metal) layers. The n-type work function metal may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type GAA FET, the gate metal layer 296 may include one or more p-type work function metal (P-metal) layers. The p-type work function metal may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the fill metal in the gate metal layer 296 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 22A:
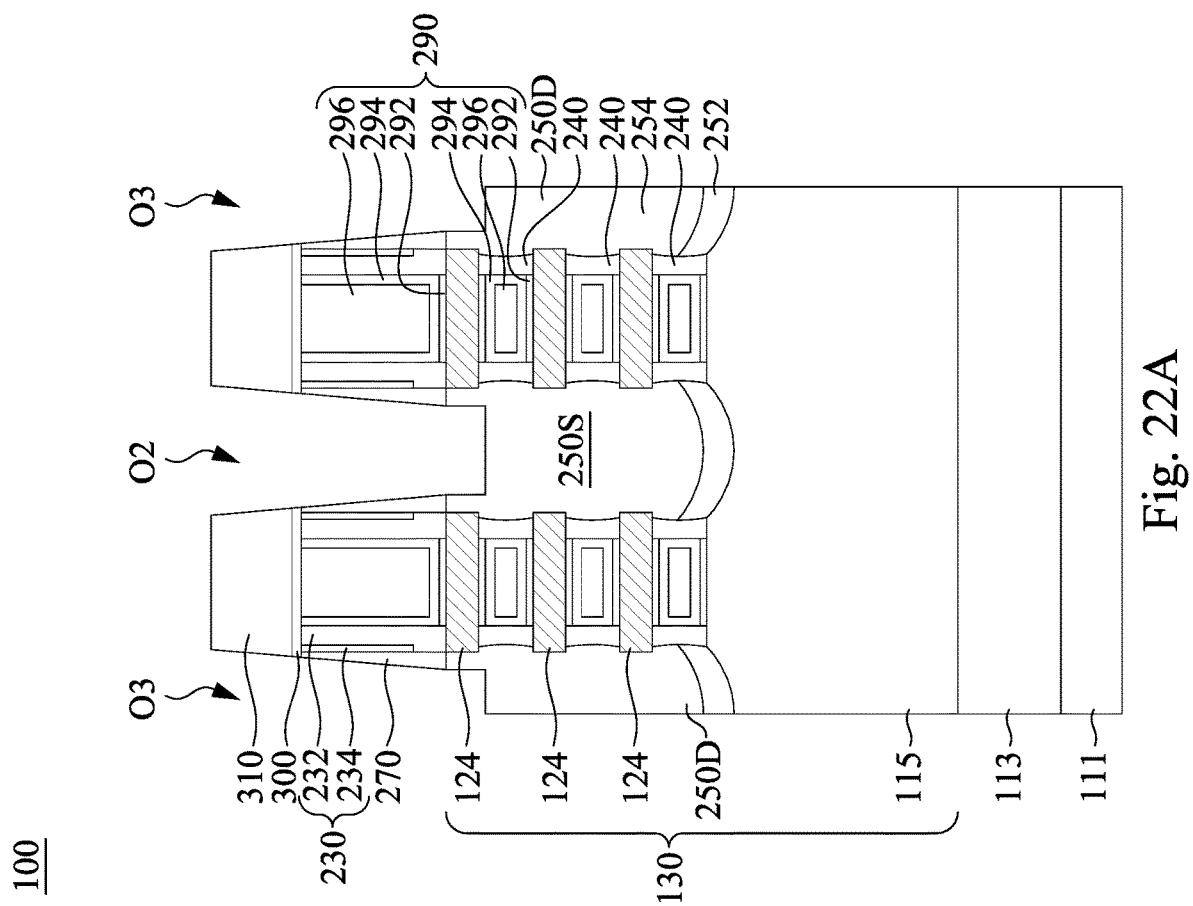

FIGS. 22A-22C illustrate cross-sectional views of formations of another CESL 300, another front-side ILD layer 310 over the CESL 300, and source/drain contact openings O2/O3 that extends through the front-side ILD layer 310, the CESL 300, the front-side ILD layer 280 and the CESL 270 to the source/drain epitaxial structures 250S/250D. The CESL 300 may be formed of a similar material to the CESL 270 by using similar deposition techniques to the CESL 270 as discussed previously, and thus are not described again for the sake of brevity. The front-side ILD layer 310 may be formed of a similar material to the front-side ILD layer 280 by using similar deposition techniques to the front-side ILD layer 280 as discussed previously, and thus are not described again for the sake of brevity.

The source/drain contact openings O2/O3 are formed using one or more etching processes to etch through the front-side ILD layers 280, 310 and the etch stop layers 300 and 270. In the depicted embodiment, the etching process used to form the source/drain contact openings O2/O3 further etches the protruding portions of the source/drain epitaxial structures 250S/250D that protrude above the dielectric material 260. In some embodiments, the etching process selectively etches the source/drain epitaxial structures 250S/250D at a faster etch rate than it etches the dielectric material 260 without substantially etching the dielectric material 260. Therefore, the dielectric material 260 protect lower portions of the source/drain epitaxial structures 250S/250D against the etching process.

Figure 23A:
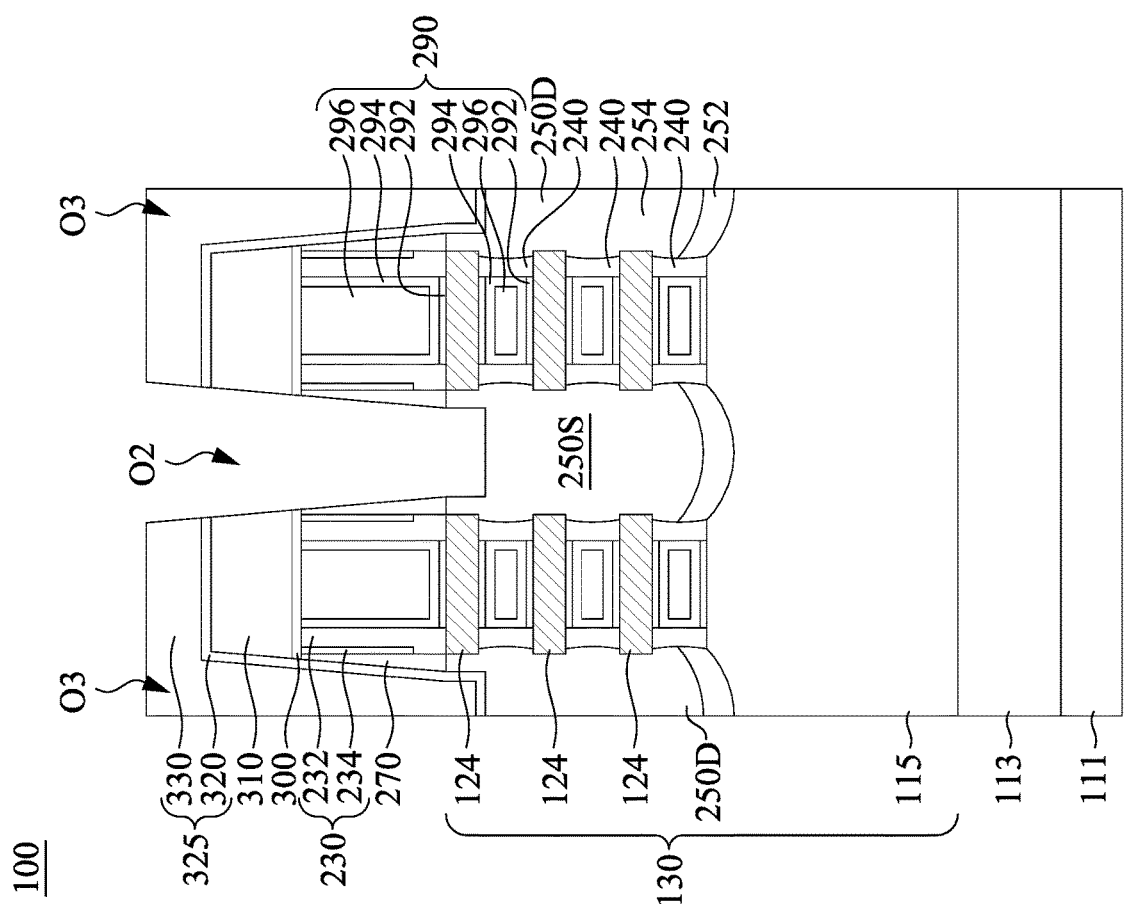

FIGS. 23A-23C illustrate cross-sectional views of formation of a patterned mask 325 over the front-side ILD layer 310. The patterned mask 325 temporarily fills the drain contact opening O3 and thus covers the drain epitaxial structure 250D. On the other hand, the patterned mask 325 does not fill the source contact opening O2 and thus exposes a portion of the dielectric material 260 directly above the backside via rail 152. In the illustrated embodiment, the patterned mask 325 also exposes a portion of the source epitaxial structure 250S. In some embodiments, the patterned mask 325 includes a first mask layer 320 and a second mask layer 330 over the first mask layer. The first mask layer 320 is, for example, a nitride mask formed by suitable deposition processes followed by suitable patterning processes. The second mask layer 330 is, for example, a photoresist mask formed by suitable photolithography processes. By way of example and not limitation, formation of the patterned mask 325 includes blanket depositing a nitride layer over the structure as illustrated in FIG. 22A-22C, spin-on coating a photoresist layer over the nitride layer, performing post-exposure bake processes, and developing the photoresist layer to form the photoresist mask 330. In some embodiments, patterning the resist to form the patterned mask element may be performed using an electron beam (e-beam) lithography process or an extreme ultraviolet (EUV) lithography process. After forming the photoresist mask 330, the nitride layer 320 is patterned by using the photoresist mask 330 as an etch mask, thus resulting in the nitride mask 320.

Figure 24A:
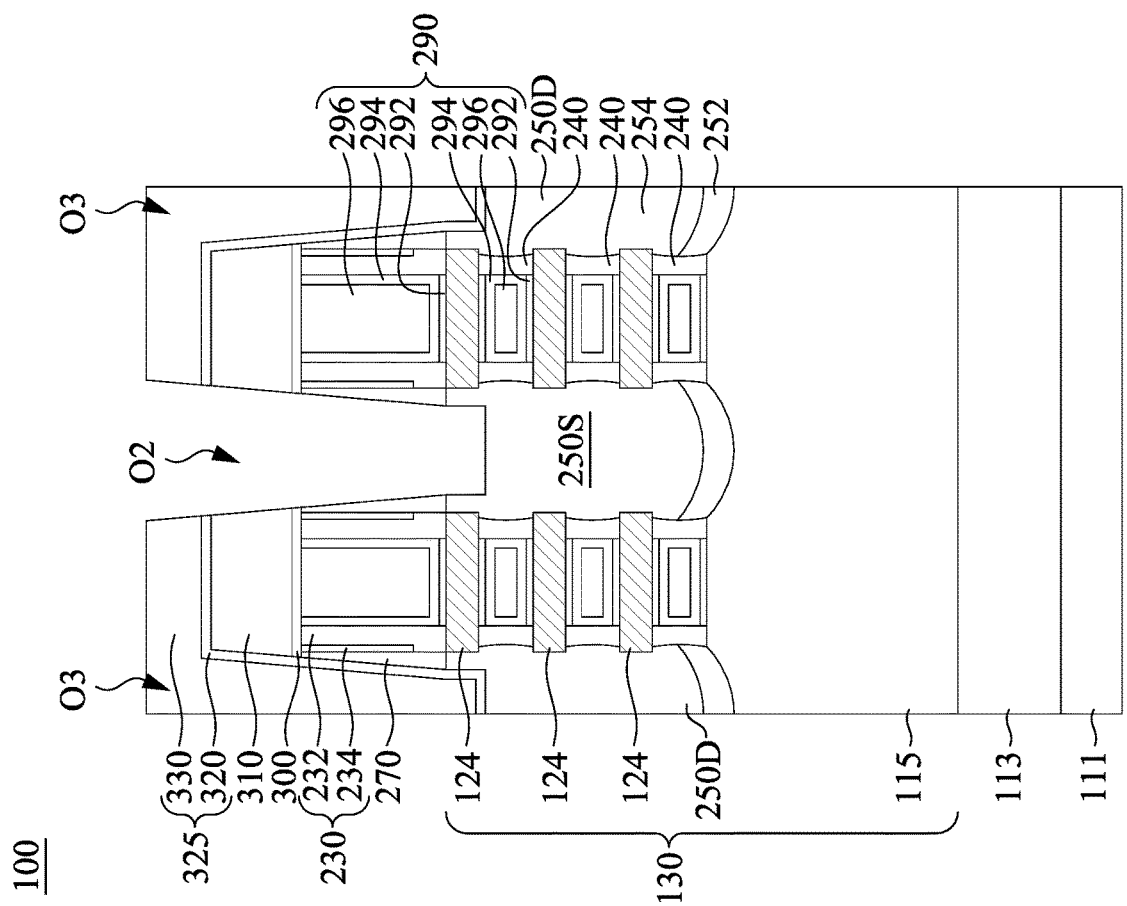
Figure 24C:
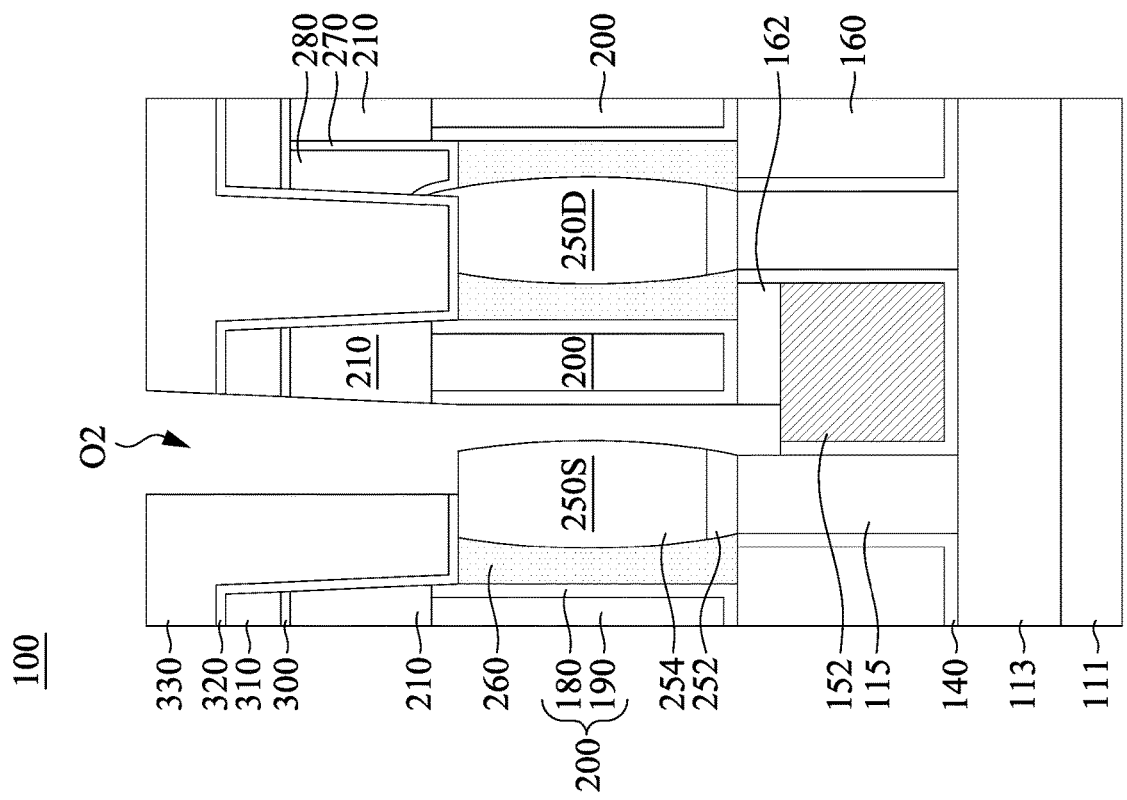
Figure 24B:
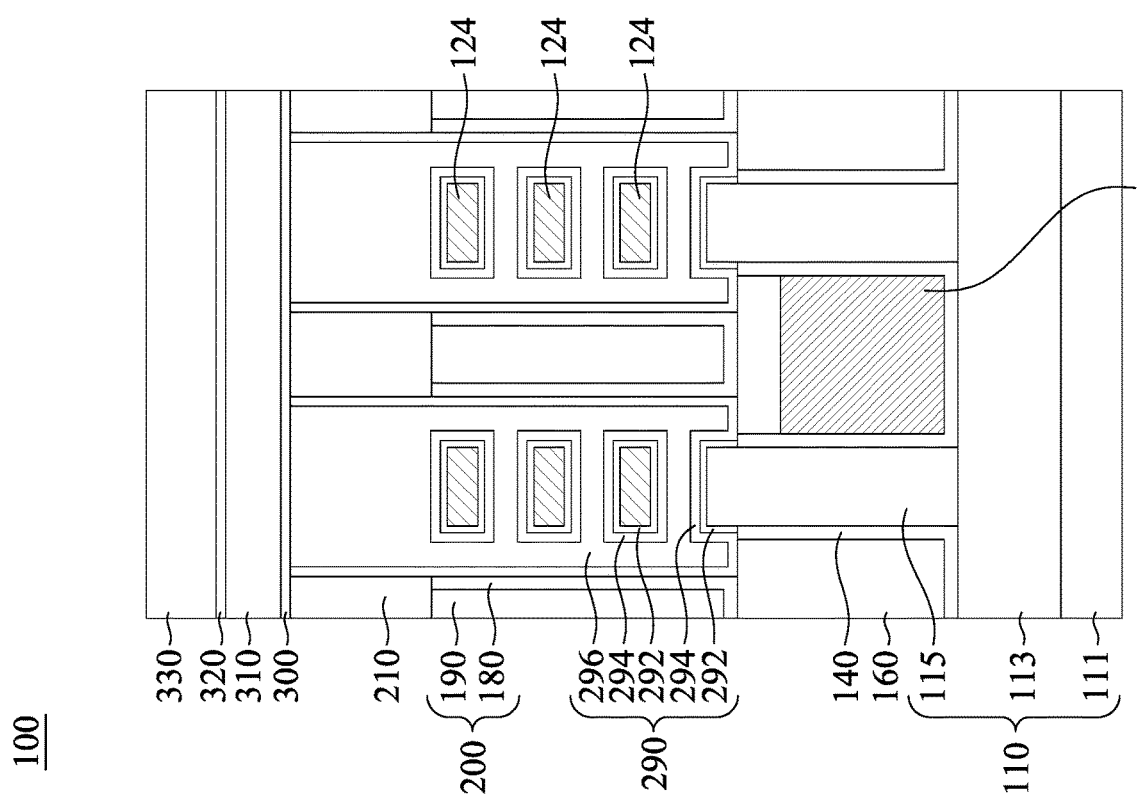
Figure 25A:
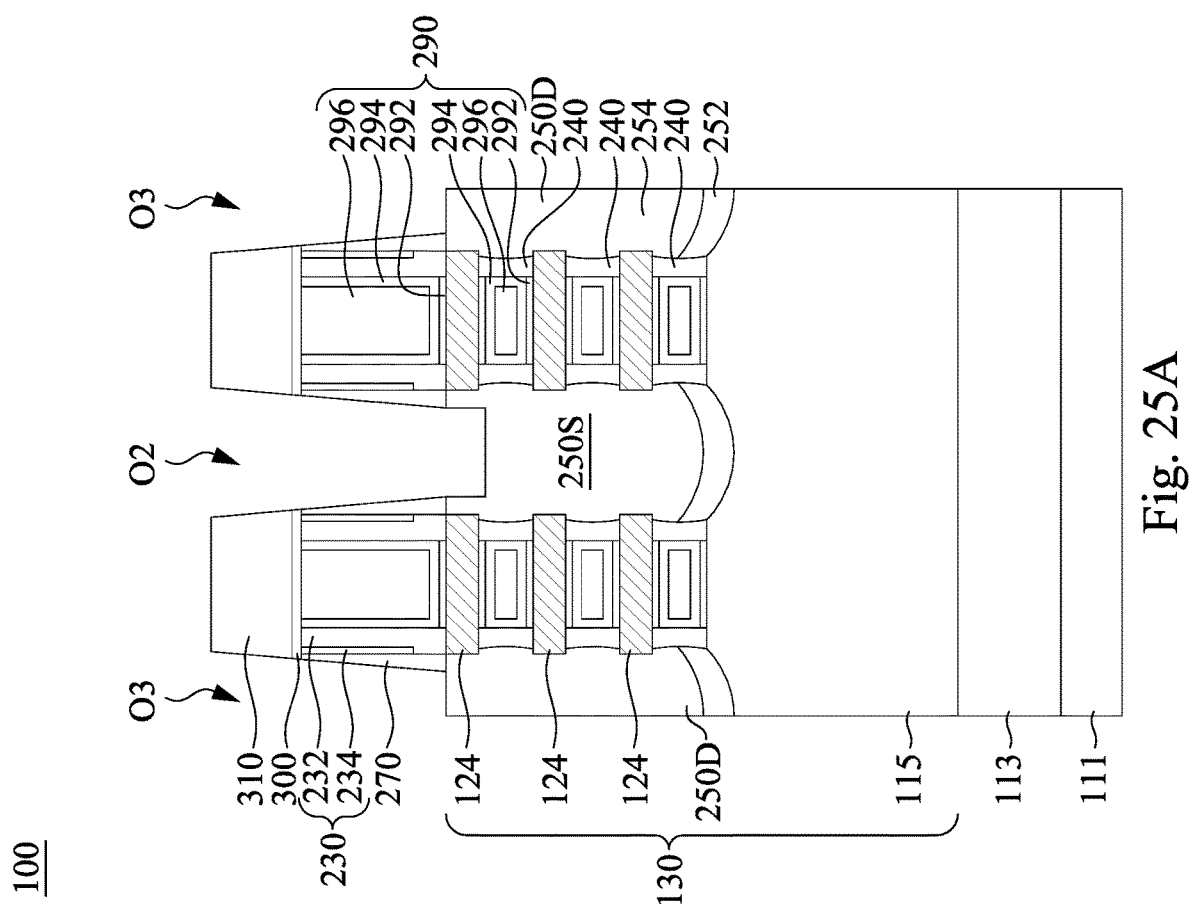
Figures 25B, 25C:
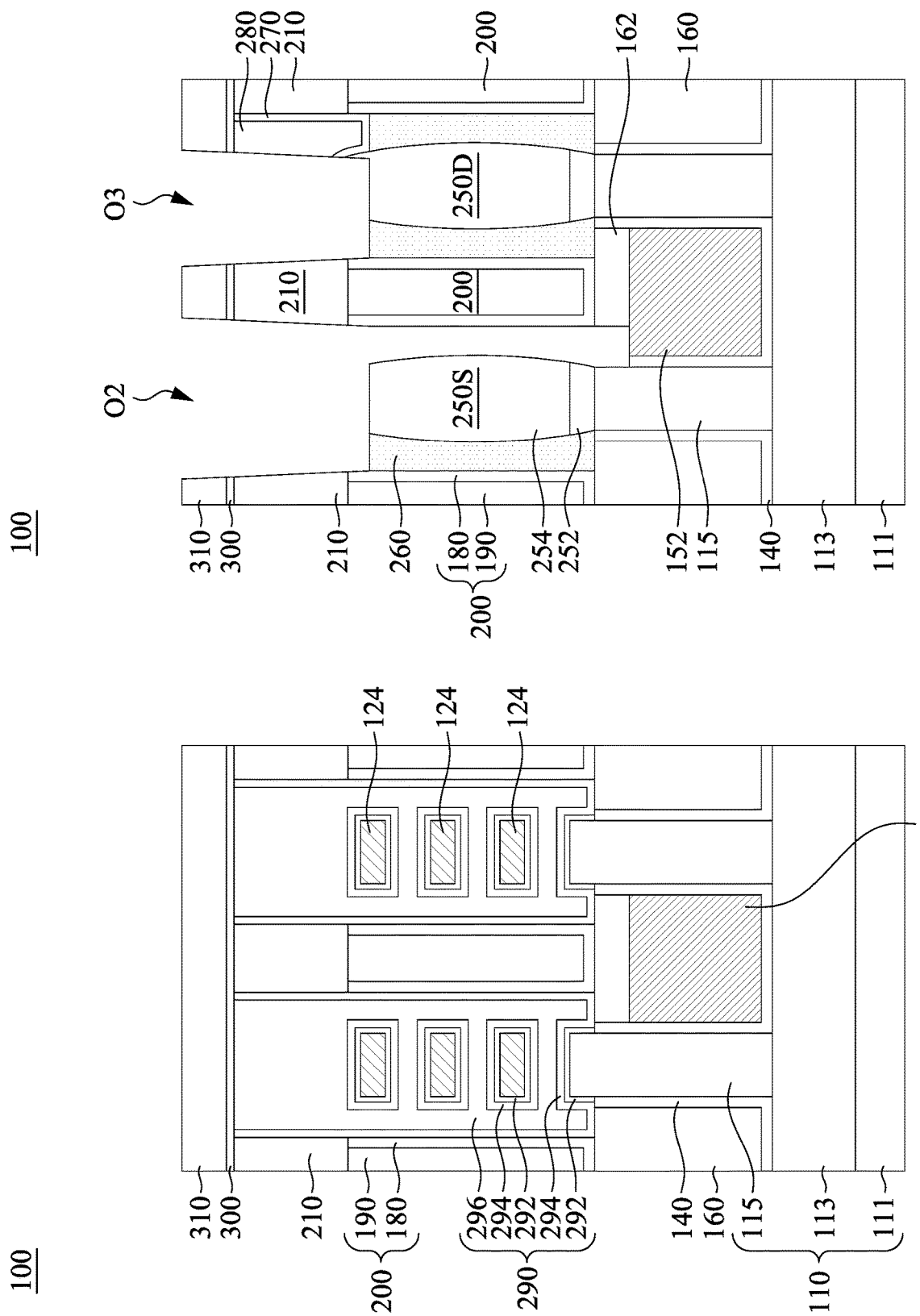

After the patterned mask 325 is formed, the exposed dielectric material 260 is removed by an etching process using the patterned mask 325 as an etch mask, as illustrated in FIGS. 23A-23C. The etching process is chosen to selectively etch the dielectric material 260 without substantially etching the source epitaxial structure 250S. As a result, the source epitaxial structure 250S remains substantially unchanged through the selective etching process. The selective etching process results in a portion 162 of the STI structure 160 atop the backside via rail 152 being exposed at the bottom of the source contact opening O2. The STI portion 162 is interchangeably referred to as a dielectric cap 162 for protecting the backside via rail 152. The exposed portion of the STI structure 160 is then etched until the backside via rail 152 is exposed. The resulting structure is illustrated in FIGS. 24A-24C. In some embodiments where the STI structure 160 is oxide, this step is also called an oxide breakthrough step. After the oxide breakthrough step is completed, the patterned mask 325 is removed from the source/drain contact openings O2/O3. The resulting structure is illustrated in FIGS. 25A-25C. In some embodiments where the second mask layer 330 is photoresist, it can be removed by, for example, ashing. In some embodiments where the first mask layer 320 is nitride, it can be removed by for example, by a wet etching process using $H_3PO_4$.

Figure 26A:
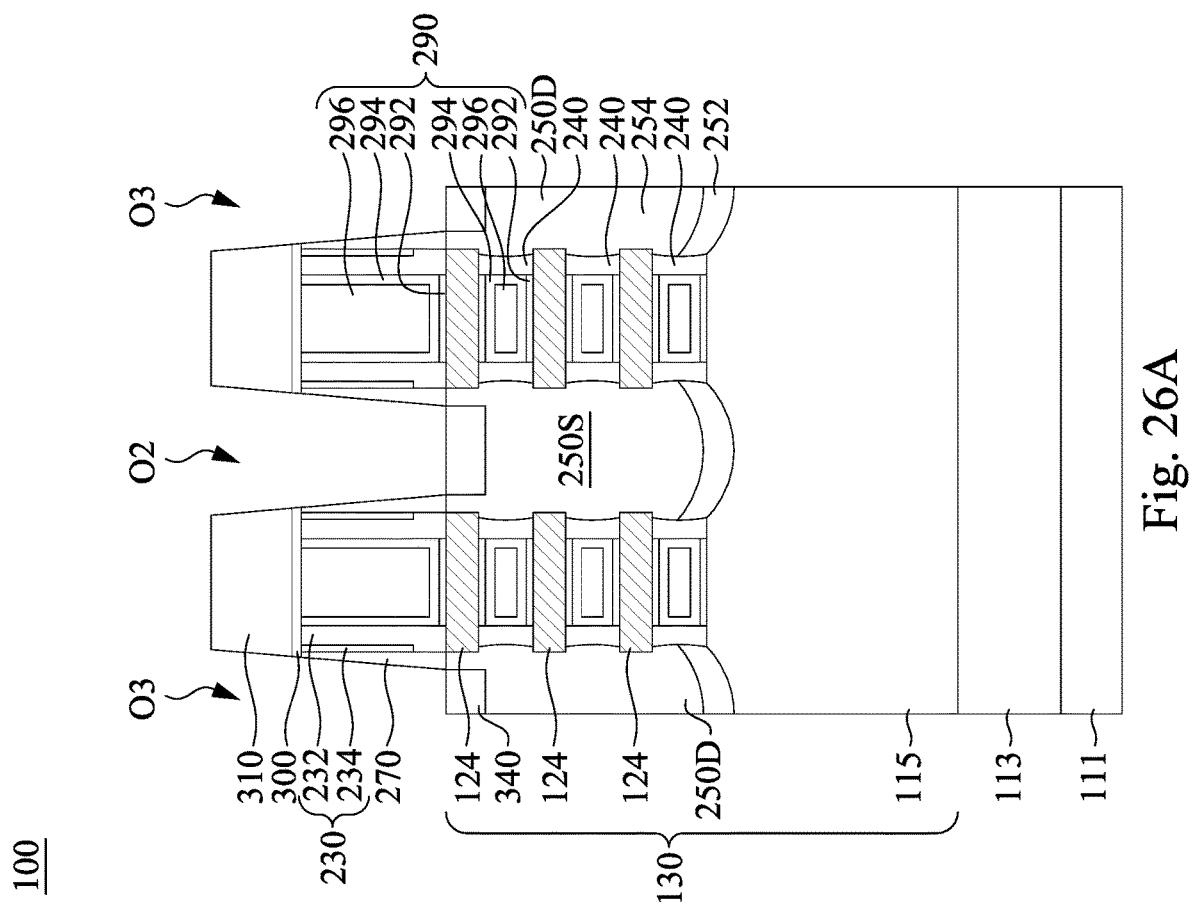

Reference is then made to cross-sectional views of FIGS. 26A-26C. The dielectric material 260 exposed by the source/drain contact openings O2/O3 is removed by using a selective etching process that etches the dielectric material 260 without substantially etching other materials (e.g., source/drain epitaxial structures 250S/250D) in the source/drain contact openings O2/O3. Next, metal silicide regions 340 are formed on exposed surfaces of the source/drain epitaxial structures 250S/250D by using a silicidation process. Silicidation may be formed by blanket depositing a metal layer over the exposed source/drain epitaxial structures 250S/250D, annealing the metal layer such that the metal layer reacts with silicon (and germanium if present) in the source/drain epitaxial structures 250S/250D to form the metal silicide regions 340, and thereafter removing the non-reacted metal layer. In some embodiments, the silicidation process is performed at a temperature higher than about 400° C. or even higher than 600° C., which can help in reducing the contact resistance between the silicide regions 340 and the subsequently formed source/drain contacts. In some embodiments, the metal layer used in the silicidation process includes nickel, cobalt, titanium, tantalum, platinum, tungsten, other noble metals, other refractory metals, rare earth metals or their alloys, and the metal layer has a thickness in a range, for example, from about 1 nm to about 10 nm.

In some embodiments, as illustrated in FIG. 26C, the top silicide 340t is thicker than the sidewall silicide 340s in each silicide region 340. This is because that in the silicidation process the metal deposition deposits a metal layer that may be thicker over top surfaces of the source/drain epitaxial structures 250S/250D than over sidewalls of the source/drain epitaxial structures 250S/250D. As a result, after the annealing in the silicidation process is completed, the top silicide 340t is thicker than the sidewall silicide 340s. However, in some other embodiments, the top silicide 340t may have the same thickness as the sidewall silicide 340s as well. In some embodiments, the silicide region 340 has a thickness in a range, for example, from about 1.5 nm to about 8.0 nm. In some embodiments, the thickness ratio of the top silicide 340t to the sidewall silicide 340 is in a range from about 1:1 to about 5:1.

In the embodiment depicted in FIG. 26C, the sidewall silicide 340s is spaced apart from the neighboring hybrid fin 200 by a minimal distance S3 in a range, for example, from about 4 nm to about 20 nm. Excessively small minimal distance S3 may lead to increased challenge on a subsequent deposition process of forming a source contact in the source contact opening O2. For example, if the minimal distance S3 between the sidewall silicide 340s and the hybrid fin 200 is excessively small, the subsequently formed source contact may have unfilled voids between the sidewall silicide 340s and the hybrid fin 200. On the other hand, excessively large minimal distance S3 may lead to unsatisfactory cell height of standard cells formed in the integrated circuit structure 100. Moreover, a vertical distance S4 measured from the top surface of the top silicide 340t to the top surface of the backside via rail 152 is in a range, for example, from about 32 nm to about 80 nm. Excessively large vertical distance S4 may lead to increased challenge on a subsequent deposition process of forming a source contact in the source contact opening O2. For example, if the vertical distance S4 between the top silicide 340t and the backside via rail 152 is excessively large, the subsequently formed source contact may have unfilled voids between the sidewall silicide 340s and the hybrid fin 200. On the other hand, excessively small vertical distance S4 between the top silicide 340t and the backside via rail 152 may lead to reduced contact area between the silicide region 340 and the subsequently formed source contact, thus leading to increased contact resistance.

In some embodiments as illustrated in FIG. 26C, the silicide region 340 wraps around a top surface and opposite sidewalls of the source epitaxial structure 250S. On the other hand, the silicide region 340 is on a top surface and a first sidewall of the drain epitaxial structure 250D, and a portion of the dielectric material 260 remains on a second sidewall of the drain epitaxial structure 250D, and thus the silicide region is absent from the second sidewall of the drain epitaxial structure 250D.

Figure 27A:
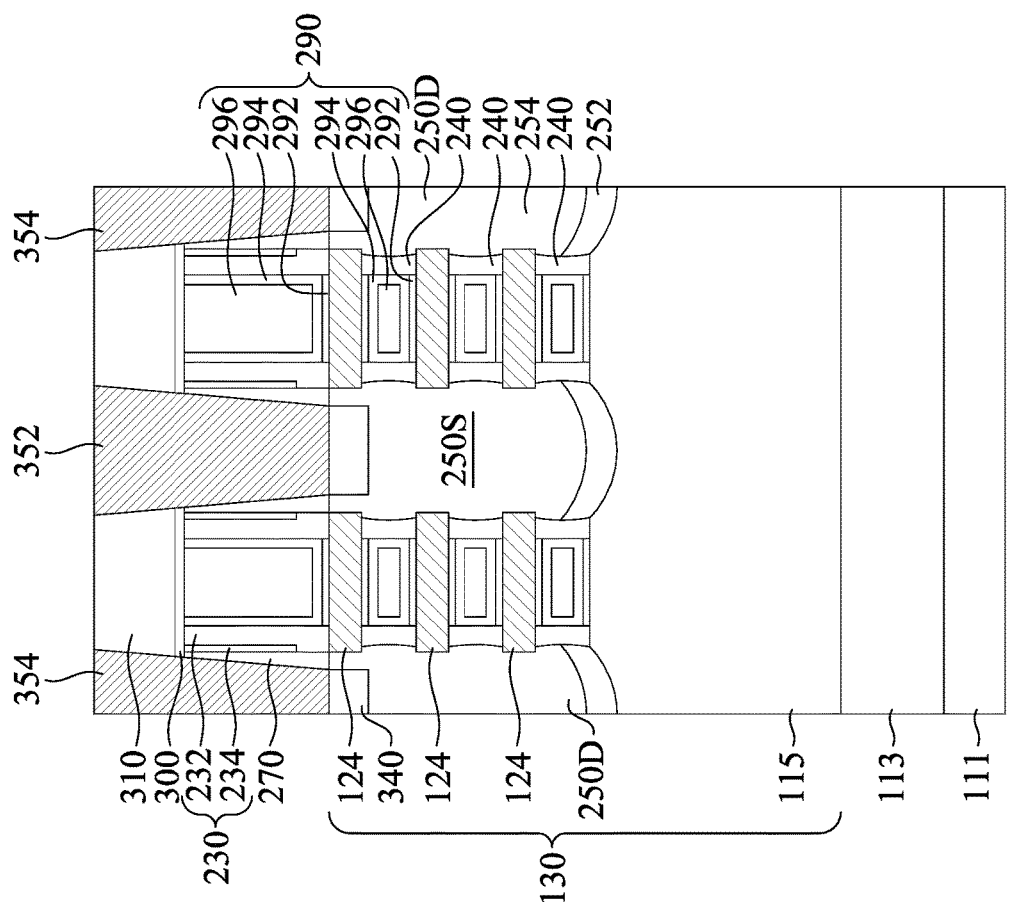

FIGS. 27A-27C illustrate cross-sectional views of formation of a source contact 352 over the source epitaxial structure 250S and a drain contact 354 over the drain epitaxial structure 250D. In some embodiments, the source/drain contact formation step deposits one or more metal materials (e.g., W, Ru, Co, Cu, Ti, TiN, Ta, TaN, Mo, Ni, the like or combinations thereof) to fill the source/drain contact openings O2/O3 (illustrated in FIGS. 26A-26C) by using suitable deposition techniques (e.g., CVD, PVD, ALD, the like or combinations thereof), followed by a CMP process to remove excess metal materials outside the source/drain contact openings, while leaving metal materials in the source/drain contact openings O2/O3 to serve as the source/drain contacts 352 and 354. In some embodiments, the source/drain contacts 352 and 354 each have a height in a range from about 1 nm to about 50 nm, but other ranges are within the scope of various embodiments of the present disclosure.

As illustrated in FIG. 27C, the source contact 352 wraps around three sides of the silicide region 340 and further extends through the dielectric cap 162 to the backside via rail 152. In this way, the backside via rail 152 is electrically coupled to the source epitaxial structure 250S. On the other hand, the drain contact 354 is spaced apart from the backside via rail 152 by the dielectric cap 162, and thus the backside via rail 152 is electrically insulated from the drain epitaxial structure 250D.

Figure 28A:
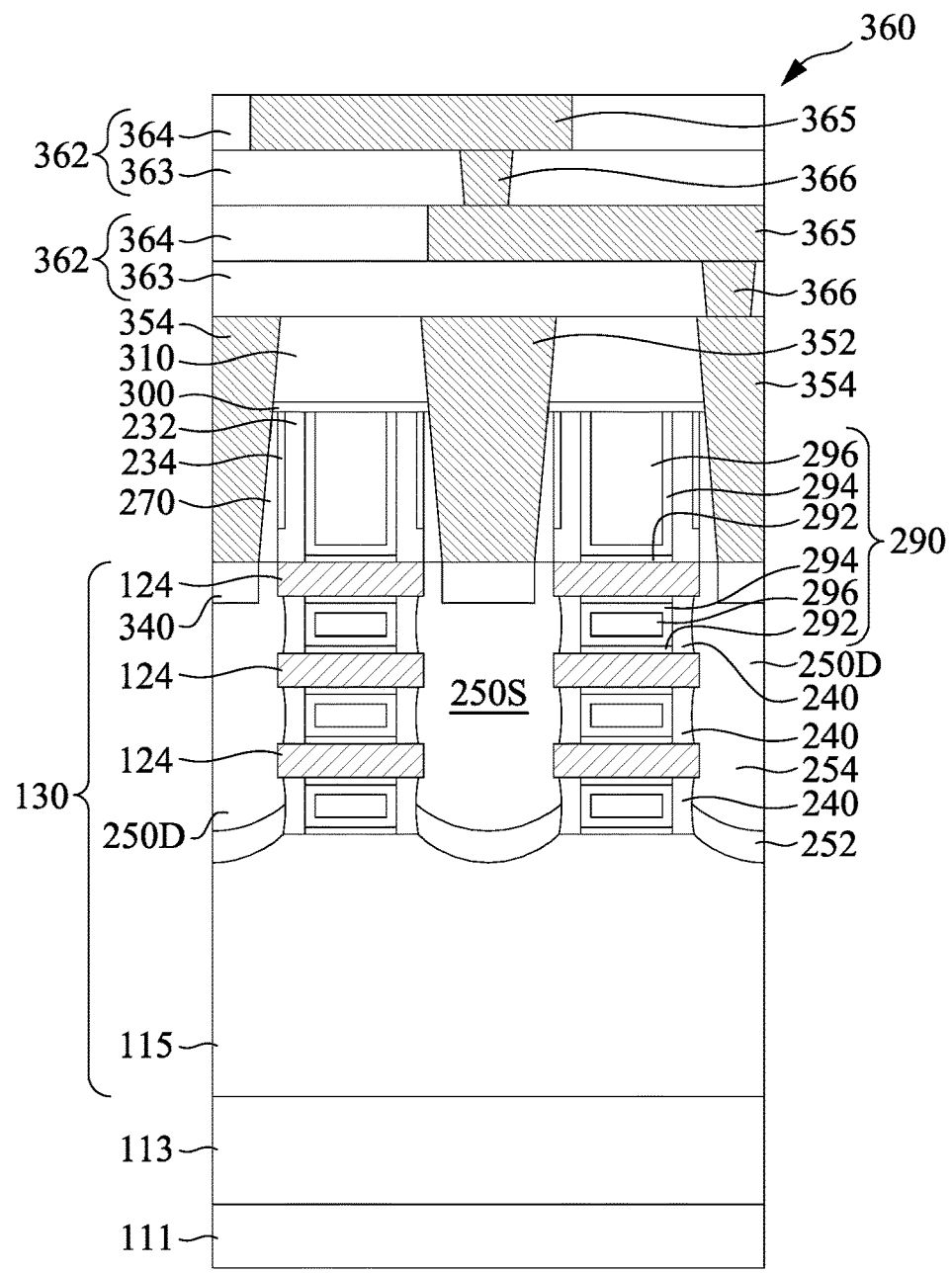
Figure 28B:
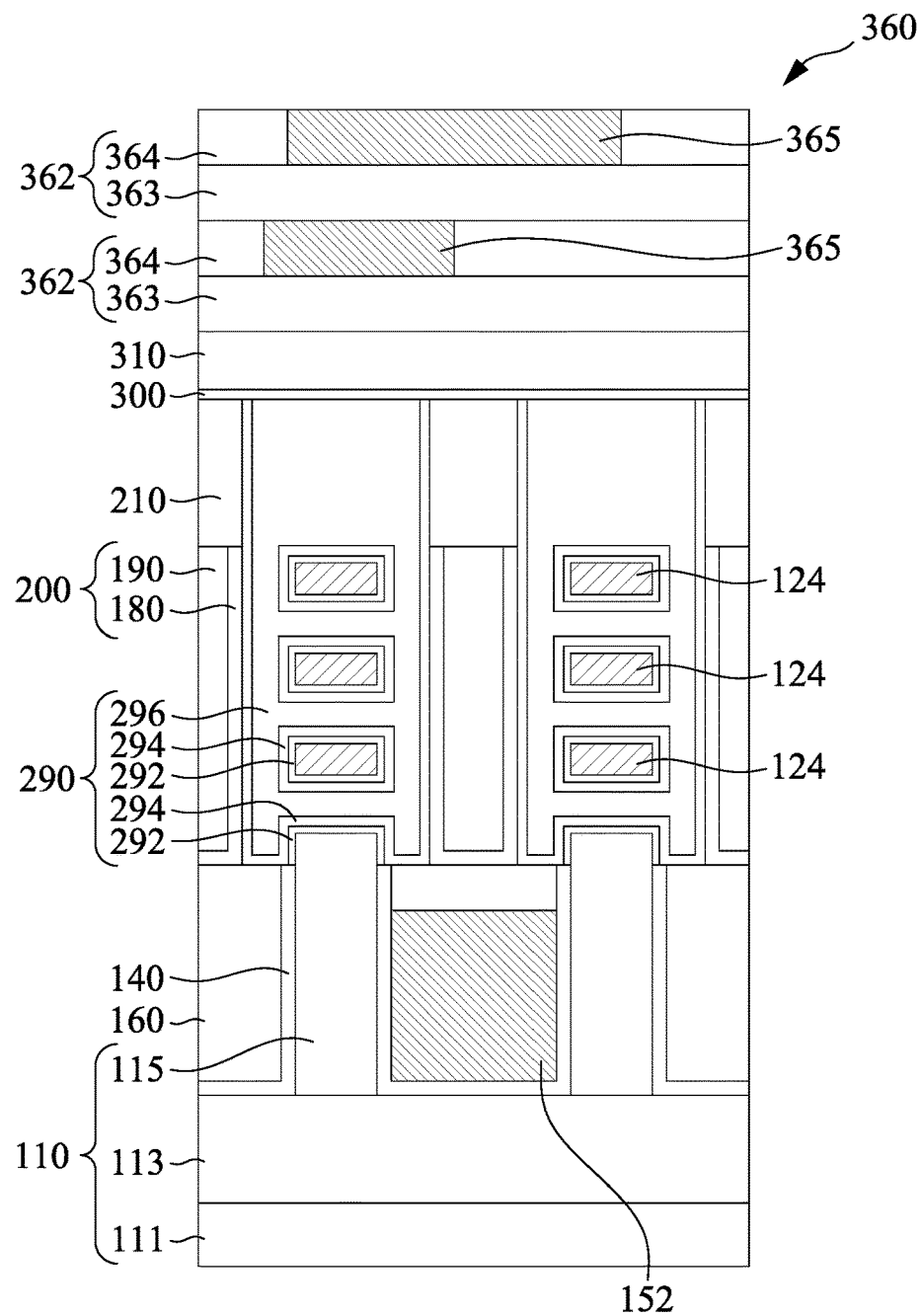
Figure 28C:
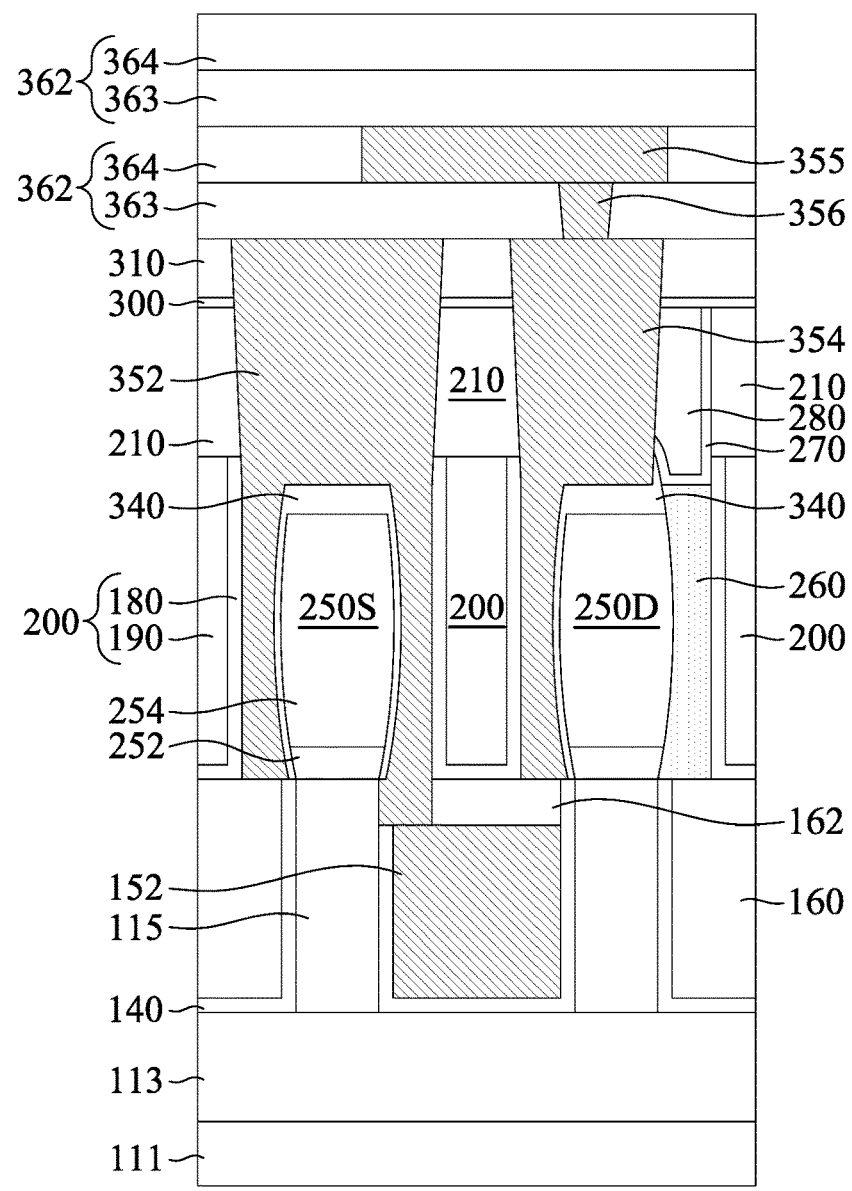

FIGS. 28A-28C illustrate formation of a front-side multilayer interconnection (MLI) structure 360 over the substrate 110. The front-side MLI structure 360 may include a plurality of front-side metallization layers 362. The number of front-side metallization layers 362 may vary according to design specifications of the integrated circuit structure 100. Only two front-side metallization layers 362 are illustrated in FIGS. 28A-28C for the sake of simplicity. The front-side metallization layers 362 each comprise a first front-side inter-metal dielectric (IMD) layer 363 and a second front-side IMD layer 364. The second front-side IMD layers 364 are formed over the corresponding first front-side IMD layers 363. The front-side metallization layers 362 comprise one or more horizontal interconnects, such as front-side metal lines 365, respectively extending horizontally or laterally in the second front-side IMD layers 364 and vertical interconnects, such as front-side metal vias 366, respectively extending vertically in the first front-side IMD layers 363.

In some embodiments, a front-side metal via 366 in a bottommost front-side metallization layer 362 is in contact with the drain contact 354 to make electrical connection to the drain epitaxial structure 250D. In some embodiments, no metal via in the bottommost front-side metallization layer 362 is in contact with the source contact 352. Instead, the source epitaxial structure 250S is electrically connected to the backside via rail 152.

The front-side metal lines 365 and front-side metal vias 366 can be formed using, for example, a single damascene process, a dual damascene process, the like, or combinations thereof. In some embodiments, the front-side IMD layers 363-364 may include low-k dielectric materials having k values, for example, lower than about 4.0 or even 2.0 disposed between such conductive features. In some embodiments, the front-side IMD layers 363-364 may be made of, for example, phosphosilicate glass (PSG), borophosphosilicate glass (BPSG), fluorosilicate glass (FSG), $SiO_xC_y$, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. The front-side metal lines and vias 365 and 366 may comprise metal materials such as W, Ru, Co, Cu, Ti, TiN, Ta, TaN, Mo, Ni, combinations thereof, or the like. The front-side metal lines 365 and vias 366 each have a thickness in a range from about 1 nm to about 50 nm, but other ranges are within the scope of various embodiments of the present disclosure. In some embodiments, the front-side metal lines and vias 365 and 366 may further comprise one or more barrier/adhesion layers (not shown) to protect the respective front-side IMD layers 363-364 from metal diffusion (e.g., copper diffusion) and metallic poisoning. The one or more barrier/adhesion layers may comprise titanium, titanium nitride, tantalum, tantalum nitride, or the like, and may be formed using physical vapor deposition (PVD), CVD, ALD, or the like.

Figure 29A:
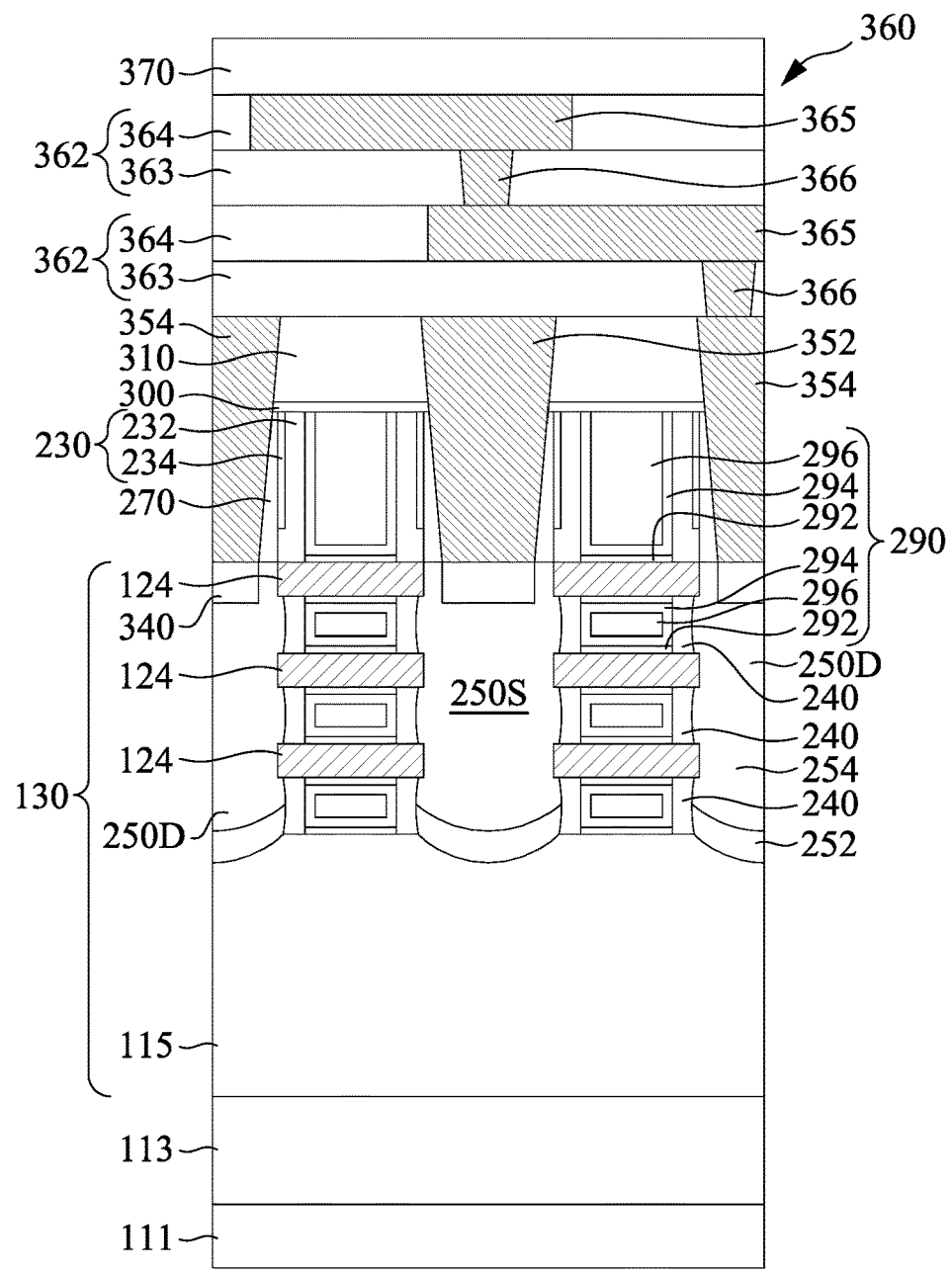
Figure 29B:
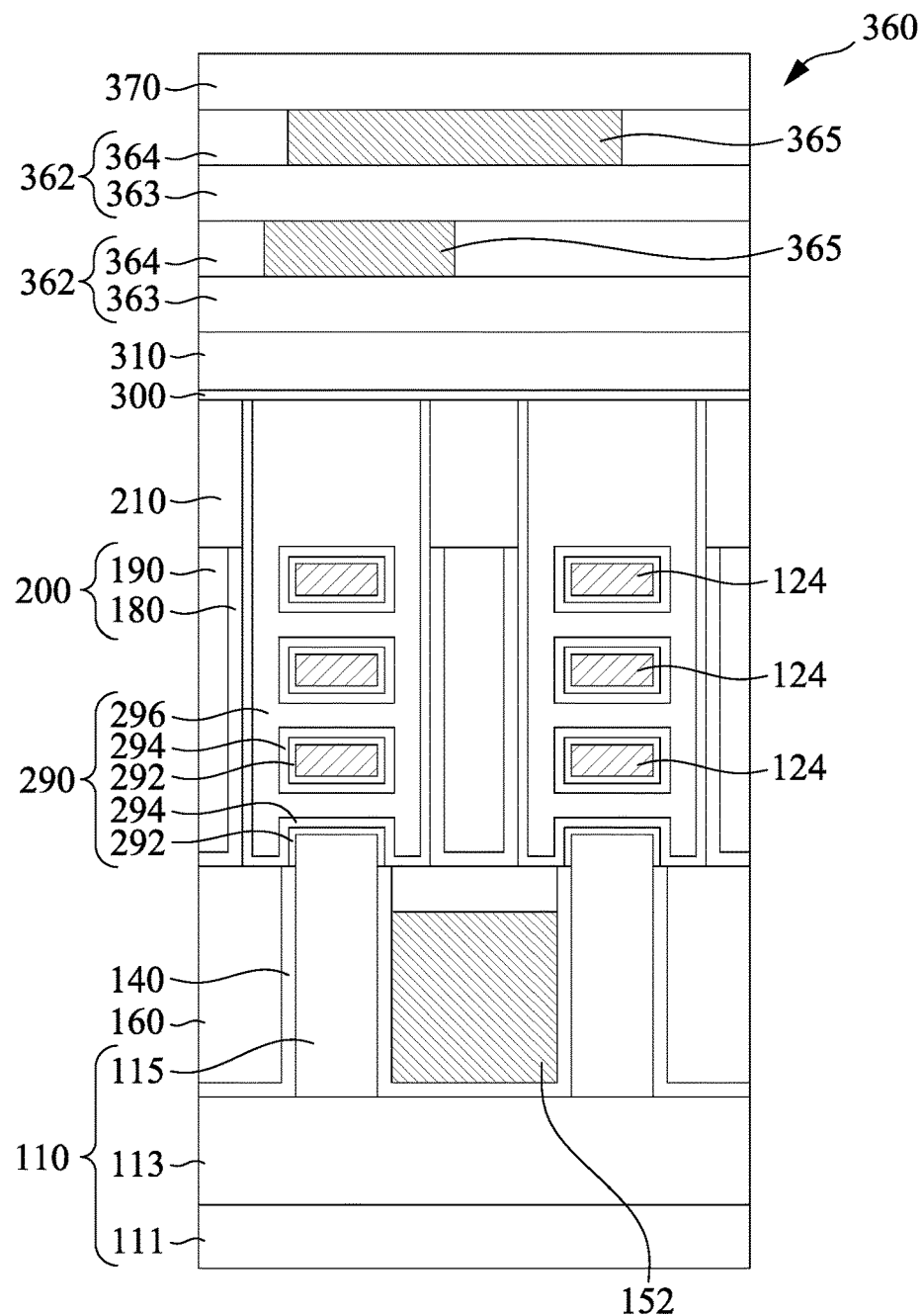
Figure 29C:
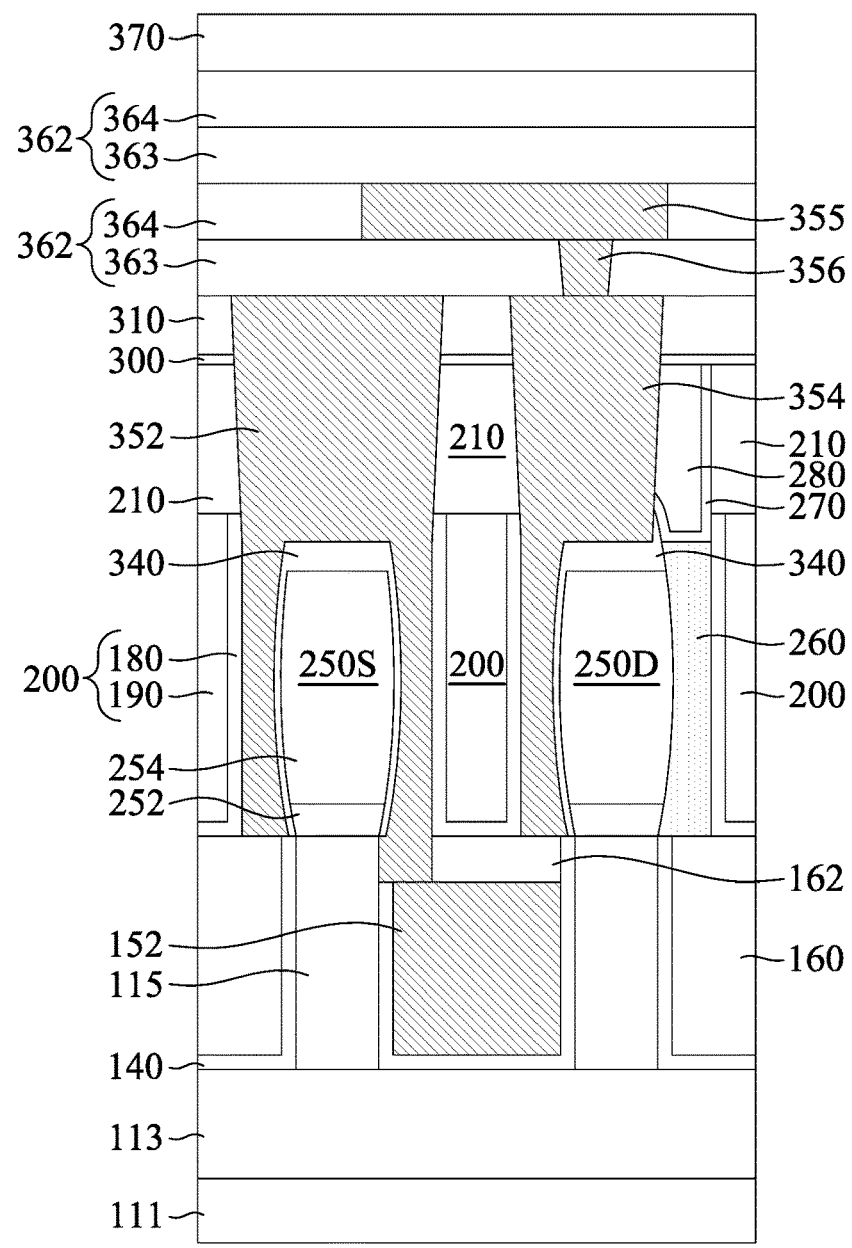
Figure 30A:
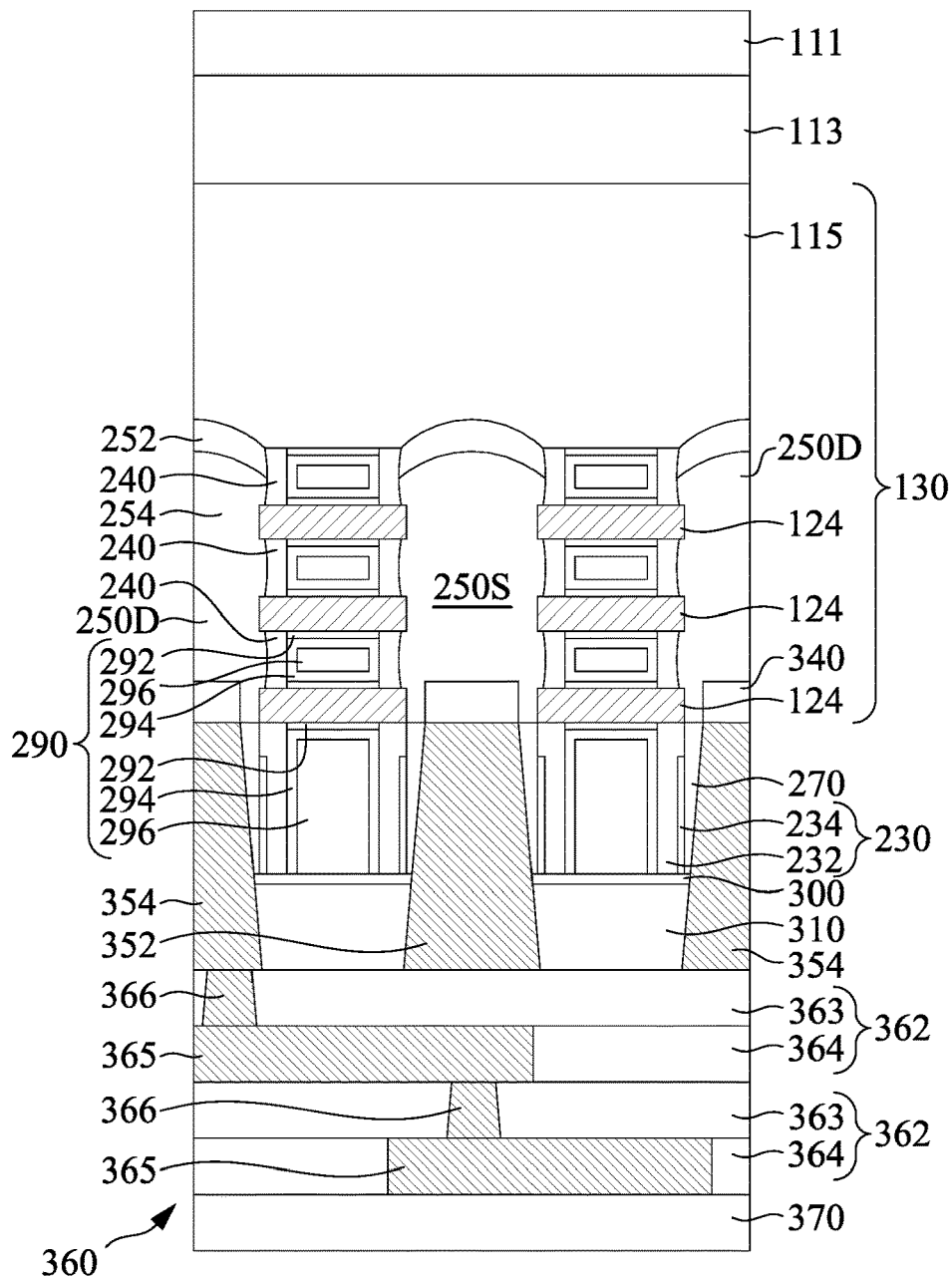
Figure 30B:
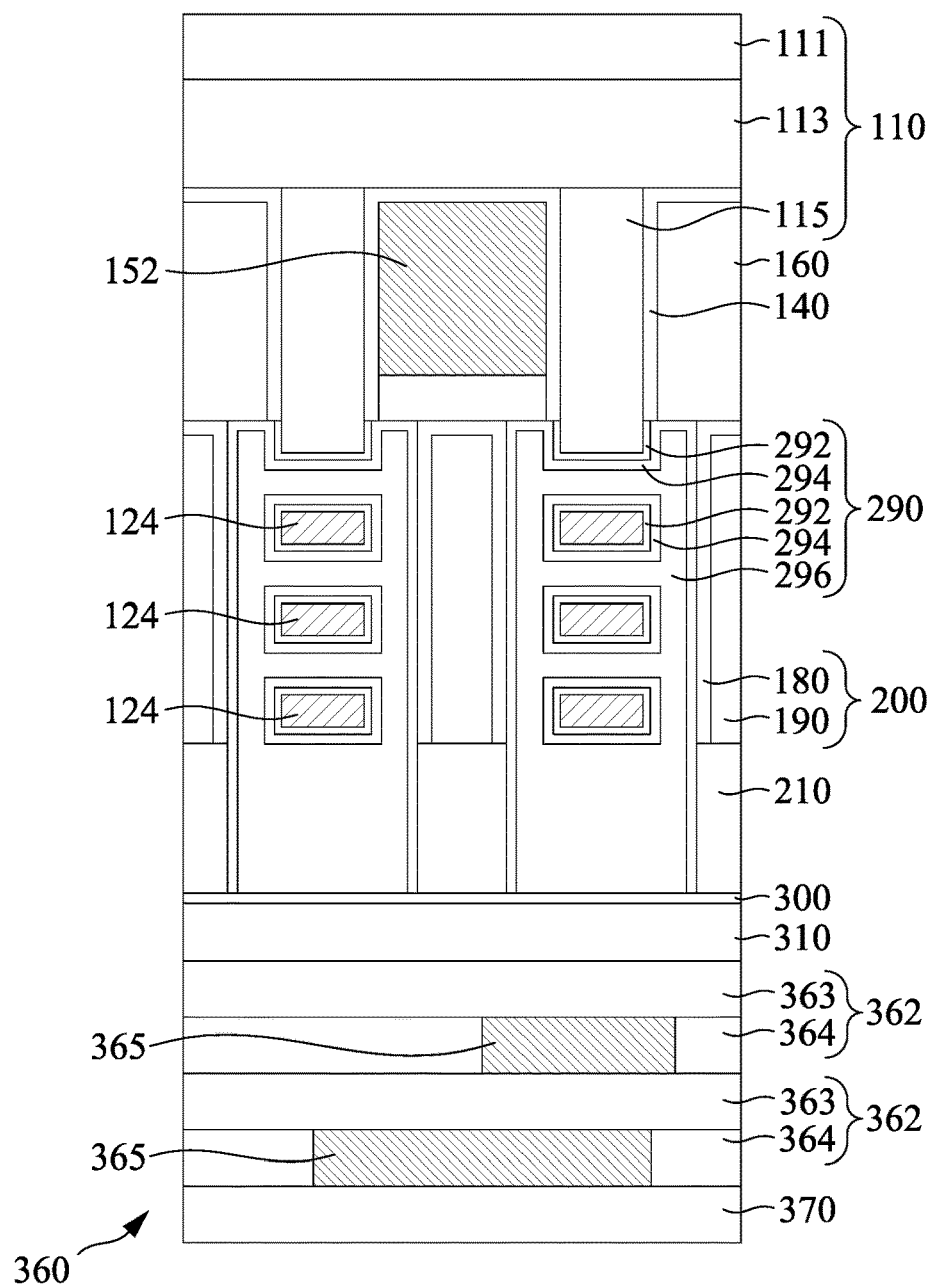
Figure 30C:
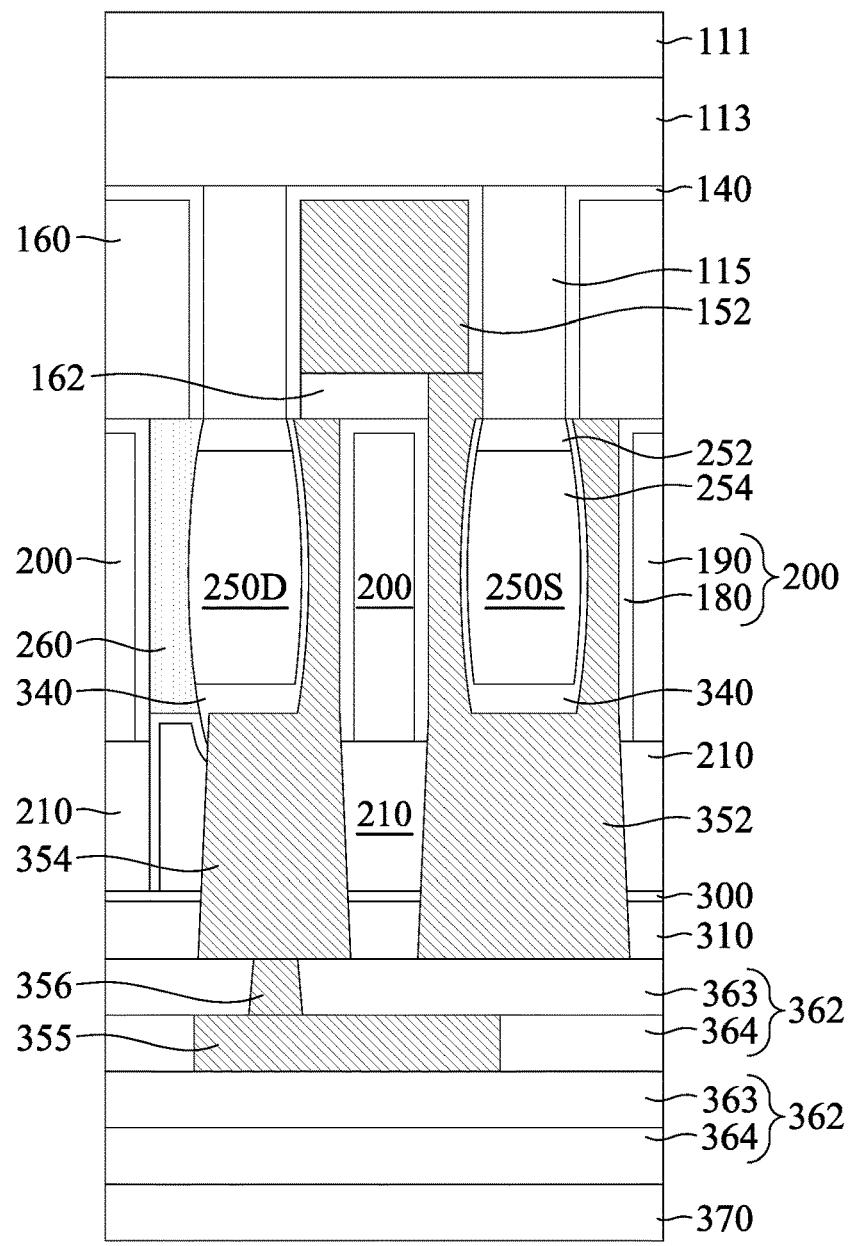

Referring to FIGS. 29A-29C, a carrier substrate 370 is bonded to the front-side MLI structure 360 in accordance with some embodiments of the present disclosure. The carrier substrate 370 may be silicon, doped or undoped, or may include other semiconductor materials, such as germanium; a compound semiconductor; or combinations thereof. The carrier substrate 370 may provide a structural support during subsequent processing on backside of the integrated circuit structure 100 and may remain in the final product in some embodiments. In some other embodiments, the carrier substrate 370 may be removed after the subsequent processing on backside of integrated circuit structure 100 is complete. In some embodiments, the carrier substrate 370 is bonded to a topmost dielectric layer of the MLI structure 360 by, for example, fusion bonding. Once the carrier substrate 370 is bonded to the front-side MLI structure 360, the integrated circuit structure 100 is flipped upside down, such that a backside surface of the base substrate 111 faces upwards, as illustrated in FIGS. 30A-30C.

Figure 31A:
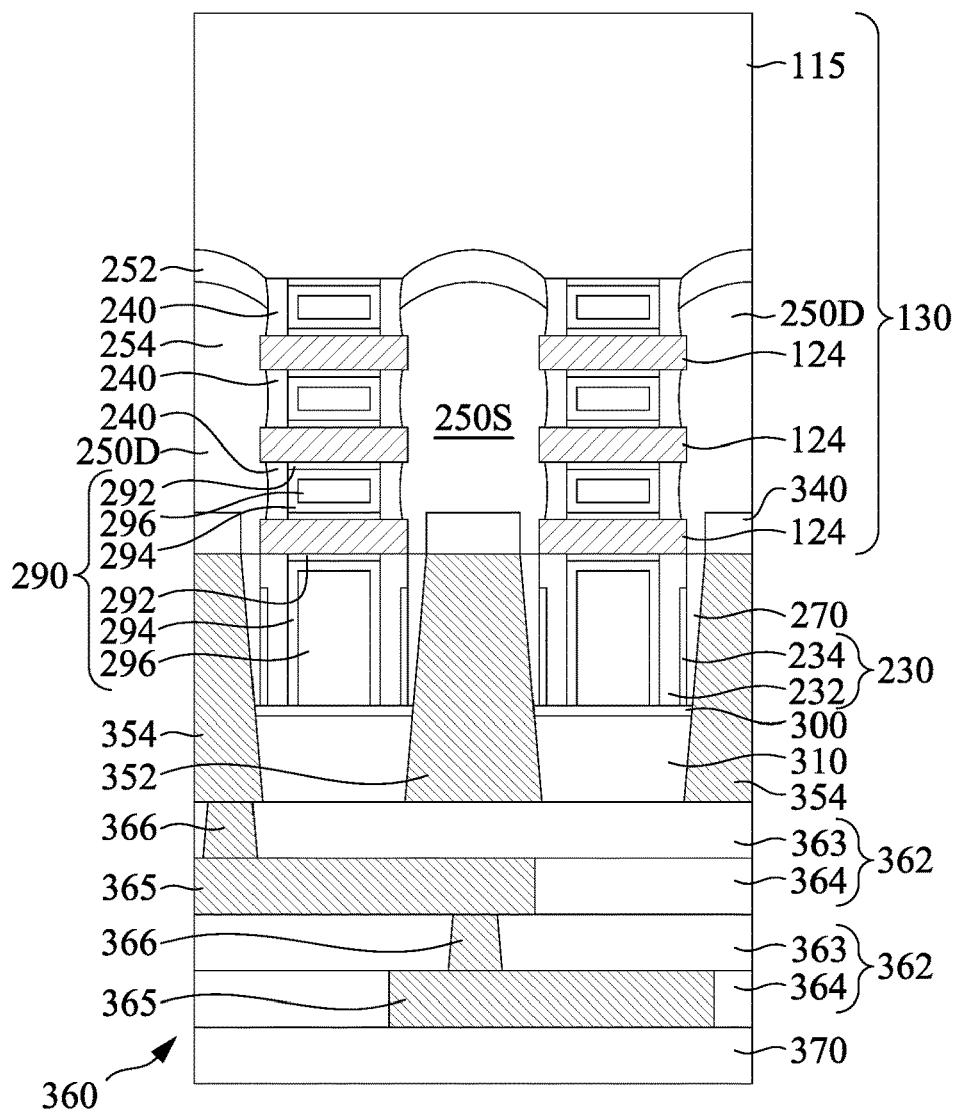
Figure 31B:
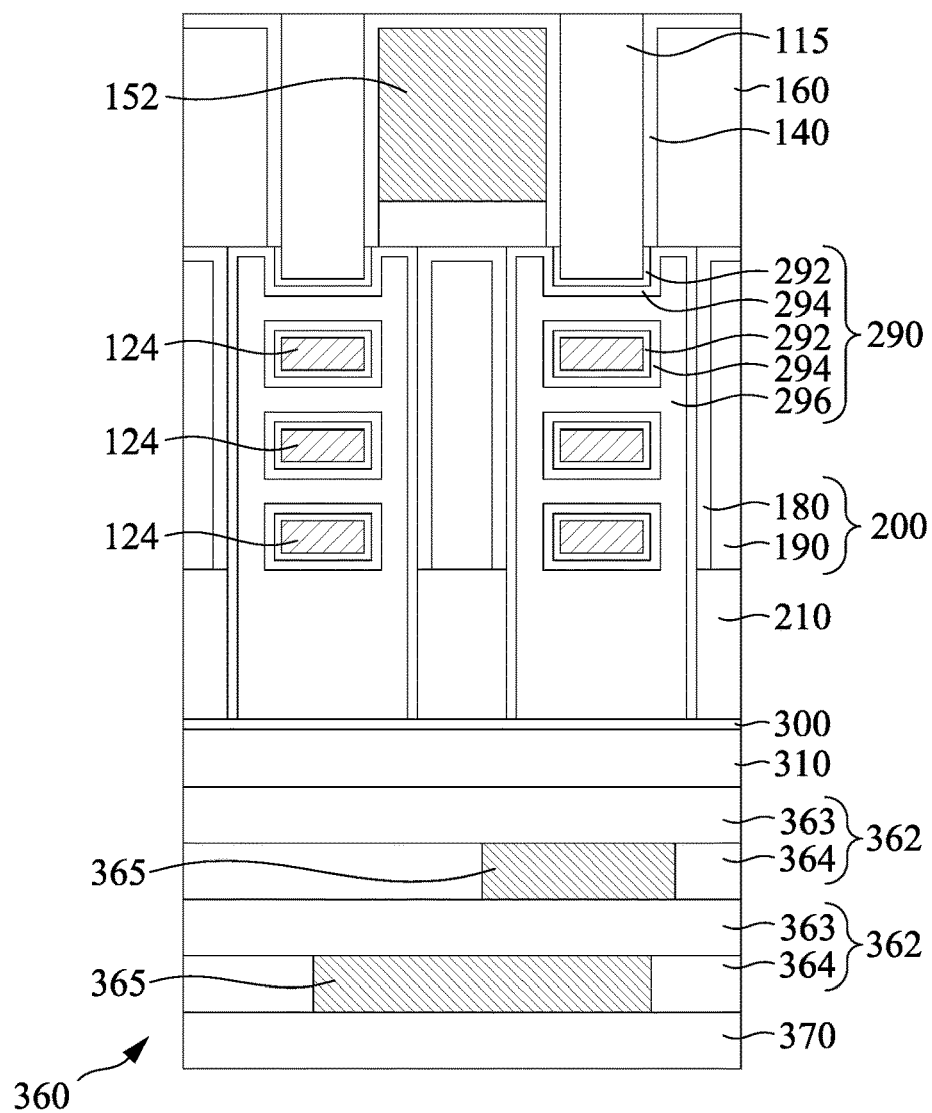
Figure 31C:
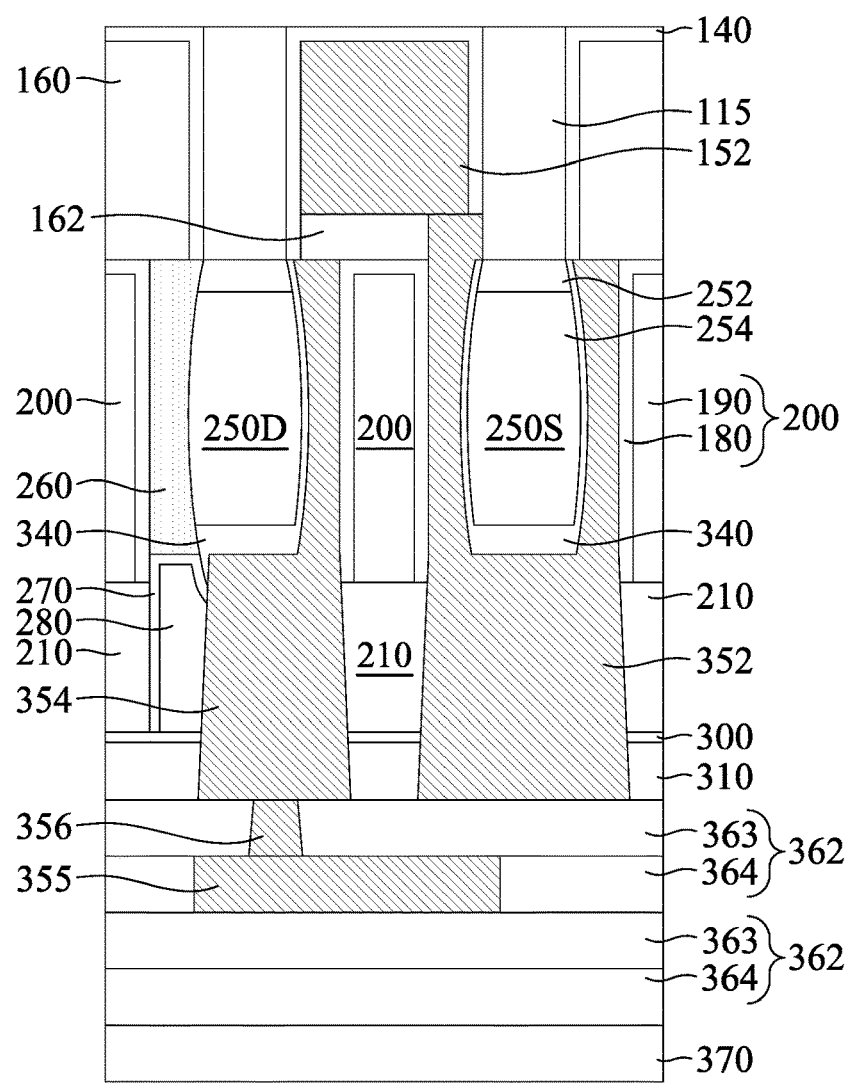

Next, as illustrated in FIGS. 31A-31C, the base substrate 111 and the buried insulator layer 113 are thinned down to expose the semiconductor layer 115. In some embodiments, the thinning step is accomplished by a CMP process, a grinding process, or the like. After the thinning step is complete, the semiconductor layer 115 remains covering backsides of the source/drain epitaxial structures 250S/250D.

Figure 32A:
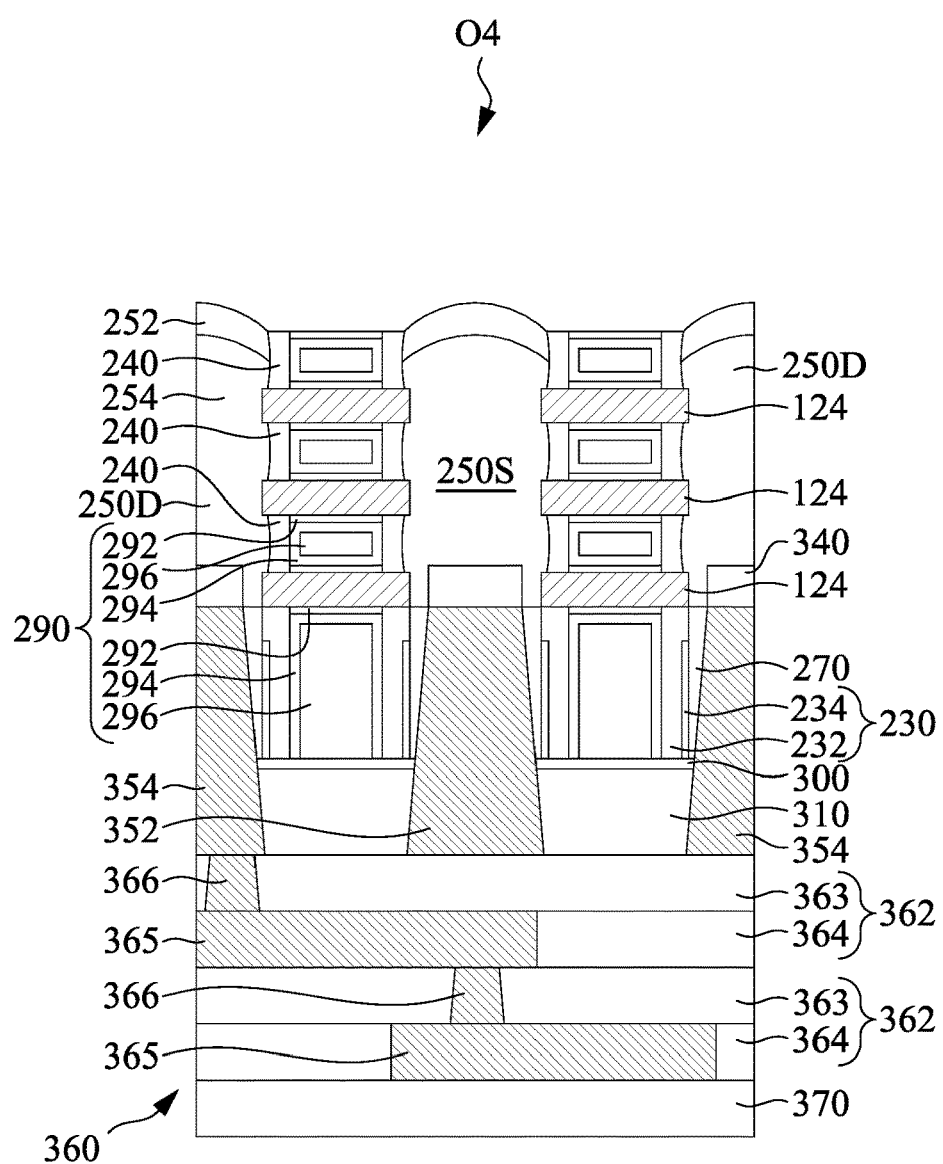
Figure 32B:
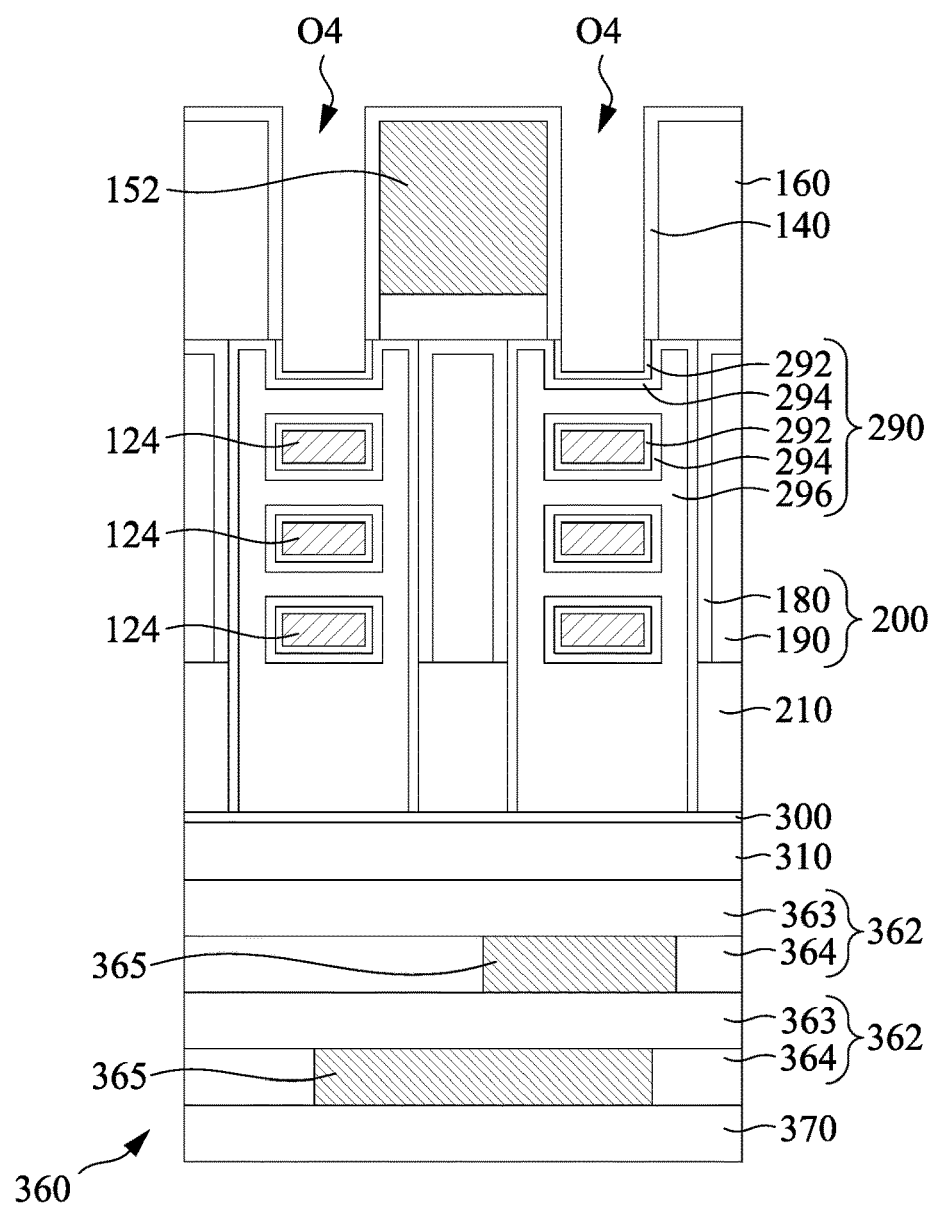
Figure 32C:
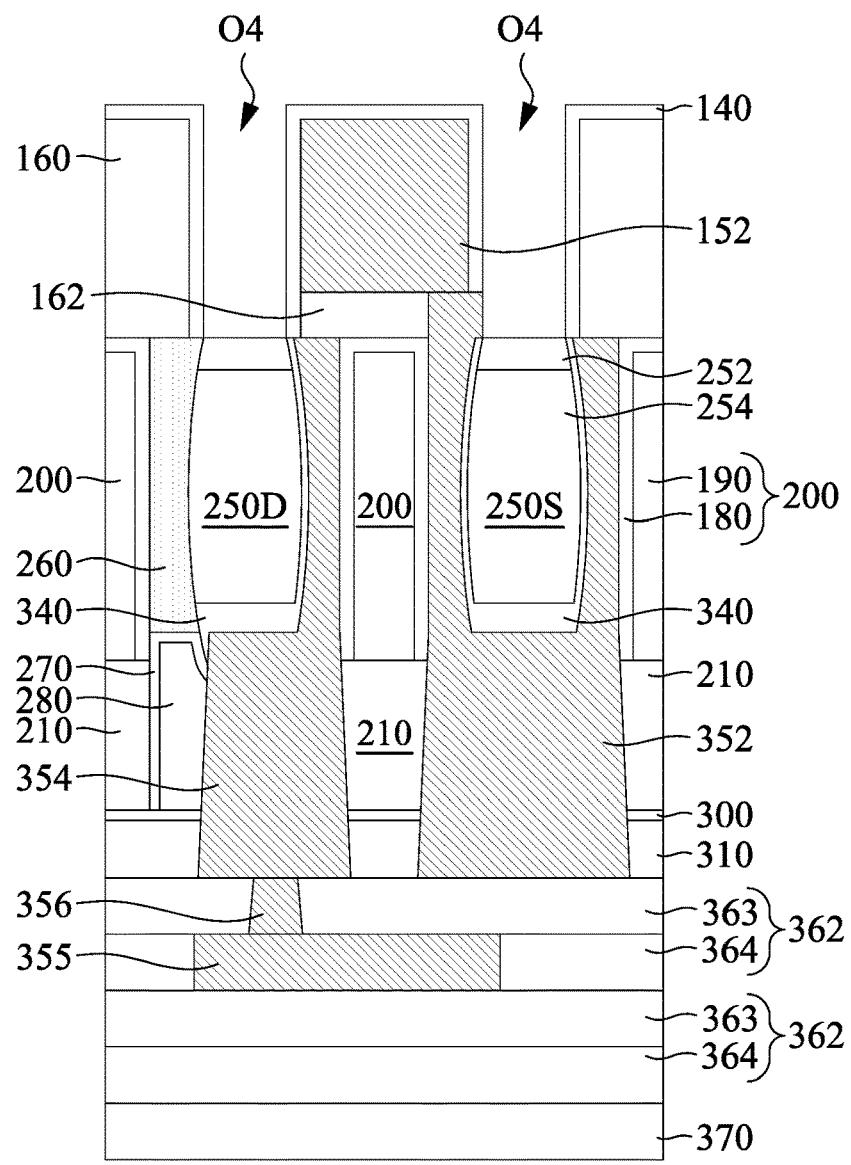

Next, as illustrated in FIGS. 32A-32C, the semiconductor layer 115 is removed. In some embodiments where the semiconductor layer is Si, the Si layer 115 is removed by using a selective etching process that etches Si at a faster etch rate that it etches source/drain epitaxial structures 250S/250D (e.g., boron-doped SiGe epitaxial structures). In some embodiments, the selective etching process for selectively removing the Si layer 115 may be a wet etching process using an wet etching solution such as tetramethylammonium hydroxide (TMAH), potassium hydroxide (KOH), $NH_4OH$, the like or combinations thereof. As a result of the selective etching process, backside openings O4 are formed extending through the STI structure 160 and exposes the backsides of the source/drain epitaxial structures 250S/250D as well as the backsides of the high-k/metal gate structures 290. Because of the etch selectivity, the source/drain epitaxial structures 250S/250D and the high-k/metal gate structures 290 remain substantially intact in the Si removal step. The Si removal step completely removes the silicon layer 115, which in turn improves off-state drain-to-bulk junction leakage current (Iboff). In some embodiments, the first epitaxial layer 252 serves as an etch stop layer to slow down the etching process of removing the Si layer 115.

Figure 33A:
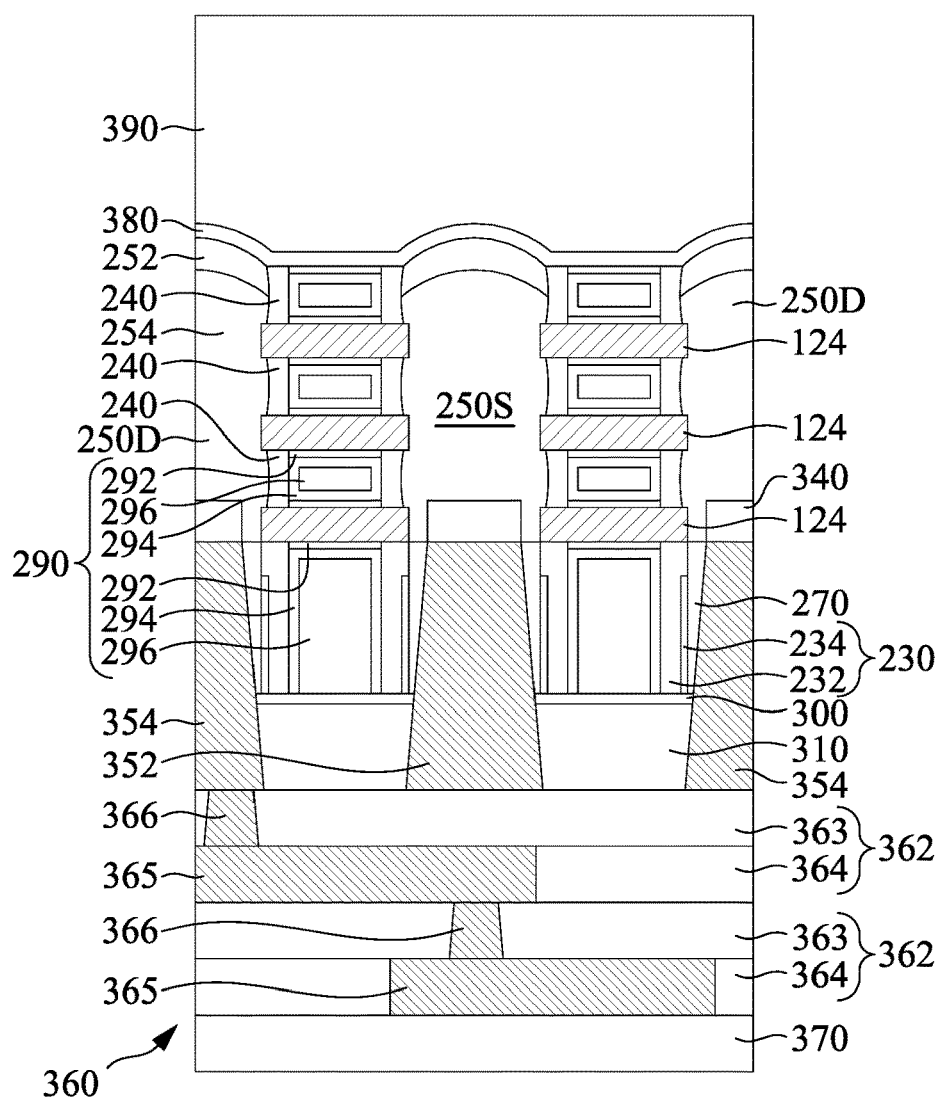
Figure 33B:
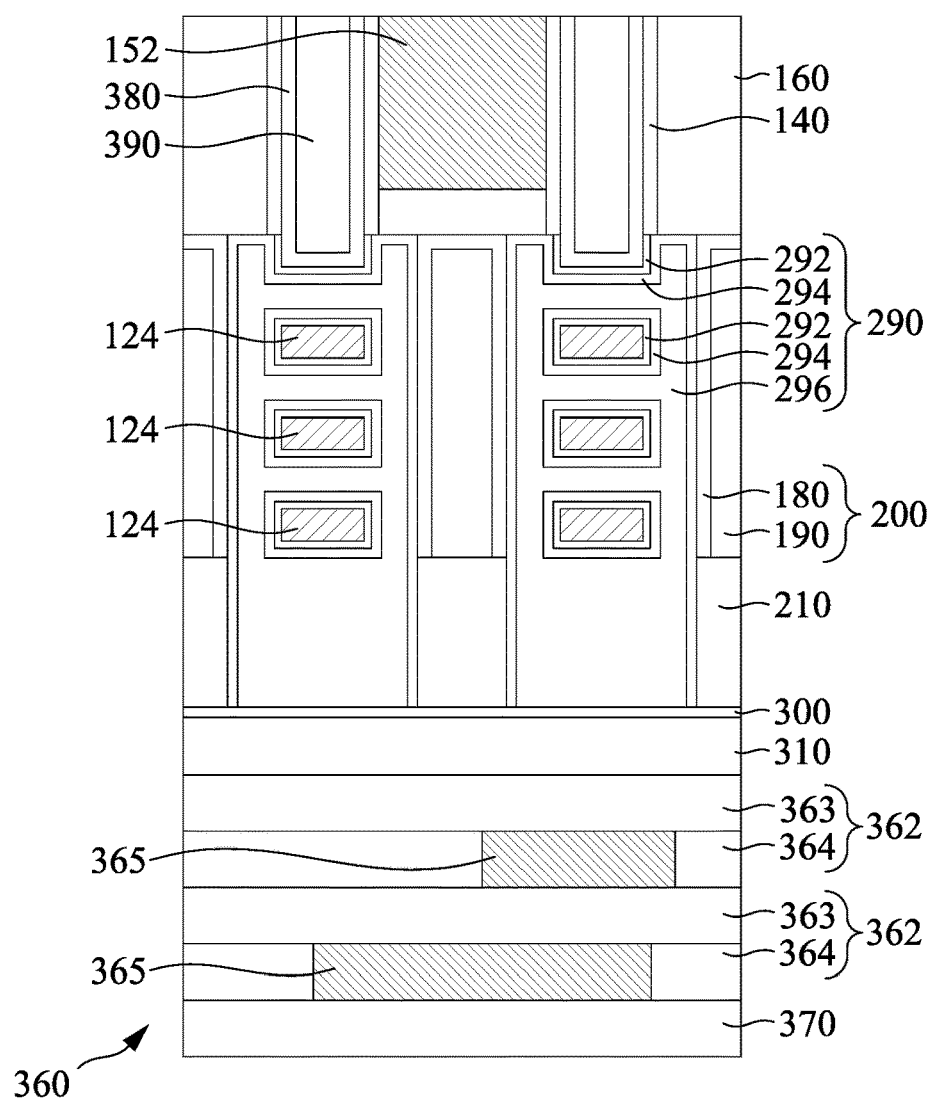
Figure 33C:
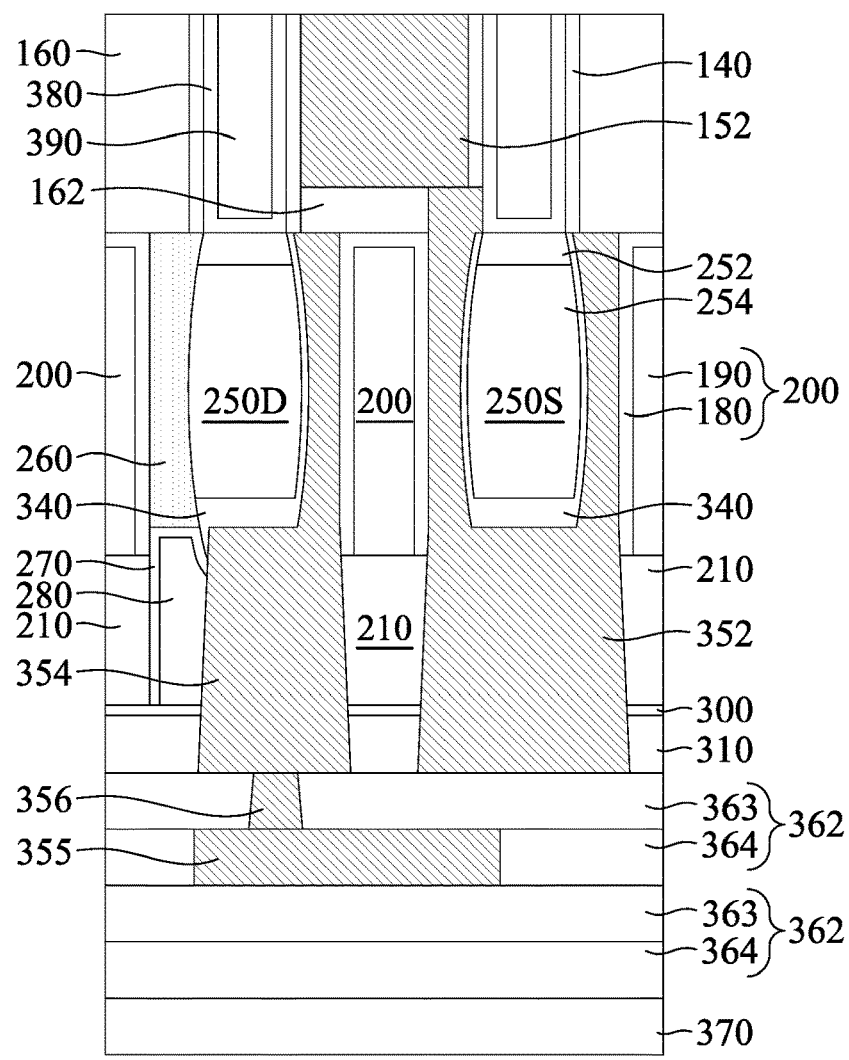

FIGS. 33A-33C illustrate cross-sectional views of formation of a backside liner layer 380 and a backside fill dielectric 390 in the openings O4. The backside liner layer 380 is first deposited conformally over the backsides of the source/drain epitaxial structures 250S/250D and the backsides of the high-k/metal gate structures 290, thus lining the openings O4 in the STI structure 160. In some embodiments, the backside liner layer 380 may include, for example, a low-k dielectric material (with dielectric constant lower than about 7) such as $SiO_2$, SiN, SiCN, SiOC, SiOCN, the like, or combinations thereof. In some embodiments, the backside liner layer 380 includes a high-k dielectric material (with dielectric constant higher than about 7) such as $HfO_2$, $ZrO_2$, $HfAlO_x$, $HfSiO_x$ and $Al_2O_3$, the like or combinations thereof. The backside fill dielectric 390 (e.g., $SiO_2$) is then deposited over the backside liner layer 380 until the openings O4 are overfilled with the backside fill dielectric 390. A CMP process is then performed on the backside fill dielectric 390 until the backside surface of the STI structure 160 is exposed. The backside fill dielectric 390 may serve to electrically isolate source/drain structures 250S/250D, metal gate structures 290 from the backside via rail 152 and a subsequently formed backside power rail. In some embodiments, the backside liner layer 380 has a thickness in a range from about 1 nm to about 10 nm. If the thickness of the backside liner layer 380 is excessively thick, the fill dielectric 390 may have unfilled voids due to increased challenge on the dielectric deposition process. Moreover, as illustrated in FIGS. 33B and 33C, the backside liner layer 380 has a U-shaped profile, and the liner layer 180 has an inverse U-shaped profile. This is because that the liner layer 180 is formed in the front-side processing, and the backside liner layer 380 is formed in the backside processing.

Figure 34A:
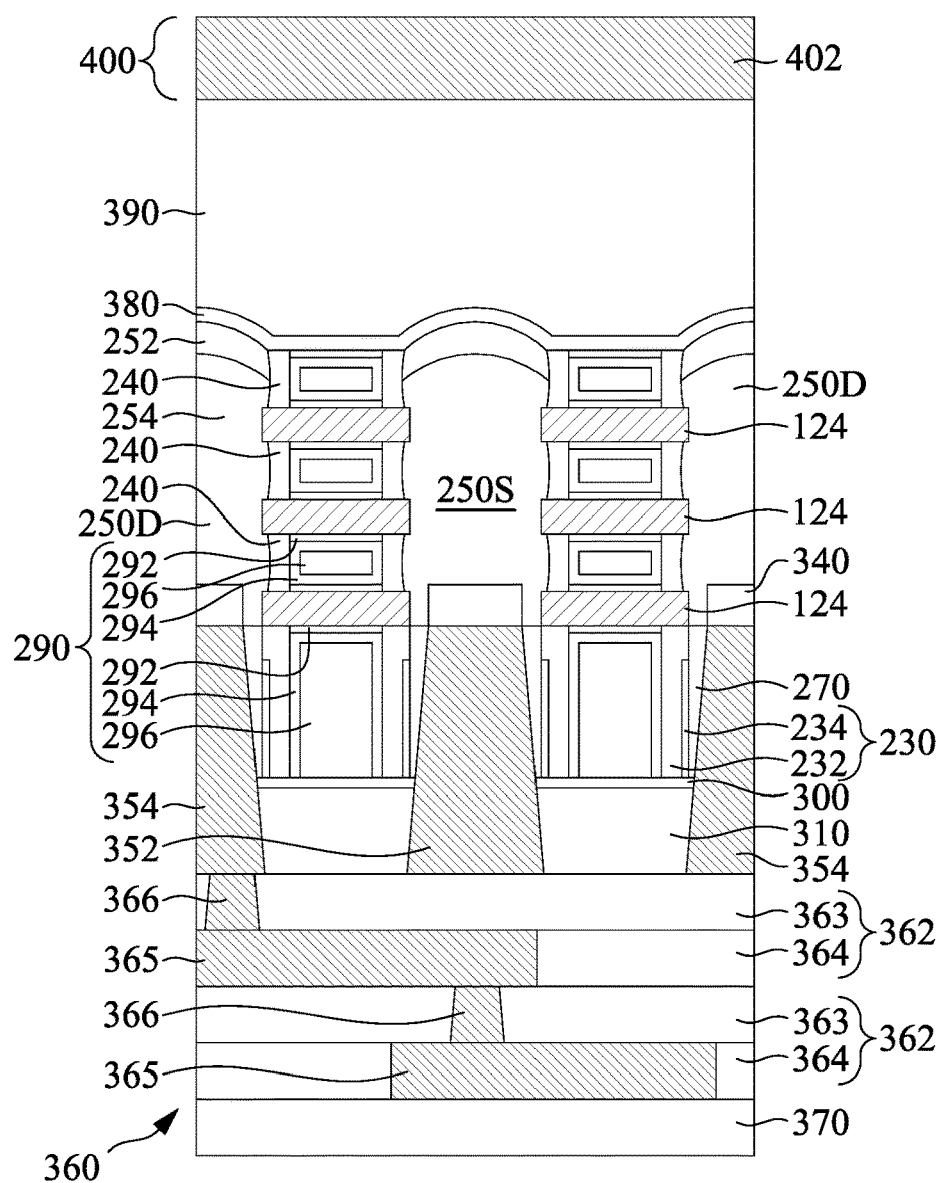
Figure 34B:
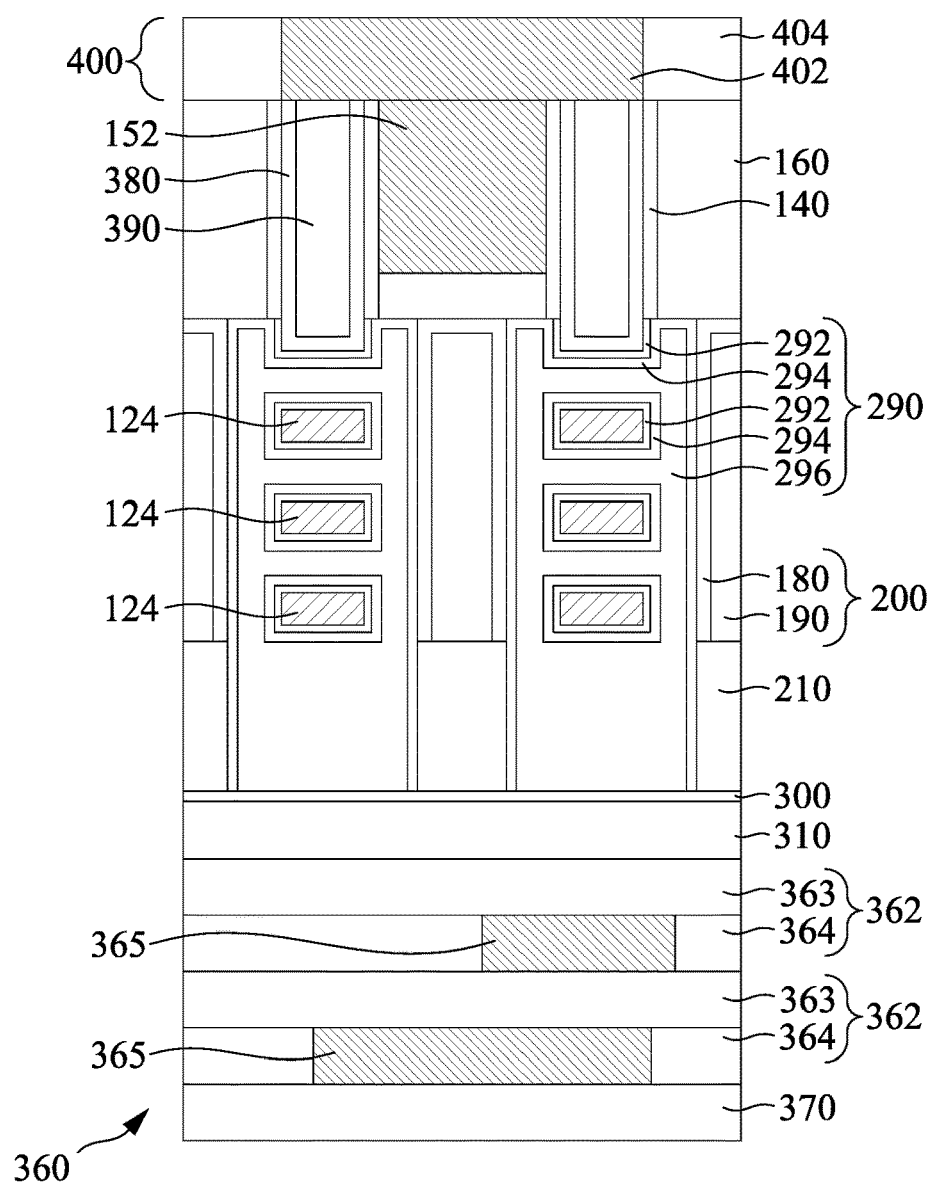
Figure 34C:
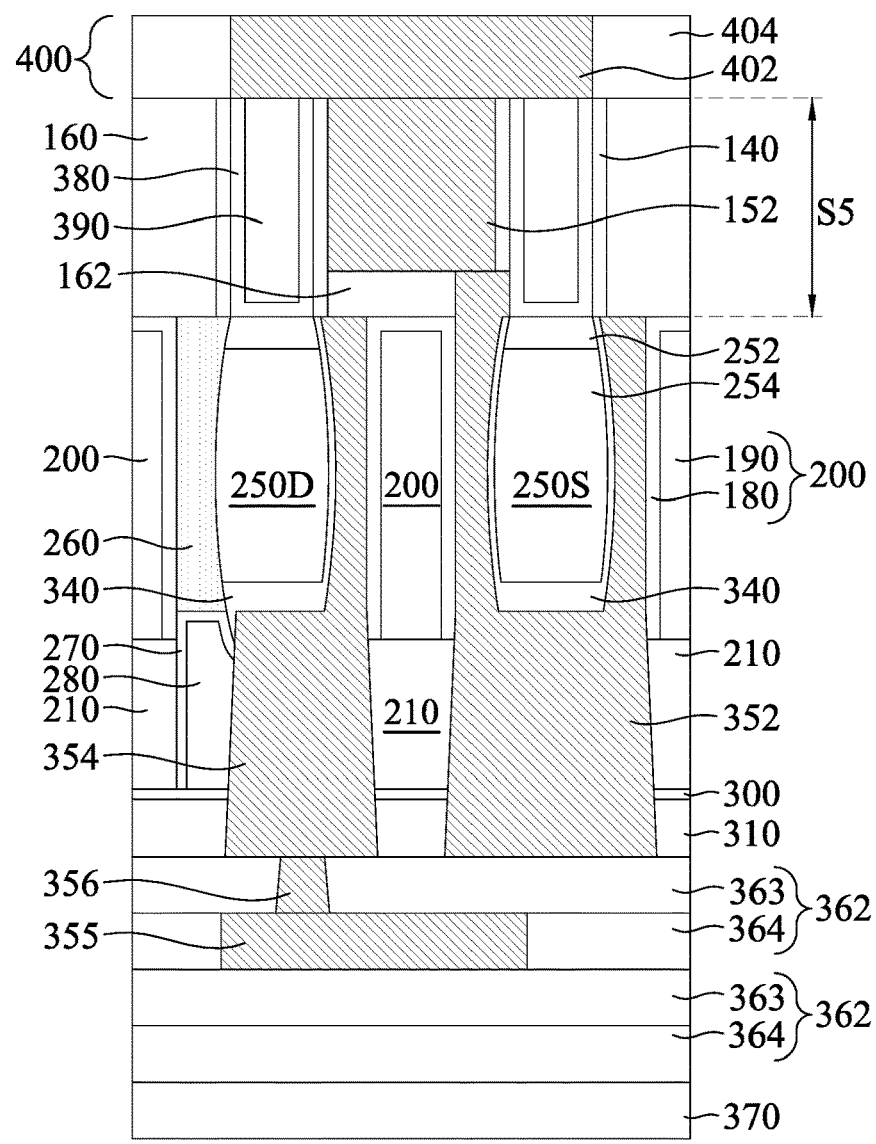

FIGS. 34A-34C illustrate cross-sectional views of formation of a bottommost backside metallization layer 400 (also called backside M0 layer) over the backside via rail 152. The bottommost backside metallization layer 400 comprises a backside IMD layer 404 over the backside fill dielectric 390 and one or more horizontal interconnects, such as backside metal lines 402, respectively extending horizontally or lateralling in the backside IMD layer 404. A metal line 402 in the bottommost backside metallization layer 400 serves as a power rail that extends across and is in contact with the backside via rail 152, so as to make electrical connection to one or more source epitaxial structures 250S. Because the power rail 402 is formed in the backside metallization layer 400, more routing space can be provided for the integrated circuit structure 100. In some embodiments, the backside power rail 402 is separated from backsides of the source/drain epitaxial structures 250S/250D by a vertical distance S5 in a range, for example, from about 24 nm to about 80 nm. Excessively large or small vertical distance S5 may degrade the time dependent dielectric breakdown (TDDB) performance.

The backside IMD layer 404 is formed of a low-k dielectric materials such asphosphosilicate glass (PSG), borophosphosilicate glass (BPSG), fluorosilicate glass (FSG), $SiO_xC_y$, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. The backside metal lines 402 are formed by etching a trench in the backside IMD layer 404, depositing one or more metal materials in the trench, and then performing a CMP process to remove excess metal materials outside the trench. The one or more metal materials include W, Ru, Co, Cu, Ti, TiN, Ta, TaN, Mo, Ni, combinations thereof, or the like. The backside metal line 402 has a thickness in a range from about 1 nm to about 50 nm, but other ranges are within the scope of various embodiments of the present disclosure. In some embodiments, the backside metal lines 402 may further comprise one or more barrier/adhesion layers (not shown) to protect the backside IMD layer 404 from metal diffusion (e.g., copper diffusion) and metallic poisoning.

Figure 35A:
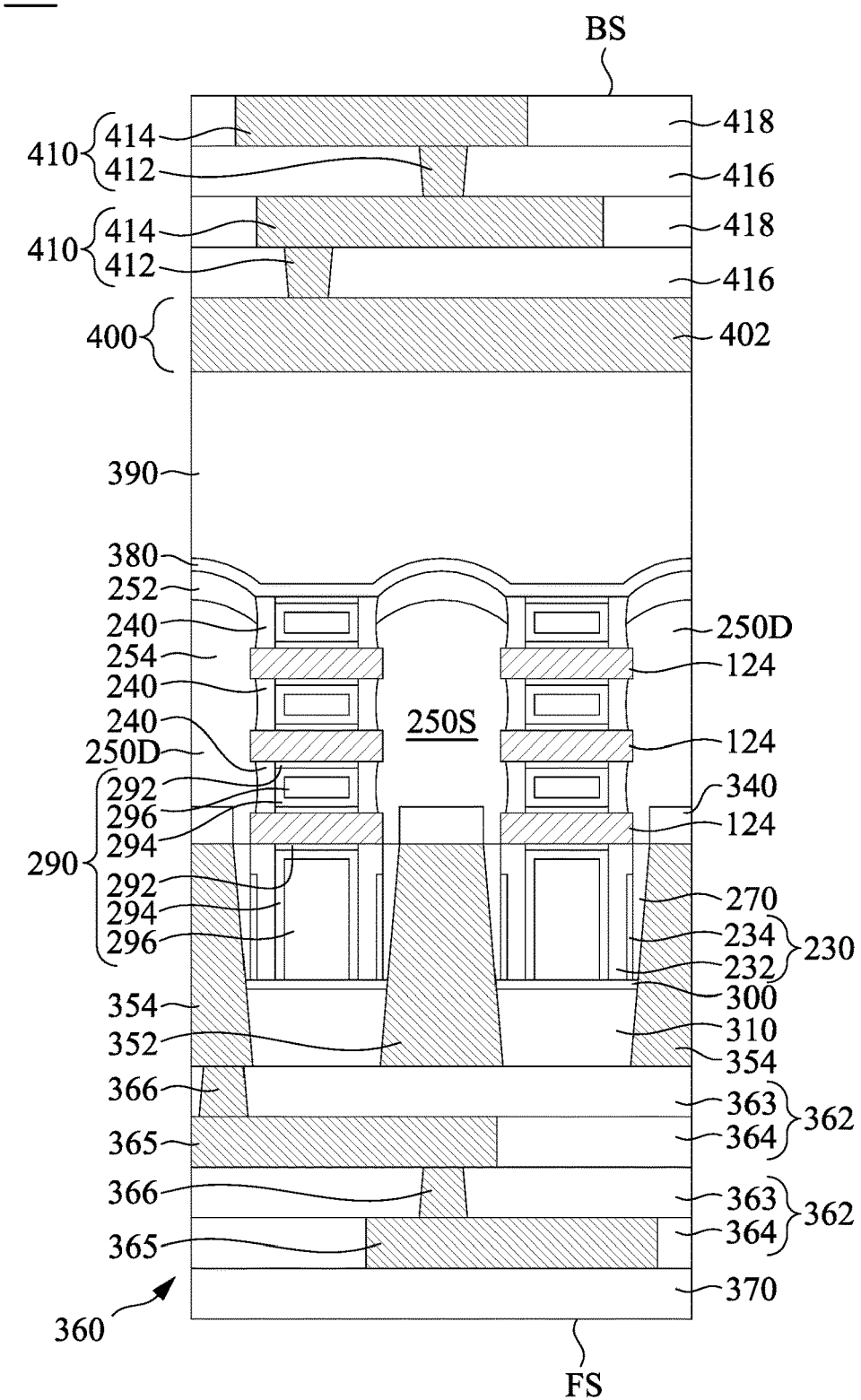
Figure 35B:
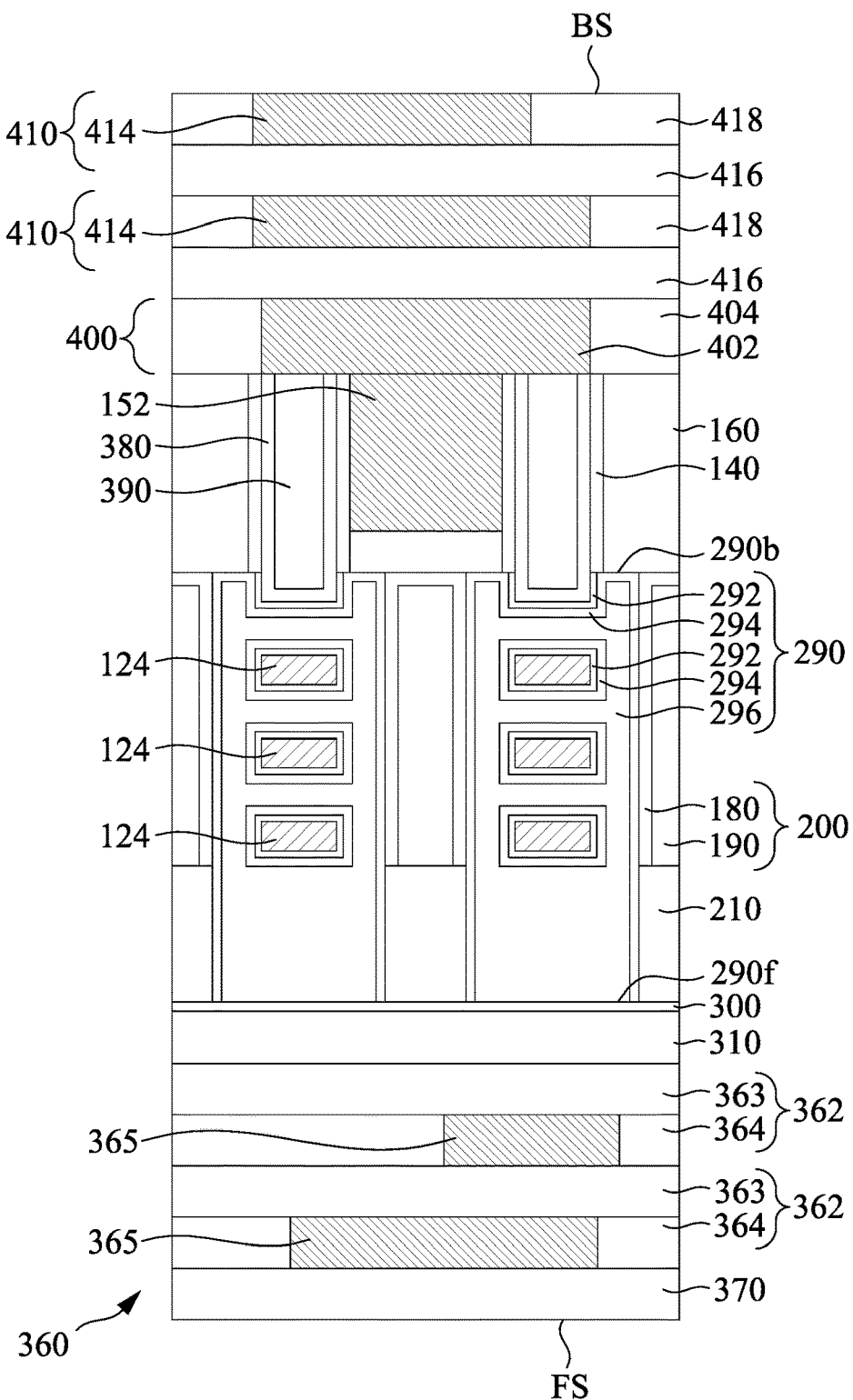
Figure 35C:
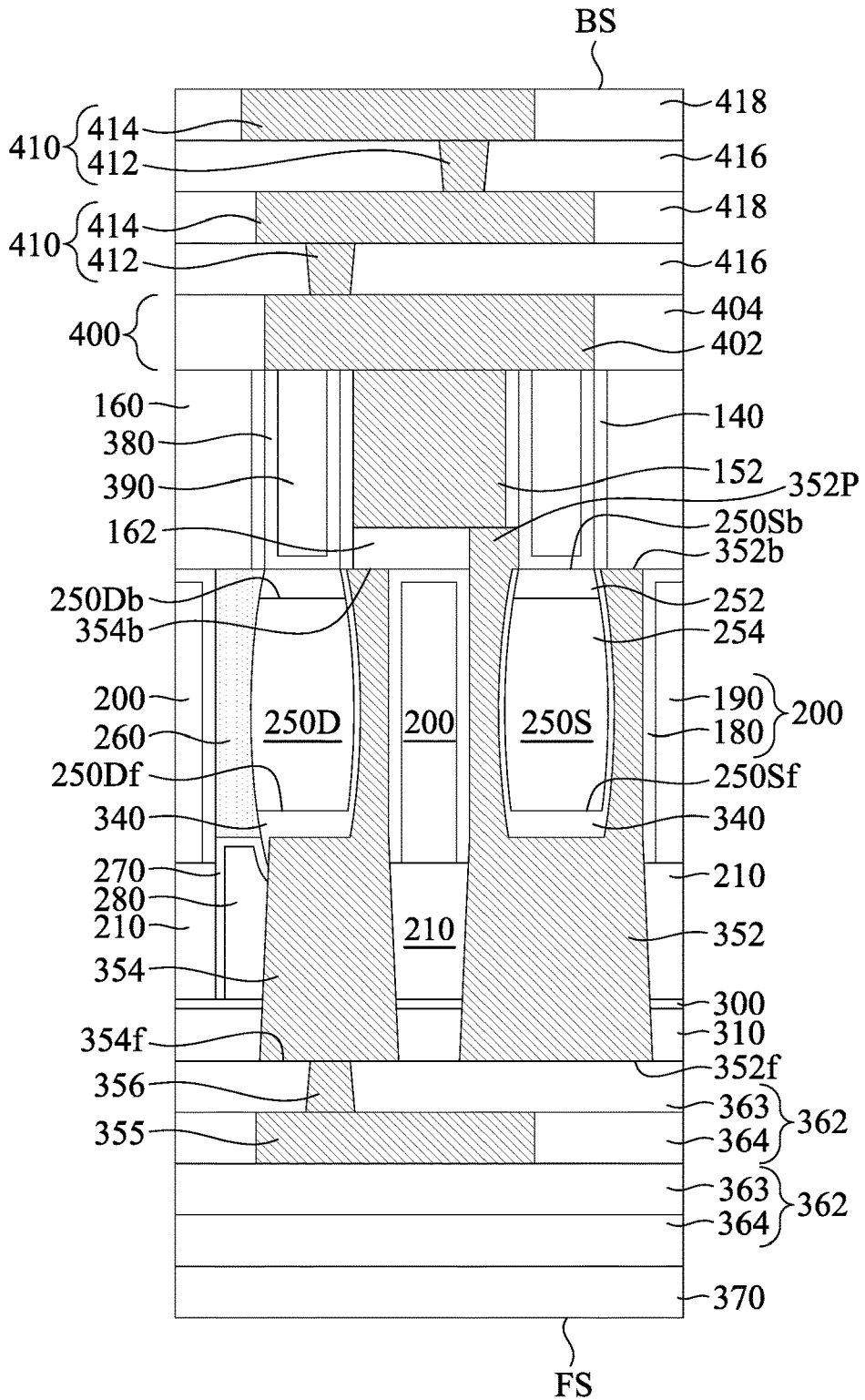

FIGS. 35A-35C illustrate cross-sectional views of formation of a plurality upper backside metallization layers 410 over the bottommost backside metallization layer 400. The bottommost backside metallization layer 400 and the upper backside metallization layers 410 can be in combination referred to as a backside MLI structure. The number of upper backside metallization layers 410 may vary according to design specifications of the integrated circuit structure 100. Only two backside metallization layers 410 (also called backside M1 layer and backside M2 layer) are illustrated in FIGS. 35A-35C for the sake of simplicity.

The upper backside metallization layers (e.g., backside M1 layer and M2 layer) 410 each comprise a first backside IMD layer 416 and a second backside IMD layer 418. The second backside IMD layers 418 are formed over the corresponding first backside IMD layers 416. The upper backside metallization layers 410 comprise one or more horizontal interconnects, such as backside metal lines 414, respectively extending horizontally or laterally in the second backside IMD layers 418 and vertical interconnects, such as backside metal vias 412, respectively extending vertically in the first backside IMD layers 416. In some embodiments, the backside metal vias 412 have tapered profile with a width decreasing as a distance from the backside via rail 152 decreases, due to the nature of etching via openings in the backside IMD layers 416 after the IC structure 100 has been flipped upside down.

As illustrated in FIGS. 35A-35C, the integrated circuit structure 100 has a front-side surface FS and a backside surface BS opposite the front-side surface FS. In the illustrated embodiment, the front-side surface FS is the bottom surface of the carrier substrate 370, and the backside surface BS is the top surface of the topmost metallization layer 410. Elements within the integrated circuit structure 100 have front-side surface facing toward the front-side surface FS and backside surfaces facing toward the backside surface BS. For example, the source epitaxial structure 250S has a front-side surface 250Sf facing toward the front-side surface FS and a backside surface 250Sb facing toward the backside surface BS, the drain epitaxial structure 250D has a front-side surface 250Df facing toward the front-side surface FS and a backside surface 250Db facing toward the backside surface BS, the source contact 352 has a front-side surface 352f facing toward the front-side surface FS and a backside surface 352b facing toward the backside surface BS, the drain contact 354 has a front-side surface 354f facing toward the front-side surface FS and a backside surface 354b facing toward the backside surface BS, and the gate structure 290 has a front-side surface 290f facing toward the front-side surface FS and a backside surface 290b facing toward the backside surface BS. Moreover, as illustrated in FIG. 35C, the source epitaxial structure 352 has a protrusion 350P extending past the backside surface 250Sb of the source epitaxial structure 250S to the backside via rail 152.

Figure 35D:
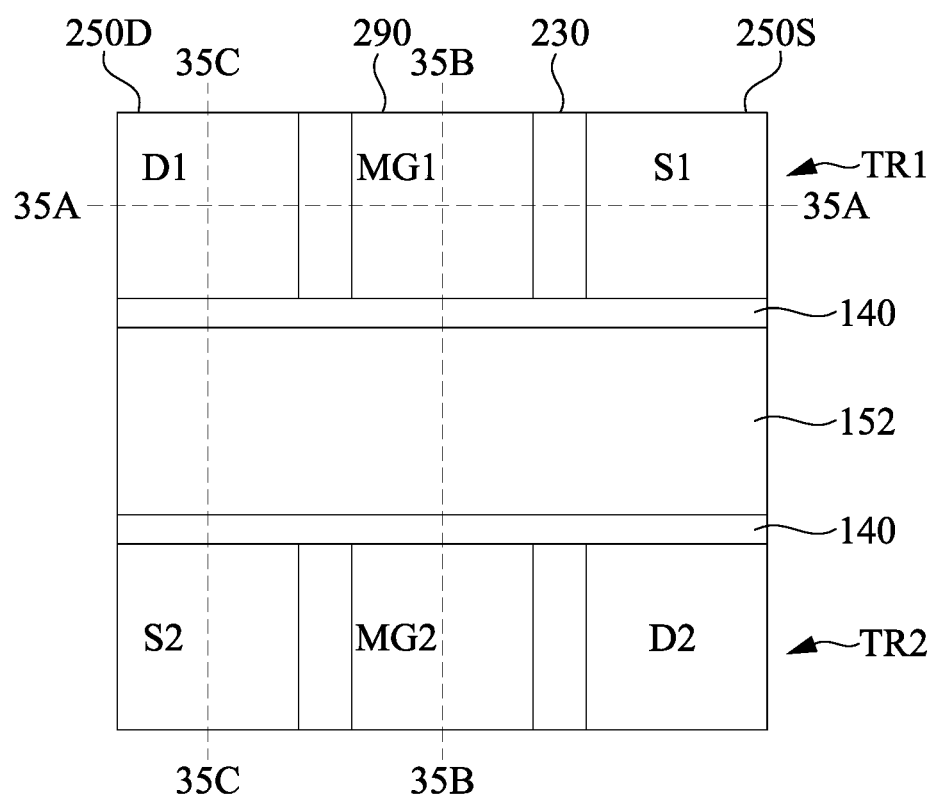
FIG. 35D illustrates a schematic plan view of the integrated circuit structure in accordance with some embodiments of the present disclosure.

FIG. 35D illustrates a schematic plan view of the integrated circuit structure 100 in accordance with some embodiments of the present disclosure, wherein a cross-sectional view taken along line 35A-35A is illustrated in FIG. 35A, a cross-sectional view taken along line 35B-35B is illustrated in FIG. 35B, and a cross-sectional view taken along line 35C-35C is illustrated in FIG. 35C. As illustrated in FIG. 35D, the integrated circuit structure 100 includes a first GAA transistor TR1 and a second GAA transistor TR2. The first GAA transistor TR1 includes a first source epitaxial structure Si, a first gate structure MG1 and a first drain epitaxial structure D1 arranged along a first direction. The second GAA transistor TR2 includes a second drain epitaxial structure D2, a second gate structure MG2 and a second source epitaxial structure S2 arranged along the first direction. The integrated circuit structure 100 further includes a backside via rail 152 extending along the first direction and arranged between the GAA transistors TR1 and TR2 along a second direction substantially perpendicular to the first direction. The first and second source epitaxial structures Si and S2 have cross-sectional profiles of the source epitaxial structures 250S as illustrated in FIGS. 35A and 35C. The first and second drain epitaxial structures D1 and D2 have cross-sectional profiles of the drain epitaxial structures 250D as illustrated in FIGS. 35A and 35C. The first and second gate structures MG1 and MG2 have cross-sectional profiles of the high-k/metal gate structures 290 as illustrated in FIGS. 35A and 35B.

Figure 36A:
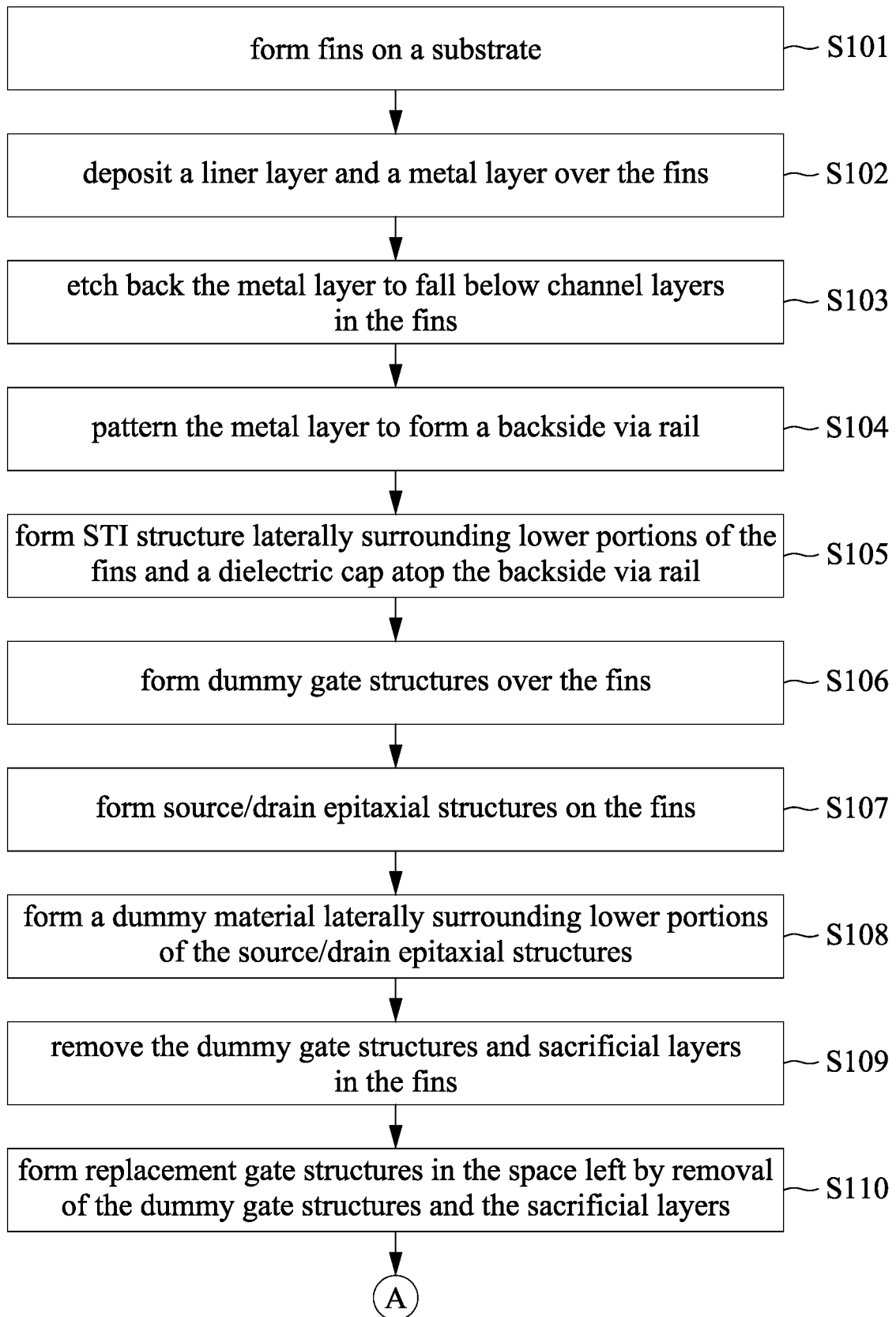
FIGS. 36A and 36B illustrate a flow chart illustrating a method of forming an integrated circuit structure in accordance with some embodiments of the present disclosure.
Figure 36B:
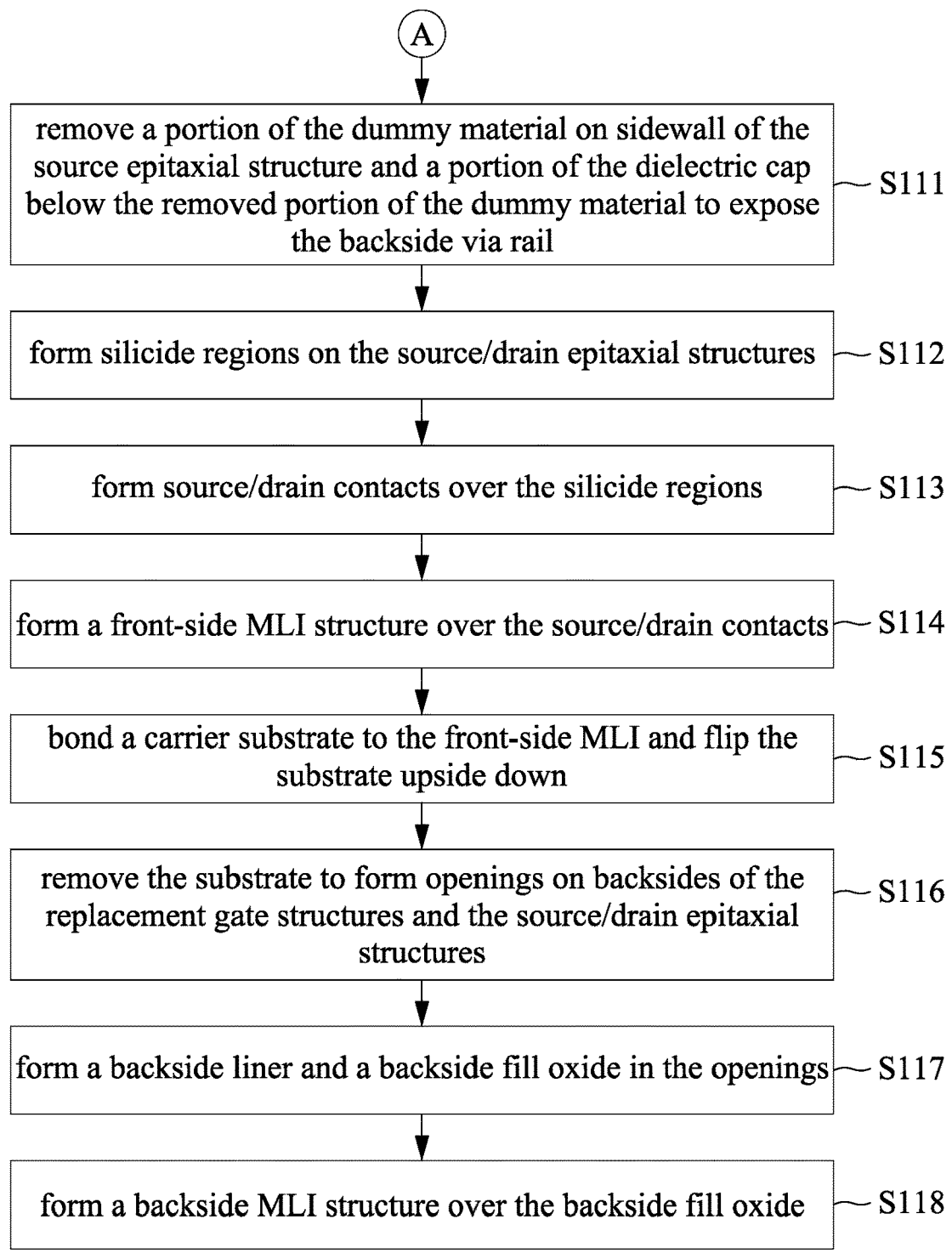

FIGS. 36A and 36B illustrate a flow chart illustrating a method of forming an integrated circuit structure in accordance with some embodiments of the present disclosure. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S101, a plurality of fins are formed on a substrate. FIGS. 1A-3B illustrate perspective views and cross-sectional views according to some embodiments of block S101.

At block S102, a liner layer and a metal layer are deposited over the fins. FIGS. 4A and 4B illustrate a perspective view and a cross-sectional view according to some embodiments of block S102.

At block S103, the metal layer is etched back to fall below channel layers in the fins. FIGS. 5A and 5B illustrate a perspective view and a cross-sectional view according to some embodiments of block S103.

At block S104, the metal layer is patterned to form a backside via rail. FIGS. 6A and 6B illustrate a perspective view and a cross-sectional view according to some embodiments of block S104.

At block S105, an STI structure is formed to laterally surround lower portions of the fins and a dielectric cap is formed atop the backside via rail. FIGS. 7A-8B illustrate perspective views and cross-sectional views according to some embodiments of block S105.

At block S106, dummy gate structures are formed over the fins. FIGS. 14A-15C illustrate perspective views and cross-sectional views according to some embodiments of block S106.

At block S107, source/drain epitaxial structures are formed on on the fins. FIGS. 16-18C illustrate cross-sectional views according to some embodiments of block S107.

At block S108, a dummy material is formed to laterally surround lower portions of the source/drain epitaxial structures. FIGS. 19A-19C illustrate cross-sectional views according to some embodiments of block S108.

At block S109, the dummy gate structures and sacrificial layers in the fins are removed. FIGS. 20A-20C illustrate cross-sectional views according to some embodiments of block S109.

At block S110, replacement gate structures are formed in the space left by removal of the dummy gate structures and the sacrificial layers. FIGS. 21A-21C illustrate cross-sectional views according to some embodiments of block S110.

At block S111, a portion of the dummy material on a sidewall of the source epitaxial structure is removed, and a portion of the dielectric cap below the removed portion of the dummy material is also removed to expose the backside via rail. FIGS. 23A-24C illustrate cross-sectional views according to some embodiments of block S111.

At block S112, silicide regions are formed on the source/drain epitaxial structures. FIGS. 26A-26C illustrate cross-sectional views according to some embodiments of block S112.

At block S113, source/drain contacts are formed over the silicide regions. FIGS. 27A-27C illustrate cross-sectional views according to some embodiments of block S113.

At block S114, a front-side MLI structure is formed over the source/drain contacts. FIGS. 28A-28C illustrate cross-sectional views according to some embodiments of block S114.

At block S115, a carrier substrate is bonded to the front-side MLI, and the substrate is flipped upside down. FIGS. 29A-30C illustrate cross-sectional views according to some embodiments of block S115.

At block S116, the substrate is removed to form openings on backsides of the replacement gate structures and the source/drain epitaxial structures. FIGS. 31A-32C illustrate cross-sectional views according to some embodiments of block S116.

At block S117, a backside liner and a backside fill oxide are formed in the openings and over the backsides of the replacement gate structures and the source/drain epitaxial structures. FIGS. 33A-33C illustrate cross-sectional views according to some embodiments of block S117.

At block S118, a backside MLI structure is formed over the backside fill oxide. FIGS. 34A-35C illustrate cross-sectional views according to some embodiments of block S118.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that backside via rails and backside metal lines (e.g., backside power rails) can be formed on backsides of transistors, which in turn allows for more routing space and hence higher routing density. Another advantage is that the backside via rail is electrically coupled to source silicide regions formed at a higher temperature (greater than about 400° C.) in FEOL processing, which in turn helps in reducing contact resistance.

In some embodiments, an IC structure includes a source epitaxial structure, a drain epitaxial structure, a first silicide region, a second silicide region, a source contact, a backside via rail, a drain contact, and a front-side interconnection structure. The first silicide region is on a front-side surface and a first sidewall of the source epitaxial structure. The second silicide region is on a front-side surface of the drain epitaxial structure. The source contact is in contact with the first silicide region and has a protrusion extending past a backside surface of the source epitaxial structure. The backside via rail is in contact with the protrusion of the source contact. The drain contact is in contact with the second silicide region. The front-side interconnection structure is on a front-side surface of the source contact and a front-side surface of the drain contact.

In some embodiments, an IC structure includes a first transistor, a second transistor, a backside via rail, a source contact, and a drain contact. The first transistor includes a first source epitaxial structure, a first gate structure and a first drain epitaxial structure arranged along a first direction. The second transistor includes a second drain epitaxial structure, a second gate structure and a second source epitaxial structure arranged along the first direction. The backside via rail extends along the first direction and arranged between the first transistor and the second transistor along a second direction substantially perpendicular to the first direction. The source contact wraps around a front-side surface and opposite sidewalls of the first source epitaxial structure from a cross-sectional view. The source contact extends past a backside surface of the first source epitaxial structure to the backside via rail from the cross-sectional view. The drain contact extends along a first sidewall of the second drain epitaxial structure toward the backside via rail and terminates prior to reaching the backside via rail from the cross-sectional view.

In some embodiments, a method includes forming a plurality of fins over a substrate, forming a backside via rail between lower portions of the plurality of fins and a liner layer lining the backside via rail; epitaxially growing a source epitaxial structure and a drain epitaxial structure on the plurality of fins; performing a silicidation process to form a first silicide region on the source epitaxial structure and a second silicide region on the drain epitaxial structure; after performing the silicidation process, forming a source contact in contact with the first silicide region and the backside via rail; forming a front-side interconnection structure over the source contact; removing the substrate and the liner layer to expose a backside surface of the backside via rail; and forming a backside metal line extending laterally on the exposed backside surface of the backside via rail.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) structure comprising:
   a source epitaxial structure and a drain epitaxial structure;
   a first silicide region on a front-side surface and a first sidewall of the source epitaxial structure;
   a second silicide region on a front-side surface of the drain epitaxial structure;
   a source contact in contact with the first silicide region and having a protrusion extending past a backside surface of the source epitaxial structure, wherein the protrusion of the source contact is spaced apart from the backside surface of the source epitaxial structure;
   a backside via rail in contact with the protrusion of the source contact;
   a drain contact in contact with the second silicide region; and
   a front-side interconnection structure on a front-side surface of the source contact and a front-side surface of the drain contact.

2. The IC structure of claim 1, wherein the first silicide region is thicker on the front-side surface of the source epitaxial structure than on the first sidewall of the source epitaxial structure.

3. The IC structure of claim 1, wherein the first silicide region is further on a second sidewall of the source epitaxial structure opposite the first sidewall of the source epitaxial structure.

4. The IC structure of claim 3, wherein the first silicide region is thicker on the front-side surface of the source epitaxial structure than on the second sidewall of the source epitaxial structure.

5. The IC structure of claim 1, wherein the second silicide region is further on a first sidewall of the drain epitaxial structure.

6. The IC structure of claim 5, wherein the second silicide region is absent from a second sidewall of the drain epitaxial structure opposite the first sidewall of the drain epitaxial structure.

7. The IC structure of claim 6, further comprising:
   a dielectric material in contact with the second sidewall of the drain epitaxial structure.

8. The IC structure of claim 1, further comprising:
   a dielectric cap separating the backside via rail from the drain contact.

9. The IC structure of claim 8, wherein the protrusion of the source contact extends through the dielectric cap to the backside via rail.

10. The IC structure of claim 8, further comprising:
a hybrid fin protruding from the dielectric cap toward the front-side interconnection structure.

11. The IC structure of claim 10, wherein the hybrid fin has opposite sidewalls respectively in contact with the source contact and the drain contact.

12. The IC structure of claim 10, wherein the hybrid fin comprises a liner layer and a fill oxide wrapped around by the liner layer.

13. An IC structure comprising:
a first transistor comprising a first source epitaxial structure, a first gate structure and a first drain epitaxial structure arranged along a first direction;
a second transistor comprising a second drain epitaxial structure, a second gate structure and a second source epitaxial structure arranged along the first direction;
a backside via rail extending along the first direction and arranged between the first transistor and the second transistor along a second direction substantially perpendicular to the first direction;
a source contact wrapping around a front-side surface and opposite sidewalls of the first source epitaxial structure from a cross-sectional view, the source contact extending past a backside surface of the first source epitaxial structure to the backside via rail from the cross-sectional view, wherein at least a part of the backside surface of the first source epitaxial structure non-overlaps the backside via rail; and
a drain contact extending along a first sidewall of the second drain epitaxial structure toward the backside via rail and terminating prior to reaching the backside via rail from the cross-sectional view.

14. The IC structure of claim 13, further comprising:
a dielectric material in contact with a second sidewall of the second drain epitaxial structure opposite the first sidewall of the second drain epitaxial structure.

15. The IC structure of claim 13, further comprising:
a silicide region on the second drain epitaxial structure, wherein the silicide region is thicker on a front-side surface of the second drain epitaxial structure than on the first sidewall of the second drain epitaxial structure from the cross-sectional view.

16. The IC structure of claim 13, further comprising:
a silicide region wrapping around the front-side surface and the opposite sidewalls of the first source epitaxial structure and being wrapped around by the source contact from the cross-sectional view.

17. The IC structure of claim 16, wherein the silicide region is thicker on the front-side surface of the first source epitaxial structure than on the opposite sidewalls of the first source epitaxial structure.

18. A method comprising:
forming a plurality of fins over a substrate;
forming a backside via rail between lower portions of the plurality of fins and a liner layer lining the backside via rail;
after forming the backside via rail, epitaxially growing a source epitaxial structure and a drain epitaxial structure on the plurality of fins;
performing a silicidation process to form a first silicide region on the source epitaxial structure and a second silicide region on the drain epitaxial structure;
after performing the silicidation process, forming a source contact in contact with the first silicide region and the backside via rail;
forming a front-side interconnection structure over the source contact;
removing the substrate and the liner layer to expose a backside surface of the backside via rail; and
forming a backside metal line extending laterally on the exposed backside surface of the backside via rail.

19. The method of claim 18, wherein the source contact is formed to wrap around at least three sides of the source epitaxial structure.

20. The method of claim 18, further comprising:
forming a hybrid fin between the plurality of fins; and
recessing partial regions of the plurality of fins, wherein the source epitaxial structure and the drain epitaxial structure are epitaxially grown on the recessed regions of the plurality of fins, and the source epitaxial structure and the drain epitaxial structure are on opposite sides of the hybrid fin and separated from the hybrid fin.

\* \* \* \* \*